(12) United States Patent
Yoneda et al.

(10) Patent No.: US 7,144,754 B2
(45) Date of Patent: Dec. 5, 2006

(54) DEVICE HAVING RESIN PACKAGE AND METHOD OF PRODUCING THE SAME

(75) Inventors: Yoshiyuki Yoneda, Kawasaki (JP); Kazuto Tsuji, Kawasaki (JP); Seiichi Orimo, Kawasaki (JP); Hideharu Sakoda, Kawasaki (JP); Ryuji Nomoto, Kawasaki (JP); Masanori Onodera, Kawasaki (JP); Junichi Kasai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 118 days.

(21) Appl. No.: 10/856,777

(22) Filed: Jun. 1, 2004

(65) Prior Publication Data
US 2004/0219719 A1    Nov. 4, 2004

Related U.S. Application Data

(62) Division of application No. 09/442,038, filed on Nov. 17, 1999, now Pat. No. 6,856,017, which is a division of application No. 08/744,048, filed on Nov. 6, 1996, now Pat. No. 6,072,239.

(30) Foreign Application Priority Data

| Nov. 8, 1995  | (JP) | ............................ 7-290135 |
| Dec. 12, 1995 | (JP) | ............................ 7-322803 |
| Jul. 12, 1996 | (JP) | ............................ 8-183838 |
| Sep. 20, 1996 | (JP) | ............................ 8-250707 |
| Oct. 8, 1996  | (JP) | ............................ 8-267607 |

(51) Int. Cl.
*H01L 21/50* (2006.01)

(52) U.S. Cl. ....................... 438/106; 438/123; 438/124

(58) Field of Classification Search ................ 438/106, 438/123, 124, 121, 127
See application file for complete search history.

(56) References Cited

U.S. PATENT DOCUMENTS

| 4,635,356 | A | * | 1/1987  | Ohuchi et al. ................. 29/841 |
| 4,724,280 | A |   | 2/1988  | Tsuji et al. ................... 174/52 |
| 5,200,362 | A |   | 4/1993  | Lin et al. ..................... 437/207 |
| 5,214,308 | A |   | 5/1993  | Nishiguchi et al. ......... 257/692 |
| 5,273,938 | A | * | 12/1993 | Lin et al. ..................... 438/107 |
| 5,410,451 | A |   | 4/1995  | Hawthorne et al. ......... 361/760 |
| 5,440,169 | A |   | 8/1995  | Tomita et al. .............. 257/667 |
| 5,502,631 | A |   | 3/1996  | Adachi ....................... 361/760 |

(Continued)

FOREIGN PATENT DOCUMENTS

EP        0 638 933        2/1995

(Continued)

OTHER PUBLICATIONS

Chinese Office Action dated Nov. 11, 2005 received on corresponding Chinese application with English translation; 8 pages.

(Continued)

*Primary Examiner*—Michael Trinh
(74) *Attorney, Agent, or Firm*—Armstrong, Kratz, Quintos, Hanson & Brooks, LLP

(57) ABSTRACT

A device including a chip, and a resin package sealing the chip, the resin package having resin projections located on a mount-side surface of the resin package. Metallic films are respectively provided to the resin projections. Connecting parts electrically connect electrode pads of the chip and the metallic film.

7 Claims, 97 Drawing Sheets

U.S. PATENT DOCUMENTS

| | | | |
|---|---|---|---|
| 5,521,427 A | 5/1996 | Chia et al. | 257/666 |
| 5,523,628 A | 6/1996 | Williams et al. | 257/777 |
| 5,567,984 A | 10/1996 | Zalesinski et al. | 257/697 |
| 5,581,122 A | 12/1996 | Chao et al. | 257/691 |
| 5,625,230 A | 4/1997 | Park et al. | 257/736 |
| 5,629,566 A | 5/1997 | Doi et al. | 257/789 |
| 5,631,499 A | 5/1997 | Hosomi et al. | 257/737 |
| 5,633,535 A | 5/1997 | Chao et al. | 257/778 |
| 5,666,008 A | 9/1997 | Tomita et al. | 257/778 |
| 5,670,826 A | 9/1997 | Bessho et al. | 257/737 |
| 6,001,671 A * | 12/1999 | Fjelstad | 438/112 |

FOREIGN PATENT DOCUMENTS

| | | |
|---|---|---|
| EP | 0 751 561 | 1/1997 |
| FR | 2 691 836 | 12/1993 |
| JP | 59-47749 | 3/1984 |
| JP | 59-208756 | 11/1984 |
| JP | 60-86851 | 5/1985 |
| JP | 61-135131 | 6/1986 |
| JP | 61-237454 | 10/1986 |
| JP | 1-125941 | 5/1989 |
| JP | 1-137654 | 5/1989 |
| JP | 1-161724 | 6/1989 |
| JP | 1-179334 | 7/1989 |
| JP | 2-112264 | 4/1990 |
| JP | 3-94438 | 4/1991 |
| JP | 3-94459 | 4/1991 |
| JP | 3-178152 | 8/1991 |
| JP | 3-240260 | 10/1991 |
| JP | 5-129473 | 5/1993 |
| JP | 5-218509 | 8/1993 |
| JP | 5-251455 | 9/1993 |
| JP | 6-151520 | 5/1994 |
| JP | 6-310563 | 11/1994 |
| JP | 7-058161 | 3/1995 |
| JP | 7-161746 | 6/1995 |
| JP | 07-226475 | 8/1995 |
| JP | 7-235618 | 9/1995 |
| JP | 7-307409 | 11/1995 |
| WO | 95/26047 | 9/1995 |
| WO | 96/09646 | 3/1996 |

OTHER PUBLICATIONS

Communication from the European Patent Office dated Apr. 26, 2006; 5 pages.

* cited by examiner

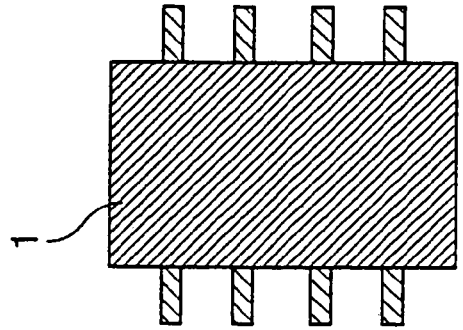
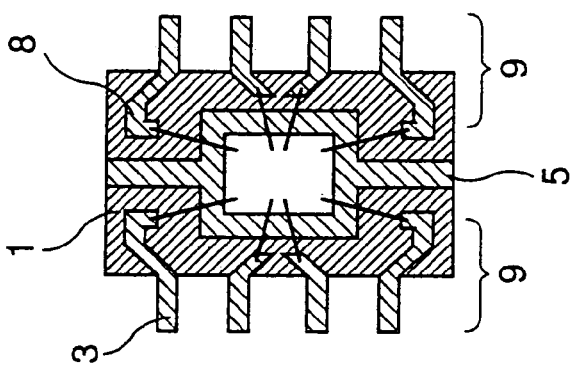
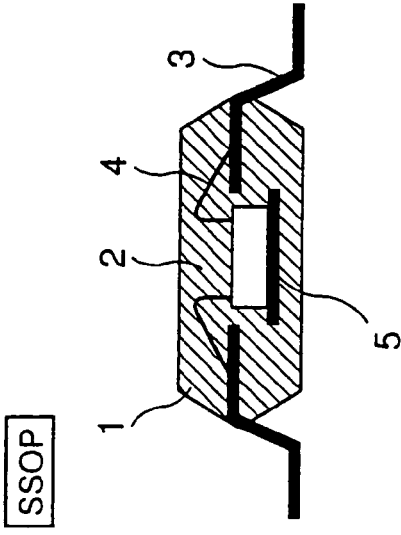

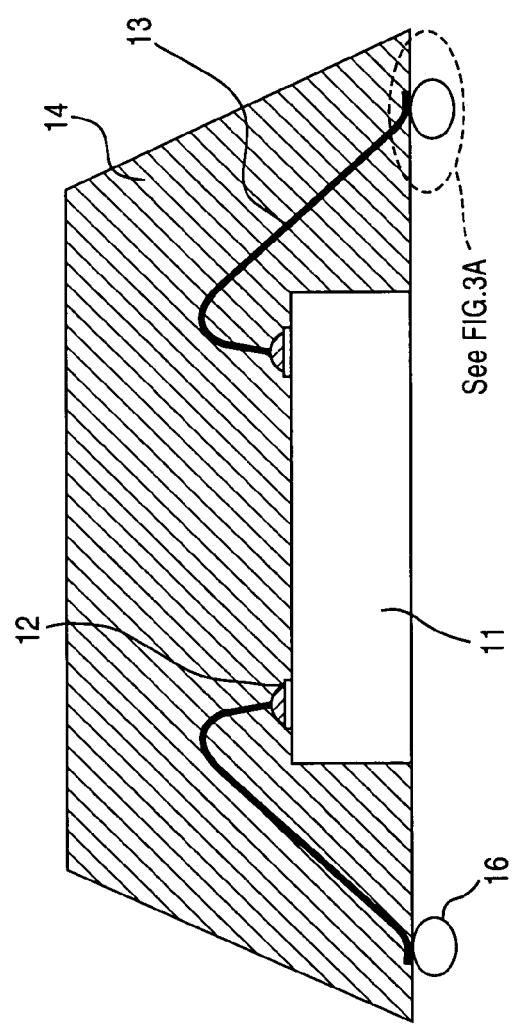
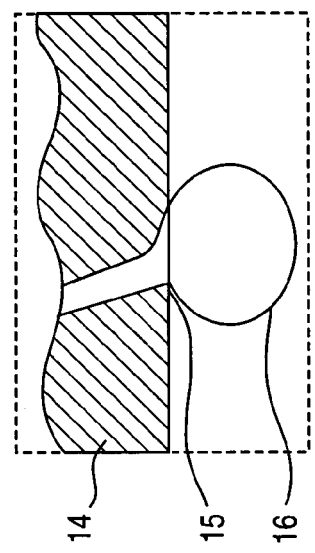

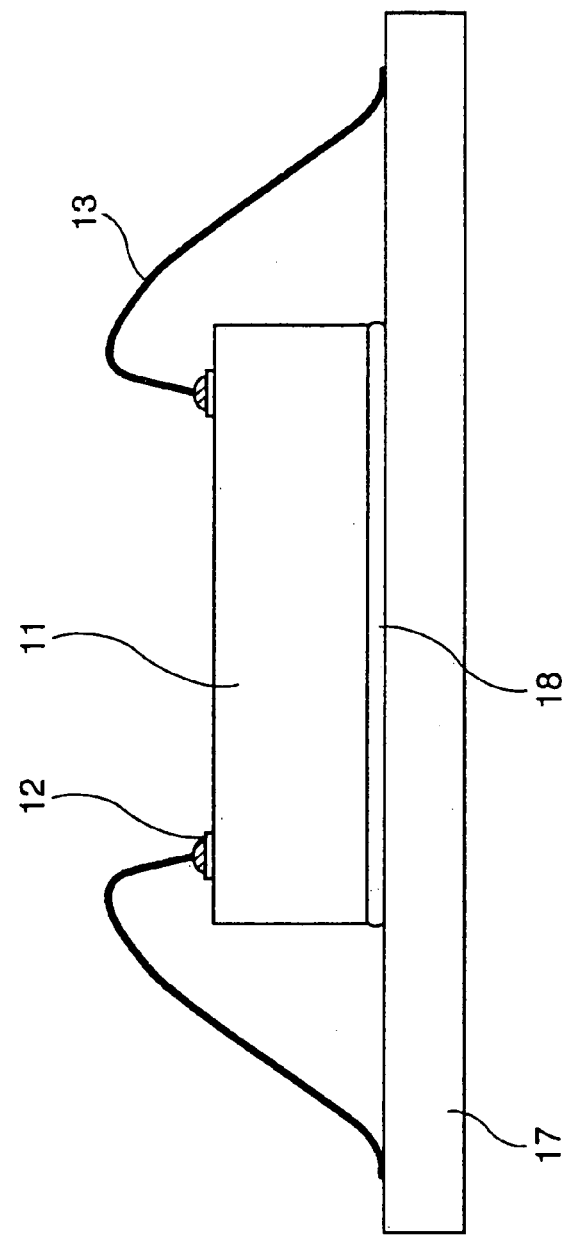

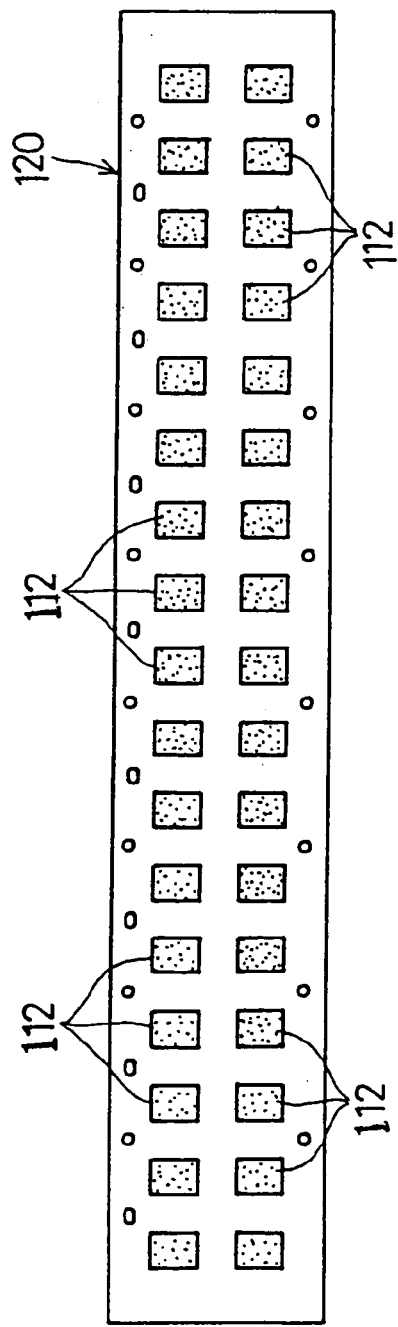
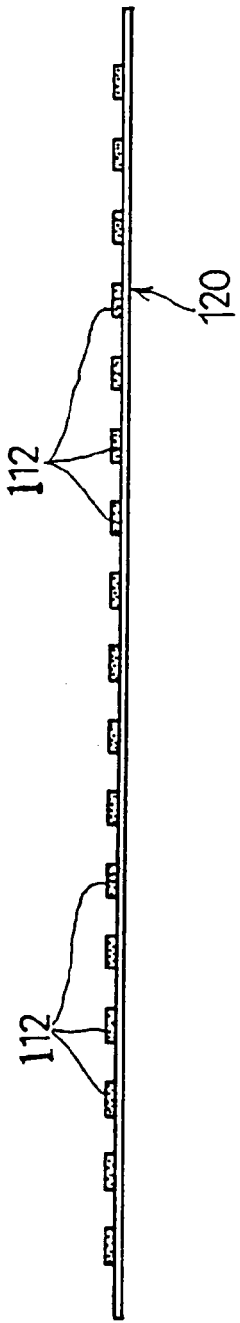
FIG. 51A
FIG. 51B

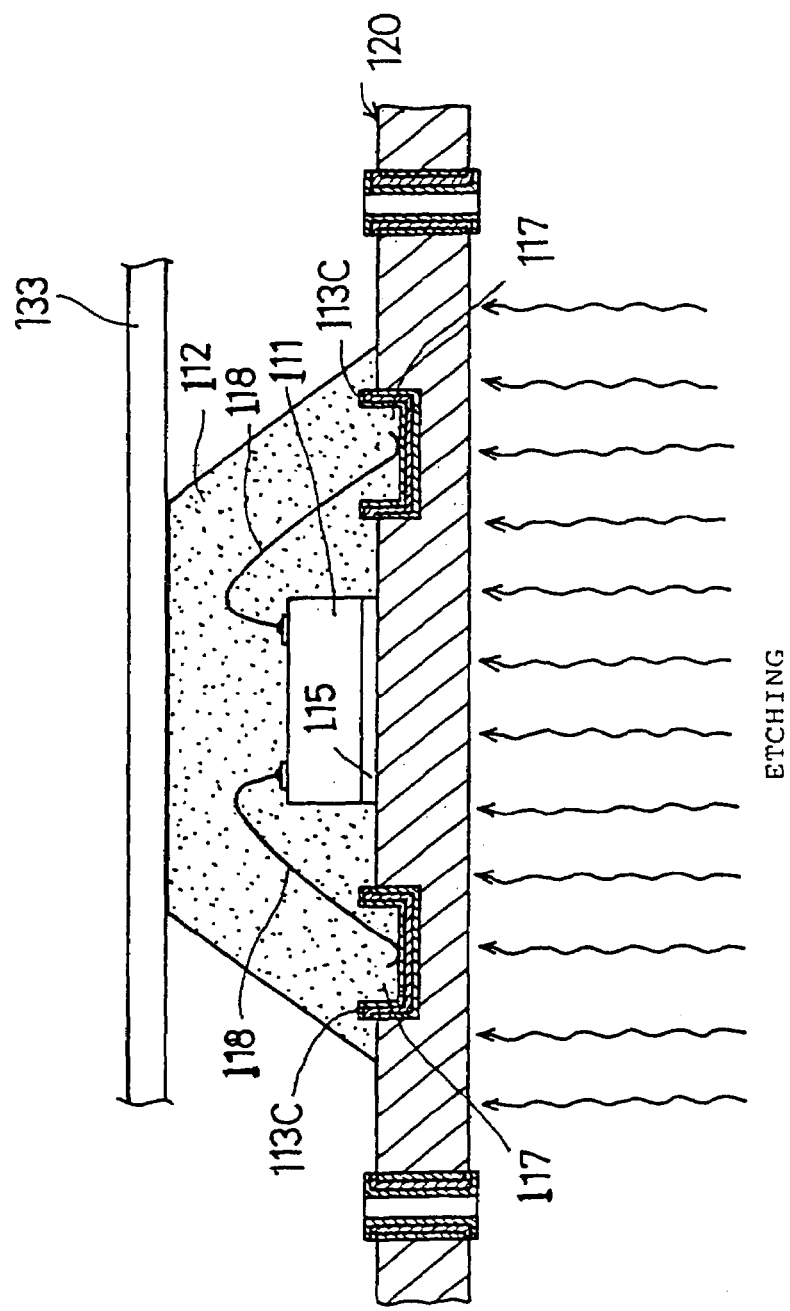

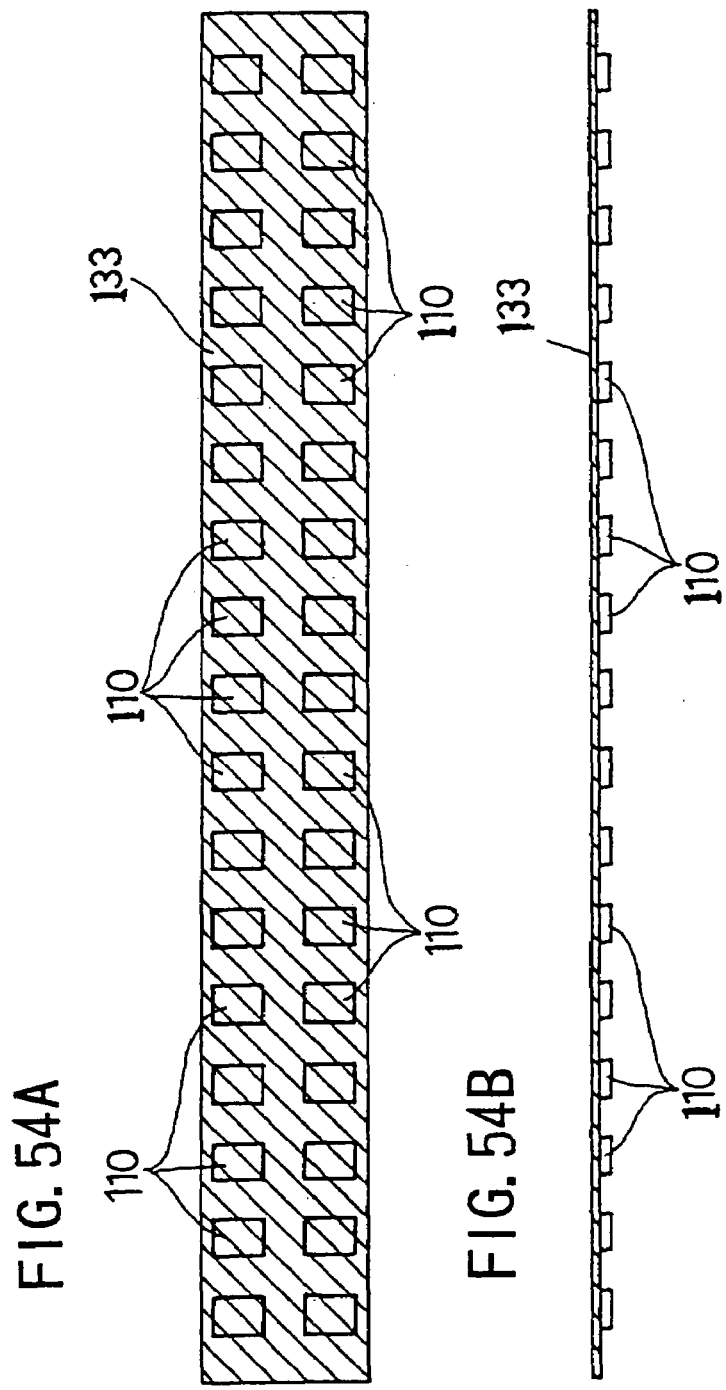

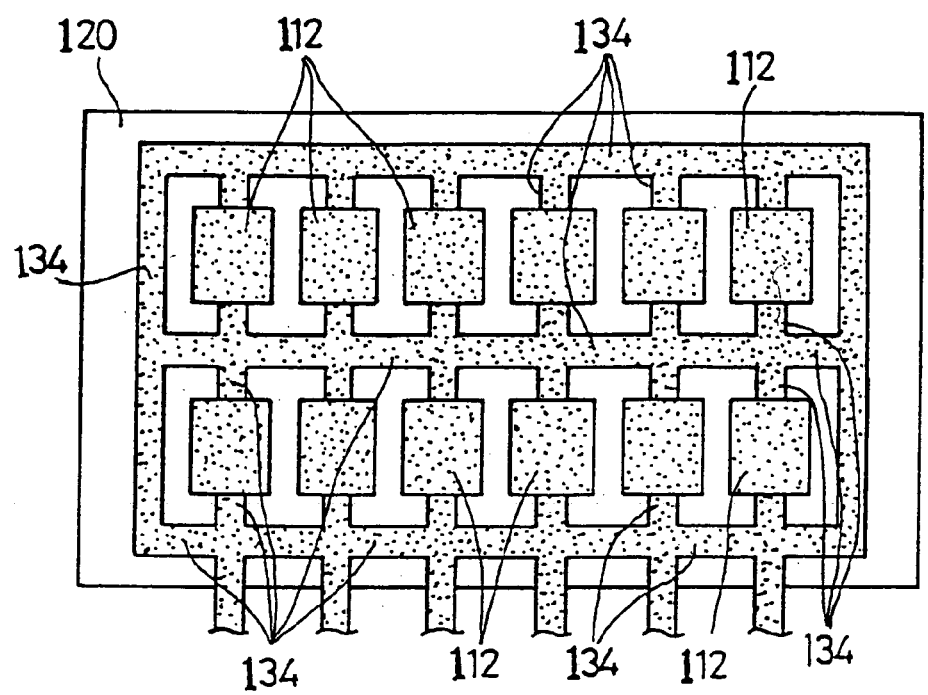

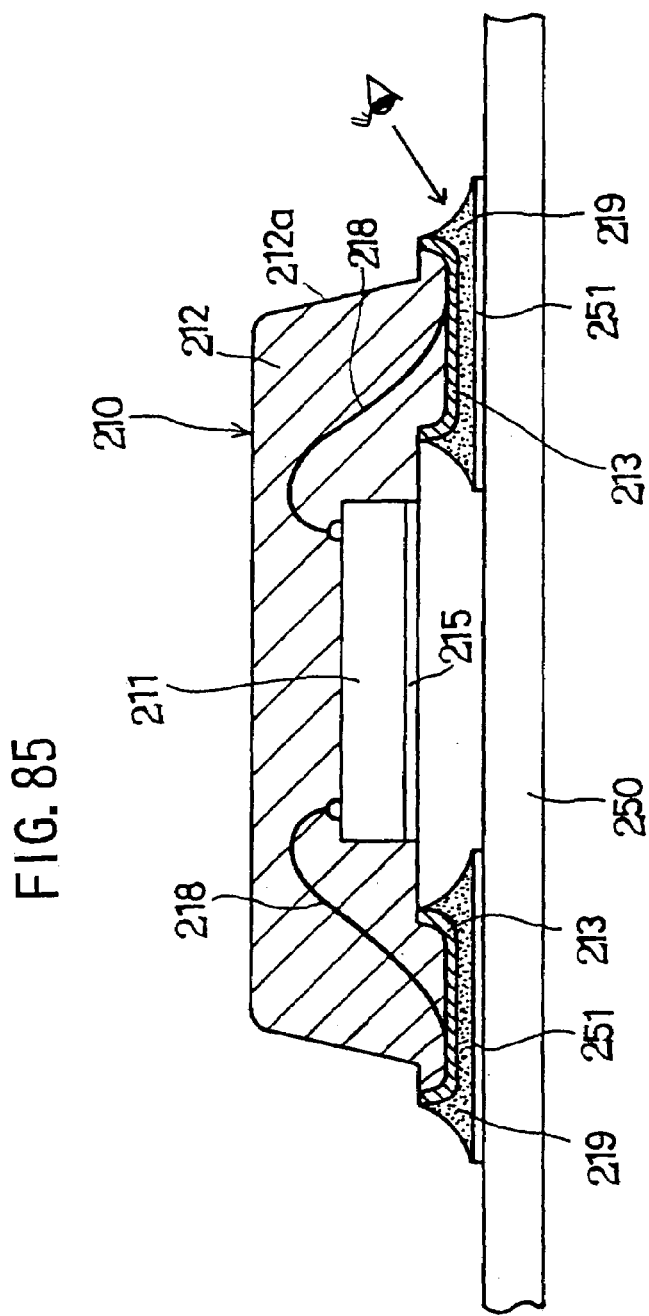

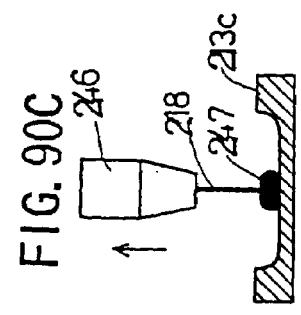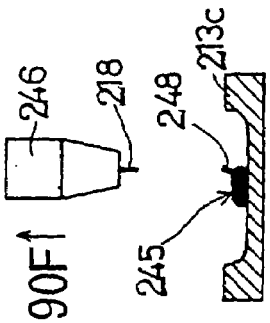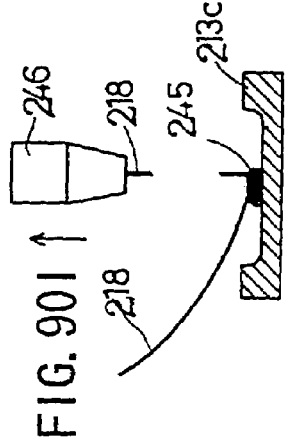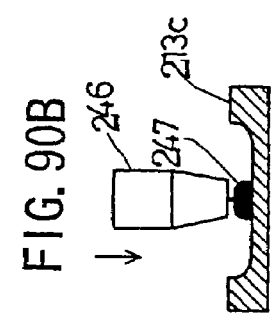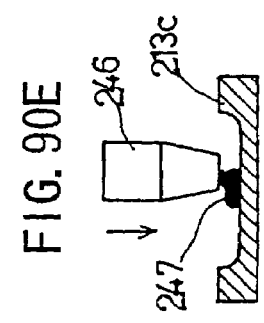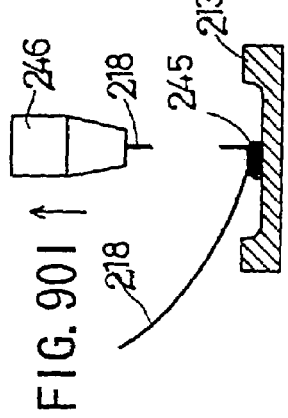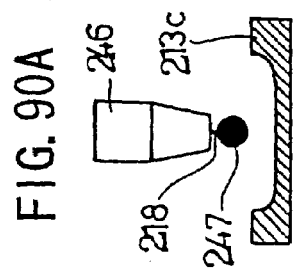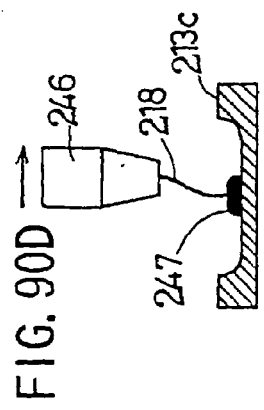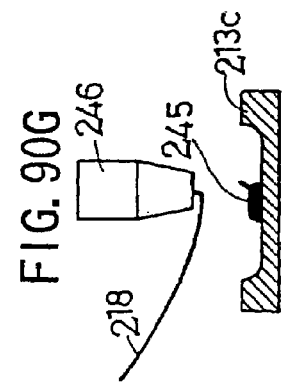

(ETCHING)

DEVICE HAVING RESIN PACKAGE AND METHOD OF PRODUCING THE SAME

This application is a divisional application of prior application Ser. No. 09/442,038 filed Nov. 17, 1999, which issued as U.S. Pat. No. 6,856,017 on Feb. 15, 2005; which is a divisional application of prior application Ser. No. 08/744,048 filed Nov. 6, 1996, which issued as U.S. Pat. No. 6,072,239 on Jun. 6, 2000.

BACKGROUND OF THE INVENTION

1. Field of the Invention

The present invention generally relates to devices having a resin package such as semiconductor devices, and more particularly to a resin-sealed semiconductor device of a leadless surface mounting type directed to high-density mounting. Further, the present invention is concerned with a method of producing such a semiconductor device.

Recently, down-sizing of electronic devices' has required a decrease in the pitch of leads extending from a resin-sealed type package. Hence, it is desired that there are provided a new structure of the resin-sealed type package making it possible to further decrease the lead pitch and a method of producing such a structure.

2. Description of the Related Art

FIGS. 1A, 1B and 1C are diagrams of a semiconductor device having a conventional resin-sealed package. The device includes a resin 1, a chip 2, outer leads 3, bonding wires 4 made of an alloy of gold and aluminum (Au—Al), and a die pad 5. The package shown in FIGS. 1A, 1B and 1C is called an SSOP (Shrink Small Outline Package). The outer leads 3 are bent in a gull-wing shape, and are mounted on a circuit board.

FIG. 2 is a cross-sectional view of a semiconductor device of another type. The device shown in FIG. 2 includes solder balls 6 and a mount base 7 on which the chip 2 sealed by the resin 1 and solder balls 6 are provided. The package shown in FIG. 2 is called a BGA (Ball Grid Array) type, and the solder balls 6 serve as terminals provided on the mount base 7.

The SSOP type package shown in FIGS. 1A., 1B and 1C has a disadvantage in which a large area 9 is needed to arrange inner leads 8 integrally formed with the outer leads 3, and a large area is needed to arrange the outer leads 3. Hence, the SSOP type package needs a large mounting area.

The BGA type package shown in FIG. 2 is expensive because it needs the mount base 7.

SUMMARY OF THE INVENTION

It is a general object of the present invention to provide a resin-packaged device and a production method of producing the same in which the above disadvantages are eliminated.

A more specific object of the present invention is to provide a less-expensive resin-packaged device which requires a smaller mounting area and provide a method of producing the same.

The above objects of the present invention are achieved by a device comprising: a chip (111); a resin package (112, 151, 314) sealing the chip, the resin package having resin projections (117, 154, 318) located on a mount-side surface of the resin package; metallic films (113, 155, 315) respectively provided to the resin projections; and connecting parts (118, 101, 163, 245, 313, 341, 342) electrically connecting electrode pads of the chip and the metallic films.

The device may be configured so that each of the metallic films is a single layer (113A) made of a metallic substance.

The device may be configured so that each of the metallic films comprises a plurality of metallic layers (113B–113D, 213E–213G) which are stacked.

The device may be configured so that the connecting parts respectively comprise bonding wires (118), which are bonded to the electrode pads and the metallic films.

The device may be configured so that: the connecting parts respectively comprise bonding wires (118), and bonding balls (101, 245) respectively provided to the metallic films; and the bonding wires are bonded to the electrode pads and the bonding balls.

The device may be configured so that the resin package is a molded package so that the resin projections are integrally formed.

The device may be configured so that the resin package includes a first resin portion (153) on which the chip is provided, and a second resin portion (152) which covers the chip.

The device may be configured so that: the connecting parts respectively comprise bonding-wires (118), and connection electrodes (156) which are provided on the first resin portions and extend, into the resin projections, to the metallic films; and the bonding wires are bonded to the electrode pads and the connection electrodes.

The device may be configured so that the resin projections (154) respectively have through holes (157) through which the connection electrodes extend to the metallic films.

The device may be configured so that: the metallic films (315) respectively have lead portions (3151), which are sealed by the resin package and extend toward the chip; and the connecting parts include bonding wires which are bonded to the lead portions.

The device may be configured further comprising a heat radiating member (340) sealed by the resin package, the chip being provided on the heat radiating member.

The device may be configured so that: the connecting members respectively comprise bumps (342) provided between the electrode pads (312) of the chip (311) and the metallic films (315).

The device may be configured so that: the metallic films (315) respectively have lead portions (3151), which are sealed by the resin package and extend toward the chip; and the connecting parts include bumps (342) provided between the electrode pads (312) of the chip (311) and the lead portions (3151) of the metallic films.

The device may be configured so that: the metallic films (315) respectively have lead portions (3151), which are sealed by the resin package and extend toward the chip, the lead portions (3151) having recess portions (343); and the connecting parts include bumps (342), which are positioned in the recess portions (343) and are provided between the electrode pads (312) of the chip (311) and the lead portions (3151) of the metallic films.

The device may be configured so that a back surface of the chip (311) opposite to a surface on which the electrode pads are provided is exposed from a surface of the resin package opposite to the mount-side surface thereof.

The device may be configured so that it further comprises a heat radiating member (345) attached to the back surface of the chip.

The device may be configured so that it further comprises an insulating member provided to a surface of the chip on which the electrode pads are provided.

The device may be configured so that the connecting parts comprise an electrically conductive resin containing conductive particles (348) joined together under a given pressure.

The above objects of the present invention are also achieved by a device comprising: a chip (111); a resin package (151) sealing the chip and having a first resin portion (153) and a second resin portion (152), the chip being provided on the first resin portion (153) and covered by the second resin portion; connecting parts (118, 172) having bonding wires (118) and connection electrodes (172), the connection electrodes being provided on the first resin portion (153) and projecting therefrom; and metallic films (155) respectively provided to the connection electrodes of the connecting parts.

The above objects of the present invention are also achieved by a device comprising: a chip (111); a resin package (181) sealing the chip and having a first resin portion (183) and a second resin portion (182), the chip being provided on the first resin portion (183) and covered by the second resin portion, the first resin portions having through holes (184); electrode parts (185) provided to the first resin portion (182) so as to respectively cover the through holes; and connecting parts (118) connecting electrode pads of the chip and the electrode parts (185).

The device may be configured so that the first resin portion comprises a resin tape (183).

The device may be configured so that the connecting parts respectively comprise bonding wires, which are bonded to the electrode pads and the electrode parts (185).

The above objects of the present invention are also achieved by a device comprising: a chip (211); a resin package (212) sealing the chip, the resin package having resin projections (217, 217B) located on a mount-side surface of the resin package, the resin projections extending downwards from the mount-side surface and laterally extending from at least one side surface of the resin package; metallic films (213) respectively provided to the resin projections; and connecting parts (218) electrically connecting electrode pads of the chip and the metallic films.

The device may be configured so that each of the metallic films is a single layer (113A) made of a metallic substance.

The device may be configured so that each of the metallic films comprises a plurality of metallic layers (113B–113D, 213E–213G) which are stacked.

The device may be configured so that the connecting parts respectively comprise bonding wires (218), which are bonded to the electrode pads and the metallic films.

The device may be configured so that: the connecting parts respectively comprise bonding wires (218), and bonding balls (101, 245) respectively provided to the metallic films; and the bonding wires are bonded to the electrode pads and the bonding balls.

The device may be configured so that the resin package is a molded package so that the resin projections are integrally formed.

The device may be configured so that the resin projections (217) laterally extend from a plurality of side surfaces of the resin package.

The device may be configured so that the resin projections (217B) laterally extend from only one side surface of the resin package.

The device may be configured so that it further comprises supporting members (253) provided to the resin package (212), the supporting members (253) supporting the device vertically mounted on a circuit board.

The above objects of the present invention are also achieved by a device comprising: a chip (211); a resin package (212) sealing the chip, the resin package having resin projections (291A, 291B) located on a mount-side surface of the resin package, the resin projections extending downwards from the mount-side surface and being substantially flush with a side surface of the resin package; metallic films (290A, 290B) respectively provided to the resin projections; and connecting parts (218) electrically connecting electrode pads of the chip and the metallic films.

The device may be configured so that: the resin projections comprise first projections (291A) and second projections (291B) being laterally longer than the first projections so that the second projections extend below the chip; and the metallic films comprise first metallic films (290A) provided on the first projections, and second metallic films (290B) provided on the second projections.

The device may be configured so that it further comprises a spacer (293) to be provided to the mount-side surface of the resin package, so that the spacer is in contact with another device when the device is supported on a circuit board so that the side surface of the resin package faces the circuit board.

The device may be configured so that the spacer is a heat radiating member.

The above objects of the present invention are also achieved by a method of producing devices respectively having chips sealed by resin packages, the method comprising: (a) forming a lead frame (120) having a base (121) having recess portions (122) respectively having metallic films (113); (b) mounting chips (111) on the lead frame; (c) providing connecting parts (118, 101, 163, 245) which electrically connect electrode pads of the chips and the metallic films; (d) molding resin so that molded resin packages respectively cover the chips and metallic films supported by the lead frame; and (e) separating the molded resin packages from the lead frame together with the metallic films provided to resin projections which are counterparts of the recess portions.

The method may be configured so that the step (e) comprises a step of etching the lead frame and thereby dissolving the lead frame.

The method may be configured so that the step (e) comprises a step of mechanically separating the lead frame from the molded resin packages.

The method may be configured so that it further comprises a step of providing a tape member to the molded resin packages before the step (e) is executed.

The method may be configured so that the step (c) comprises a first step of providing bonding balls to the metallic films, and a second step of bonding bonding wires to electrode pads of the chip and the bonding balls, the bonding balls and the bonding wires corresponding to the connecting parts.

The method may be configured so that the step (d) molds the resin so that the molded resin packages are joined together.

The method may be configured so that the step (d) molds the resin so that the molded resin packages are separated from each other.

The above objects of the present invention are achieved by a device comprising: a chip (311); a resin package (314) sealing the chip, the resin package having a mount-side surface of the resin package; metallic films (315) respectively provided in the resin package so that the metallic films are flush with the mount-side surface and are exposed therefrom; and connecting parts (313, 101, 342) electrically connecting electrode pads of the chip and the metallic films.

The device may be configured so that: the connecting parts respectively comprise bonding wires (313), and bonding balls (101) respectively provided to the metallic films; and the bonding wires are bonded to the electrode pads and the bonding balls.

The device may be configured so that each of the metallic films is a single layer (315A) made of a metallic substance.

The device may be configured so that each of the metallic films comprises a plurality of metallic layers (315B–315D) which are stacked.

The device may be configured so that the connecting parts respectively comprise bumps (342) provided between the electrode pads (312) of the chip (311) and the metallic films (315).

The above objects of the present invention are achieved by a method of producing devices respectively having chips sealed by resin packages, the method comprising: (a) forming a lead frame (320) having a base (321) on which metallic films (315) are formed; (b) mounting chips (311) on the lead frame; (c) providing connecting parts (313, 101) which electrically connect electrode pads of the chips and the metallic films; (d) molding resin so that molded resin packages respectively cover the chips and metallic films supported by the lead frame; and (e) separating the molded resin packages from the lead frame together with the metallic films so that the chips are exposed from mount-side surfaces of the molded resin packages.

The method may be configured so that the step (e) comprises a step of etching the lead frame and thereby dissolving the lead frame.

The method may be configured so that the step (e) comprises a step of mechanically separating the lead frame from the molded resin packages.

BRIEF DESCRIPTION OF THE DRAWINGS

Other objects, features and advantages of the present invention will become more apparent from the following detailed description when read in conjunction with the accompanying drawings, in which:

FIG. 1A is a cross-sectional view of a semiconductor device of a conventional SSOP type;

FIG. 1B is a bottom view of the semiconductor device shown in FIG. 1A;

FIG. 1C is a top view of the semiconductor device shown in FIG. 1A;

FIG. 3 is a cross-sectional view of a semiconductor device according to a first embodiment of the present invention;

FIG. 4 is a side view of a step of a method of producing the semiconductor device shown in FIG. 3;

FIG. 51A is a plan view of the lead frame observed when the sealing step is completed;

FIG. 51B is a side view of the lead frame observed when the sealing step is completed;

FIG. 53 is a cross-sectional view of a separating step of the method of the semiconductor device according to the tenth embodiment of the present invention;

FIG. 54A is a plan view of semiconductor devices observed when the sealing step is completed;

FIG. 54B is a side view of the semiconductor devices observed when the sealing step is completed;

FIG. 55B is a plan view showing a second variation of the sealing step of the method of producing the semiconductor device according to the tenth embodiment of the present invention;

FIG. 85 is a cross-sectional view of the semiconductor device according to the fourteenth embodiment of the present invention in which the device is mounted to a circuit board;

FIGS. 90A, 90B, 90C, 90D, 90E, 90F, 90G, 90H and 90I are respectively side views showing a method of forming stud bumps;

FIG. 108 is a bottom view of the semiconductor device shown in FIG. 107;

FIG. 109 is a plan view of the semiconductor device shown in FIG. 107 in which inner parts thereof are seen through the package thereof;

FIG. 110 is a cross-sectional view of a semiconductor device according to an eighteenth embodiment of the present invention;

FIG. 111 is a bottom view of the semiconductor device shown in FIG. 110;

FIG. 112 is a cross-sectional view of semiconductor devices arranged on a circuit board according to the eighteenth embodiment of the present invention;

FIG. 113 is a cross-sectional view of an arrangement different from that shown in FIG. 112;

FIG. 114 is a cross-sectional view of an arrangement different from the arrangements shown in FIGS. 112 and 113, in which semiconductor devices are inclined on the circuit board;

FIG. 115 is a cross-sectional view of the semiconductor device mounted on the circuit board according to the eighteenth embodiment of the present invention;

FIG. 116 is a cross-sectional view of a semiconductor device according to a nineteenth embodiment of the present invention;

FIG. 117 is a top view of the semiconductor device shown in FIG. 116, in which inner parts are seen through a resin package thereof;

FIG. 118 is a cross-sectional view of a metallic film having a single-layer structure;

FIG. 119 is a cross-sectional view of a metallic film having a two-layer structure;

Figure 120:
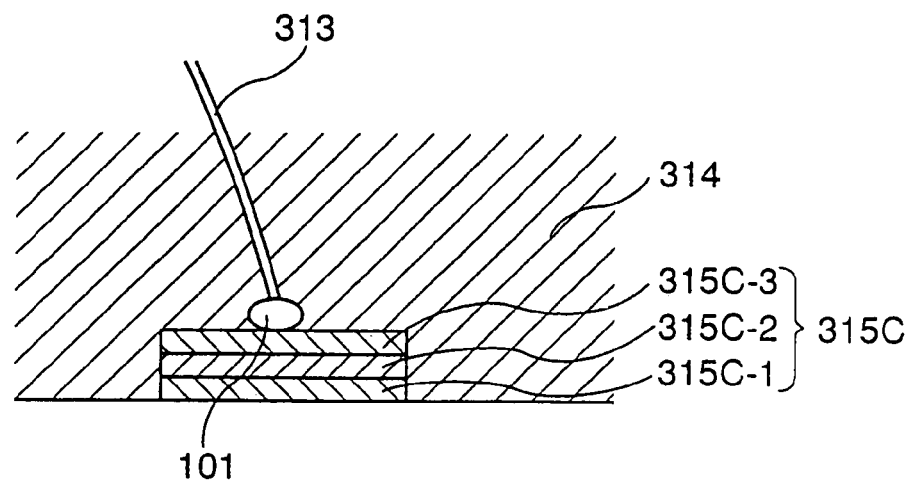
Figure 121:
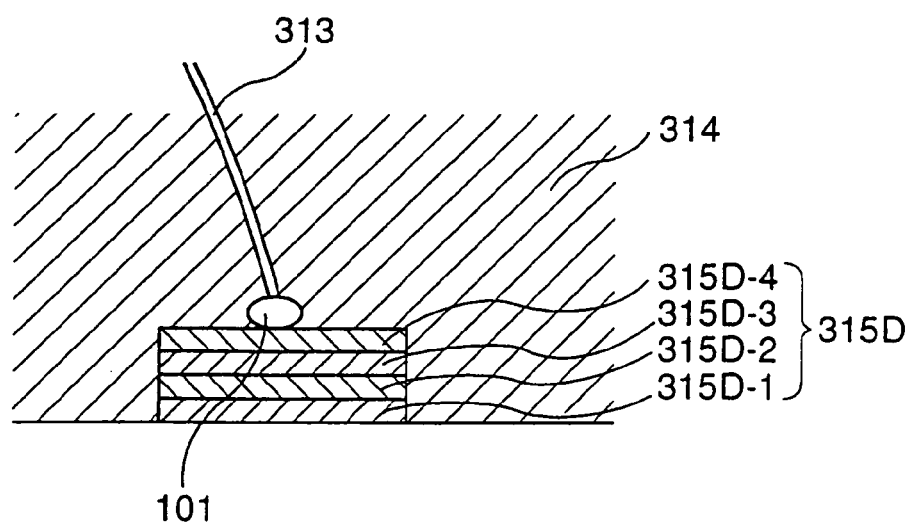
Figure 122:
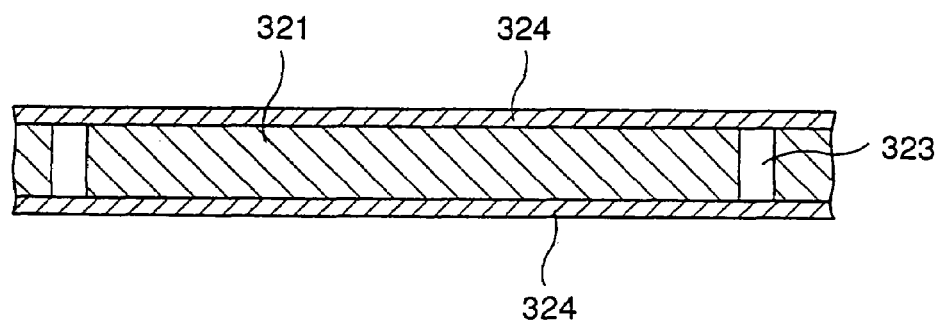
Figure 123:
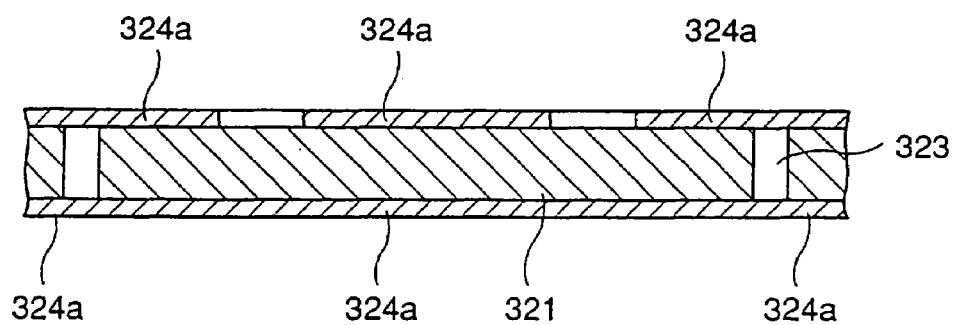
Figure 124:
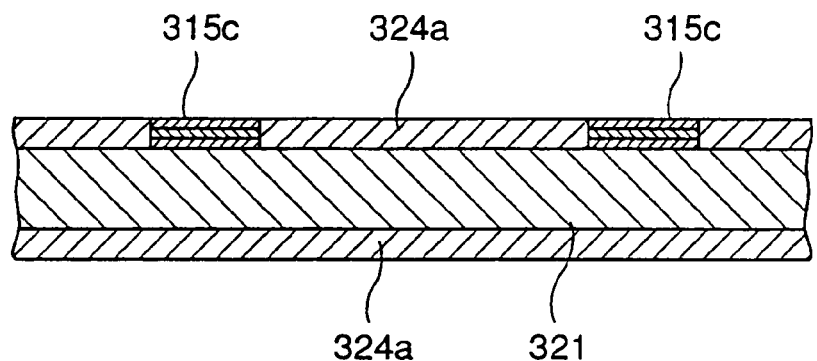
Figure 125:
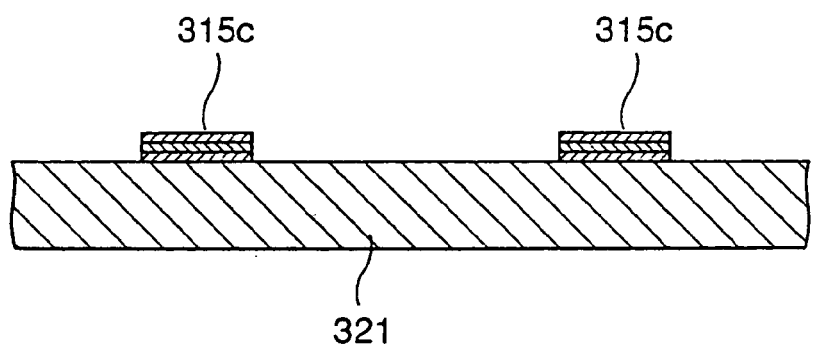
Figure 126:
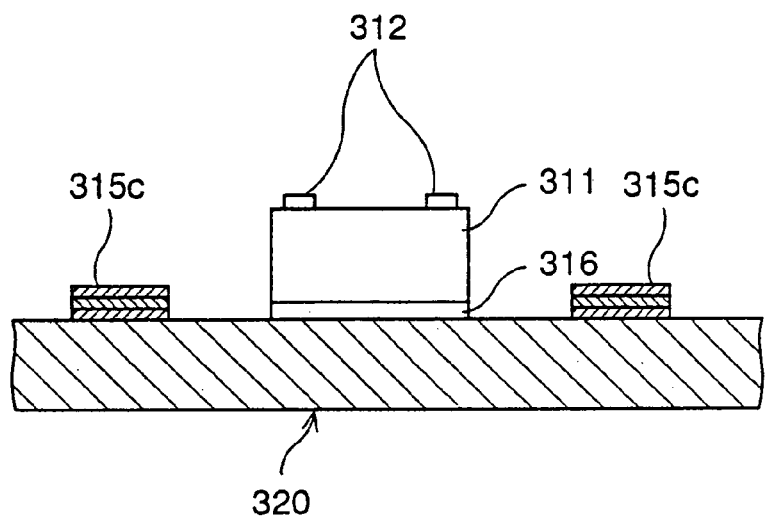
Figure 127:
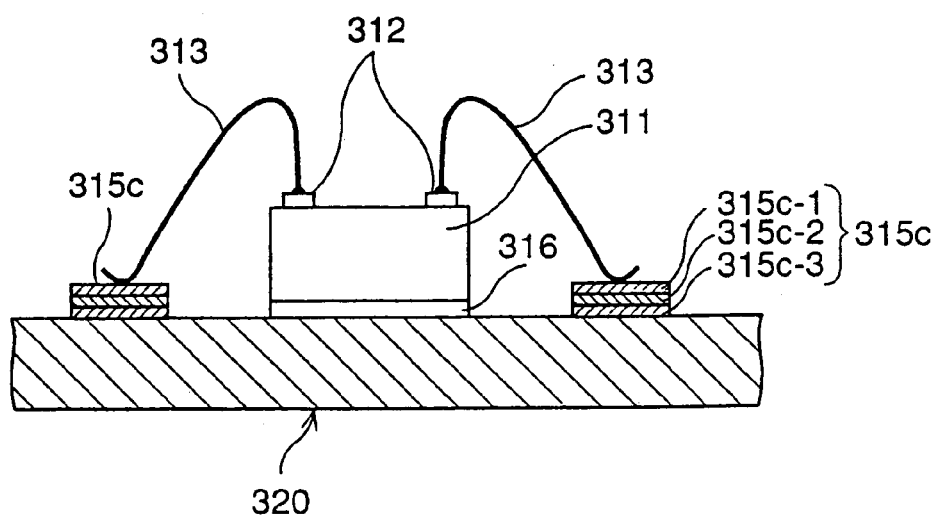
Figure 128:
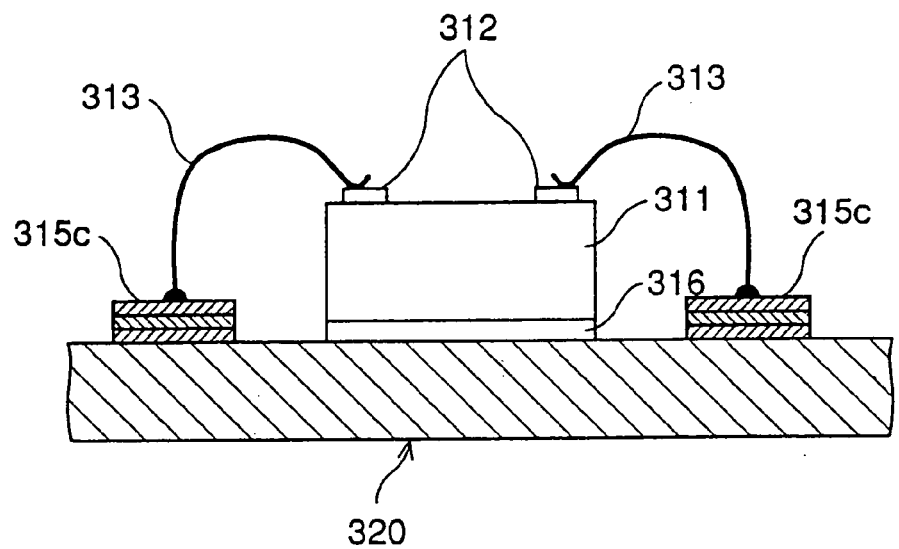
Figure 129:
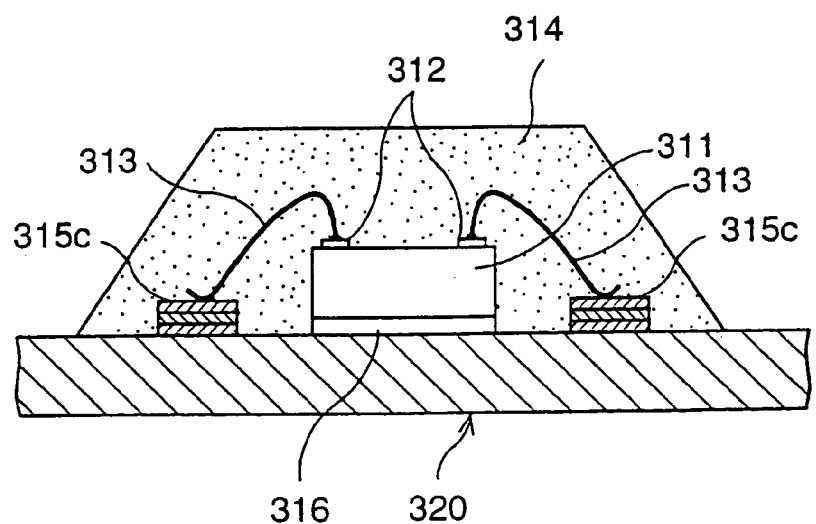
Figure 130:
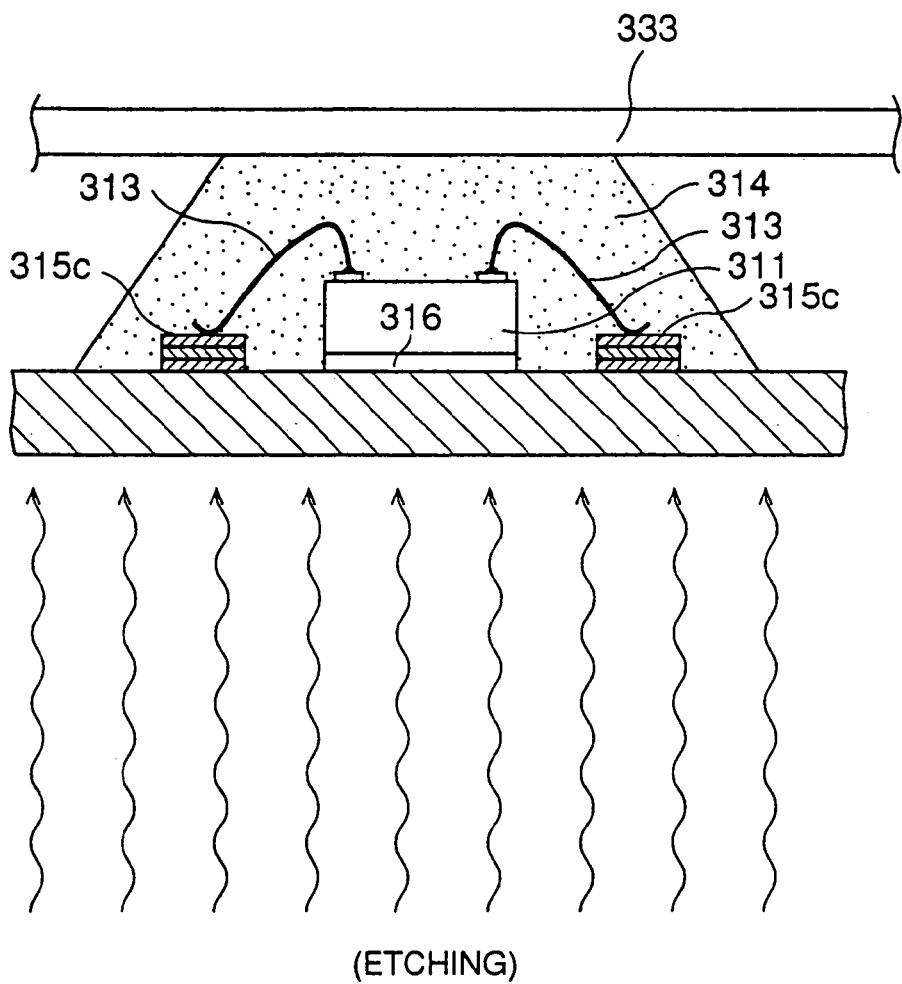
Figure 131:
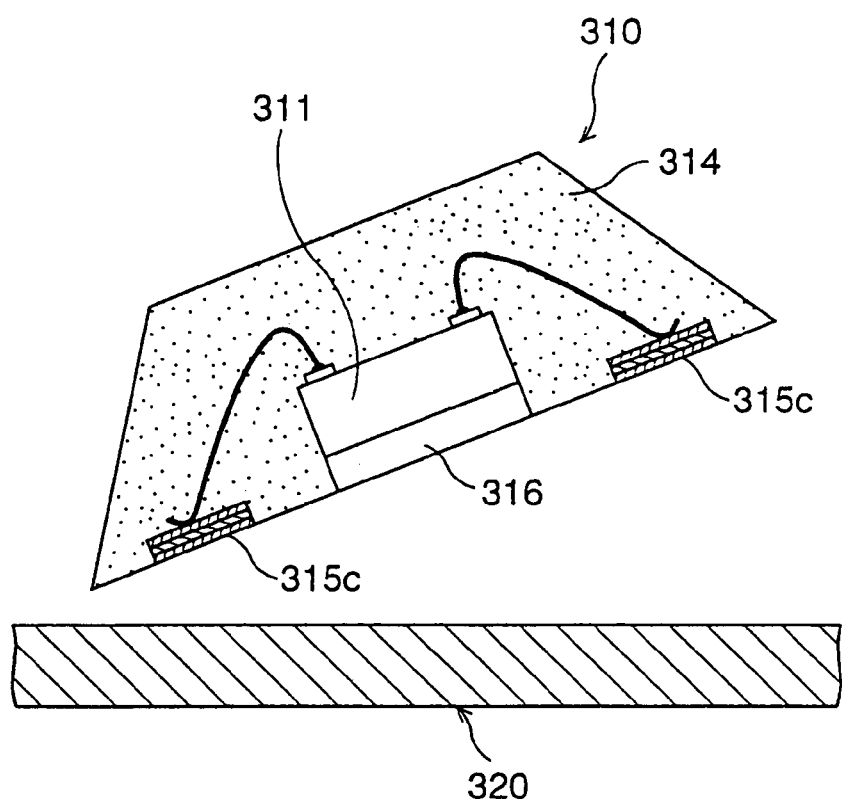
Figure 132A:
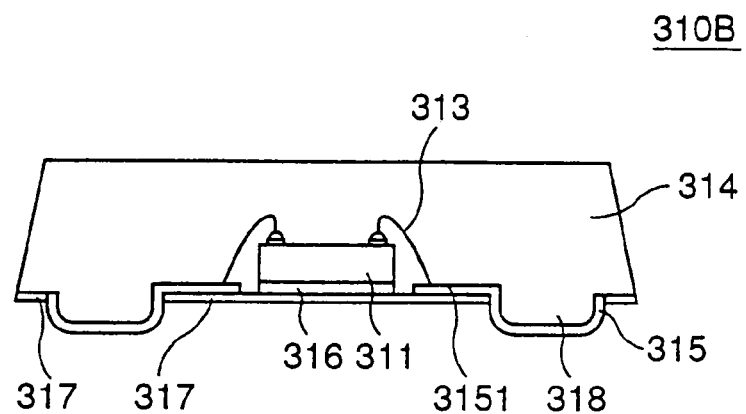
Figure 132B:
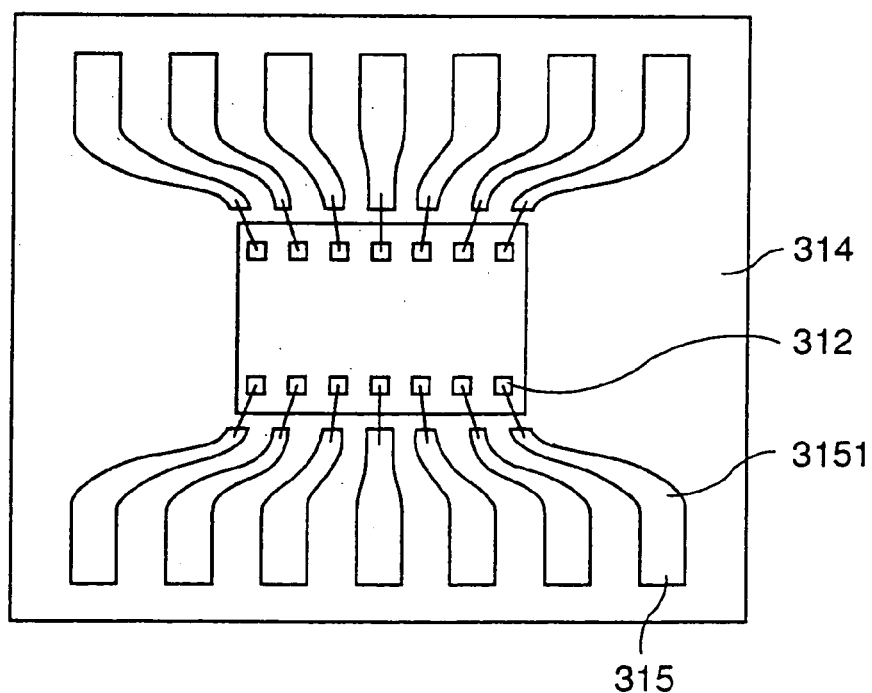
Figure 133:
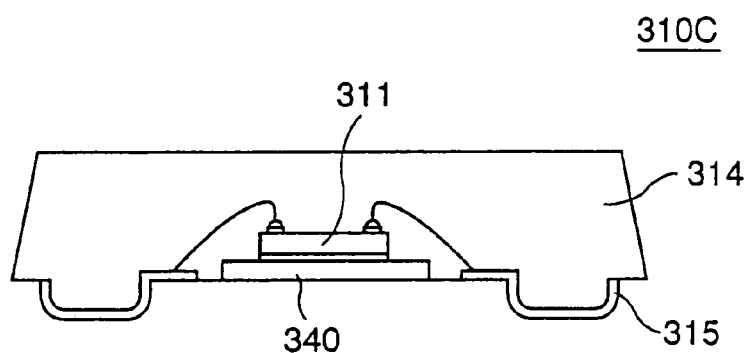
Figure 134:
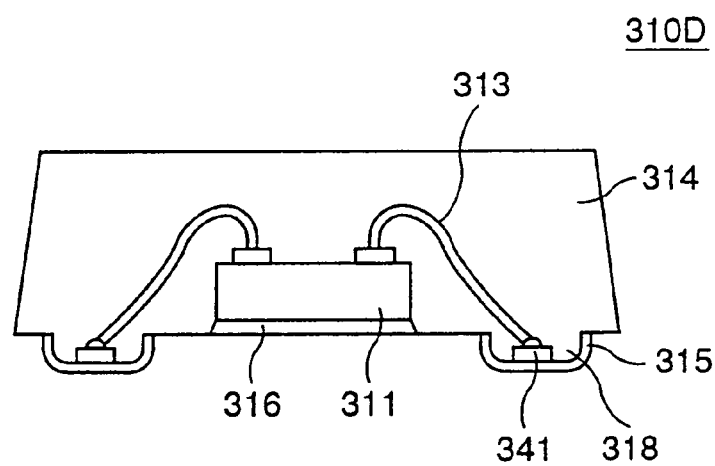
Figure 135:
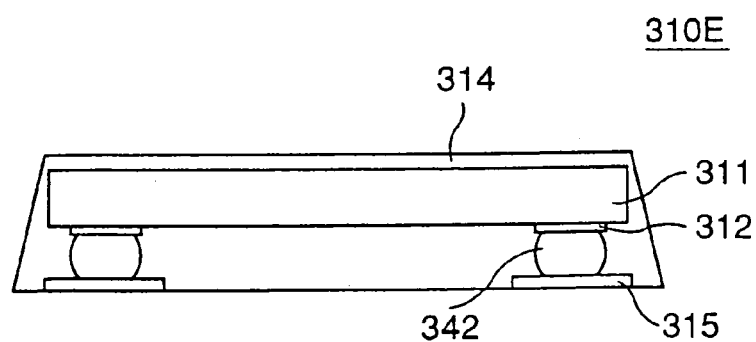
Figure 136A:
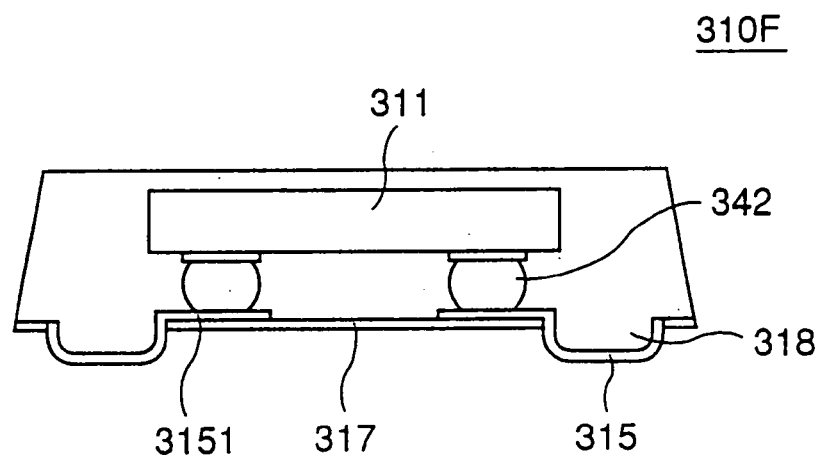
Figure 136B:
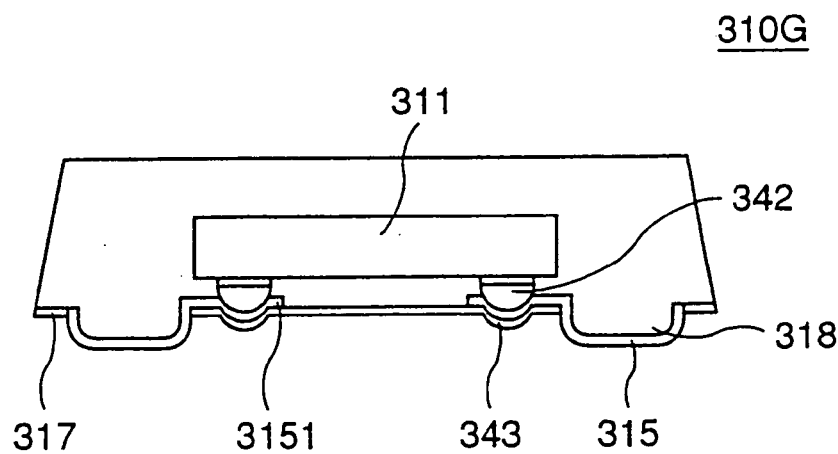
Figure 137:
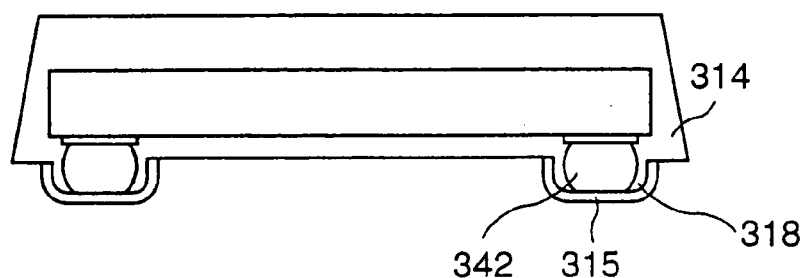
Figure 138:
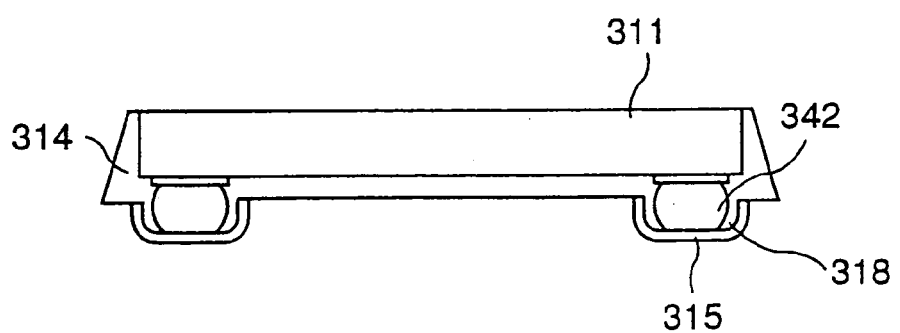
Figure 139A:
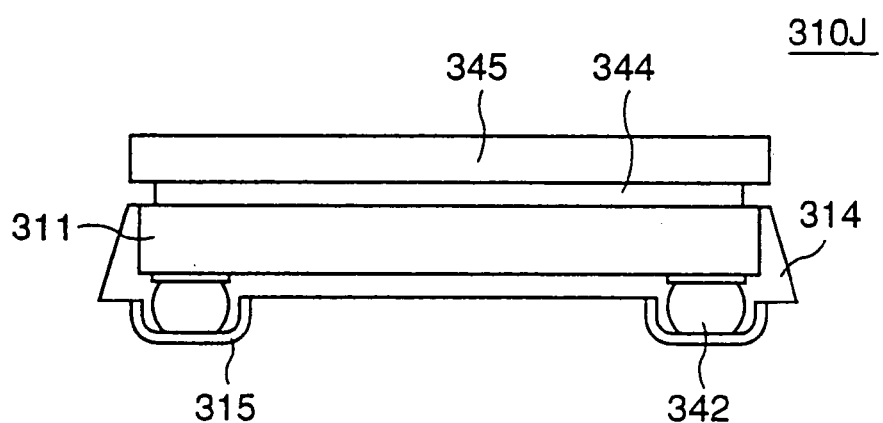
Figure 139B:
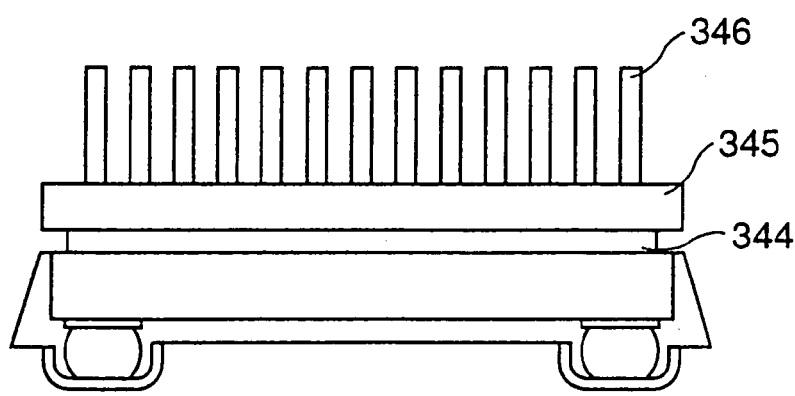
Figure 140:
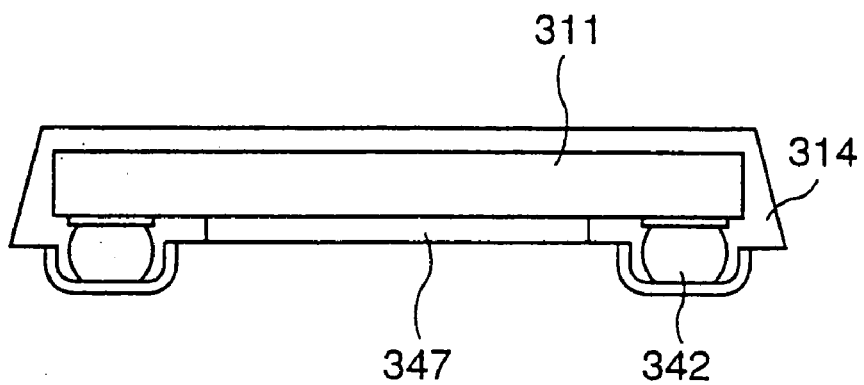
Figure 141A:
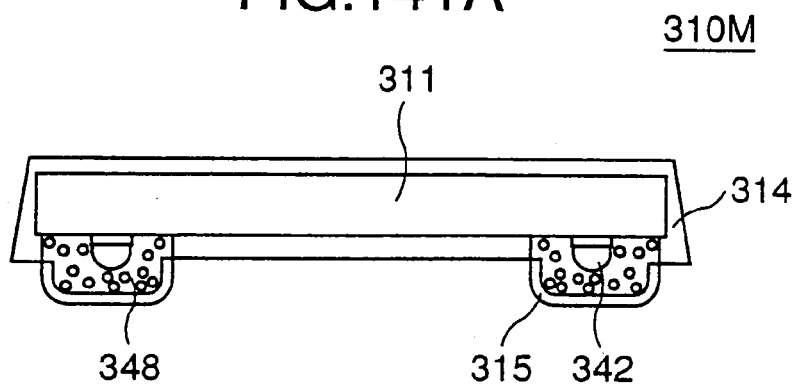
Figure 141B:
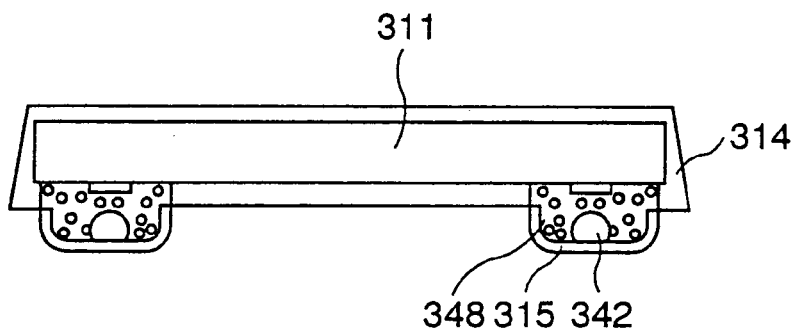

FIG. 120 is a cross-sectional view of a metallic film having a three-layer structure;

FIG. 121 is a cross-sectional view of a metallic film having a four-layer structure;

FIG. 122 is a cross-sectional view showing a resist coating step of a method of producing the semiconductor device according to the nineteenth embodiment of the present invention;

FIG. 123 is a cross-sectional view showing a resist pattern forming step of the method of producing the semiconductor device according to the nineteenth embodiment of the present invention;

FIG. 124 is a cross-sectional view showing a metallic film forming step of the method of producing the semiconductor device according to the nineteenth embodiment of the present invention;

FIG. 125 is a cross-sectional view of a completed lead frame;

FIG. 126 is a cross-sectional view showing a chip mounting step of the method of producing the semiconductor device according to the nineteenth embodiment of the present invention;

FIG. 127 is a cross-sectional view showing a connecting step of the method of producing the semiconductor device according to the nineteenth embodiment of the present invention;

FIG. 128 is a cross-sectional view showing a variation of the connecting step shown in FIG. 127;

FIG. 129 is-a cross-sectional view of the lead frame observed when the sealing step is completed;

FIG. 130 is a cross-sectional view showing a separating step of the method of producing the semiconductor device according to the nineteenth embodiment of the present invention;

FIG. 131 is a cross-sectional view of a variation of the separating step shown in FIG. 130;

FIG. 132A is a cross-sectional view of a semiconductor device according to a twentieth embodiment of the present invention;

FIG. 132B is a top view of the semiconductor device shown in FIG. 132A in which inner parts are seen through a resin package thereof;

FIG. 133 is a cross-sectional view of a semiconductor device according to a twenty-first embodiment of the present invention;

FIG. 134 is a cross-sectional view of a semiconductor device according to a twenty-second embodiment of the present invention;

FIG. 135 is a cross-sectional view of a semiconductor device according to a twenty-third embodiment of the present invention;

FIG. 136A is a cross-sectional view of a variation of the semiconductor device shown in FIG. 133, in which bumps as used in the device shown in FIG. 135 are employed;

FIG. 136B is a cross-sectional view of a variation of the structure shown in FIG. 136A;

FIG. 137 is a cross-sectional view of a variation of the semiconductor device shown in FIG. 134, in which bumps as used in the device shown in FIG. 135 are employed;

FIG. 138 is a cross-sectional view of a variation of the structure shown in FIG. 137;

FIG. 139A is a cross-sectional view of a semiconductor device in which a heat radiating member is attached to an exposed surface of a chip of the device shown in FIG. 138;

FIG. 139B is a cross-sectional view of a semiconductor device in which a heat radiating member having fins is attached to the exposed surface of the chip of the device shown in FIG. 138;

FIG. 140 is a cross-sectional view of a semiconductor device in which an insulating member is provided to the structure shown in FIG. 138; and FIGS. 141A, 141B and 141B are respectively cross-sectional views of a semiconductor device in which an anisotropically electrically conductive resin is employed.

DETAILED DESCRIPTION OF THE PREFERRED EMBODIMENTS

FIG. 3 shows a semiconductor device according to a first embodiment of the present invention. The device shown in FIG. 3 includes a chip 11, electrode pads 12, bonding wires 13, a resin package 14, wire exposing portions 15, and solder balls 16. The chip 11 may be a semiconductor chip, a surface acoustic wave (SAW) chip, a multichip module or the like. In the specification, chips (including chips which will be described later) are semiconductor chips, and resin-packaged devices including the above chips are semiconductor devices. However, if an SAW chip is packaged, such a resin-packaged device should be called an SAW device or the like.

Ends of the bonding wires 13 are bonded to the electrode pads 12 provided on the chip 11 by a wire bonder, and the other ends of the bonding wires 13 are exposed in the wire exposing portions 15 formed on the bottom surface of the resin package 14. The diameter of the wire exposing portions 15 is greater than that of the bonding wires 13. The exposed ends of the bonding wires 13 are flush with the bottom surface of the resin package. The solder balls 16 are joined to the bonding wires 13 in the wire exposing portions 15 in which the ends of the wires 13 are exposed from the resin package 14.

The above structure does not require the inner leads and outer leads necessary for the SSOP, so that there is no need to provide a lead extending area in which the inner leads are arranged as well as an area occupied by the outer leads. Further, the structure shown in FIG. 3 does not need a mount base necessary for providing solder balls in the BGA type. Hence, the semiconductor device according to the first embodiment of the present invention needs a smaller mounting area and is less expensive.

A description will now be given of a method of producing the semiconductor device shown in FIG. 3.

As shown in FIG. 4, the chip 11 is mounted on a lead frame 17 by a die attaching agent 18. The lead frame 17 is made of an alloy such as a copper alloy, and is 0.1–0.2 mm thick. Next, the bonding wires 13 are bonded to the electrode pads 12 on the chip 11 and predetermined portions of the lead frame 17. The above predetermined portions are plated with Au, Ag, Pd or the like.

Figure 2:
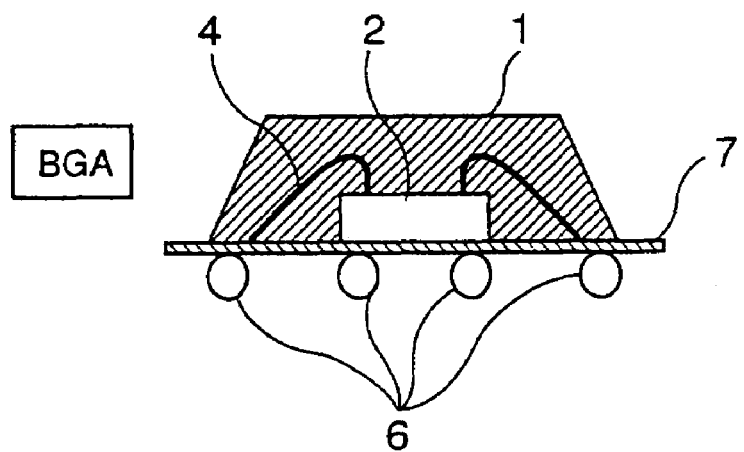
FIG. 2 is a cross-sectional view of a semiconductor device of a conventional BGA type.
Figure 5:
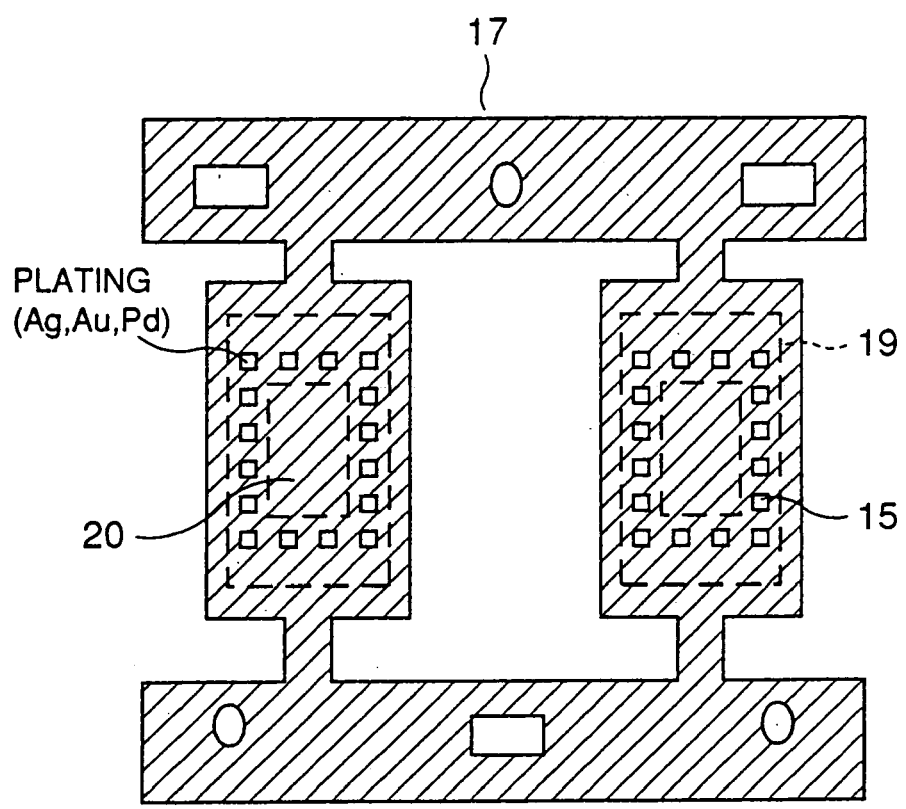
FIG. 5 is a plan view of a lead frame used to produce semiconductor devices according to the first embodiment of the present invention.

Then, as shown in FIG. 5, the lead frame 17 on which the chip 11 is mounted is accommodated in a die (not shown), and is then sealed by molding resin. In this step, the molded resin is provided up to an area indicated by mold lines 19 which enclose the wire exposing portions 15.

Figure 6:
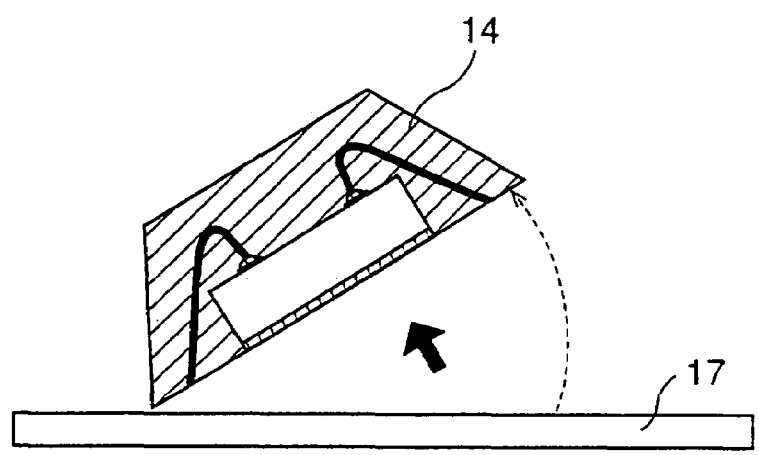
FIG. 6 is a cross-sectional view showing another step of the method of producing the semiconductor device shown in FIG. 3.

Thereafter, as shown in FIG. 6, the resin package 14 is separated from the lead frame 17. The separating step can be carried out by utilizing a process based on the difference between linear expansion coefficients of the resin package 14 and the lead frame 17, or another process in which the resin package 14 and the lead frame 17 are joined with a less-tight adhesiveness. For example, the surface of the lead frame 17 is plated or made to be flat. By the above process, the separating process can be facilitated.

Figure 7:
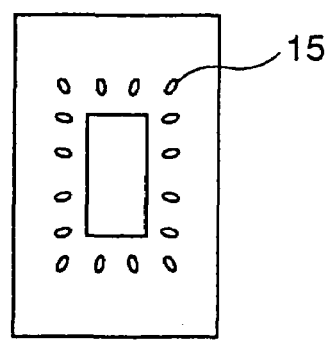
FIG. 7 is a bottom view of a resin package observed when the step shown in FIG. 6 is completed.

FIG. 7 is a bottom view of the package after the separating process is carried out. The wire exposing portions 15 are located so as to surround the chip 11. The area of each of the wire exposing portions 15 is greater than the area of the cross section of each of the bonding wires 13 because the ends of the wires are crushed and shaped into a nail head shape during the bonding process.

The bonding may be carried out in the state shown in FIG. 7. Alternatively, the solder balls 16 can be provided to the wire exposing portions 15, as shown in FIG. 3. The solder balls 16 can be formed by forming balls of solder (about φ0.5–φ0.8) beforehand, placing the balls in the wire exposing portions 15 with a flux applied, and performing a reflow heat treatment, so that the spherically-shaped solder balls 16 can be formed.

[Second Embodiment]

A description will now be given, with reference to FIGS. 8 through 13, of a semiconductor device and its production method according to a second embodiment of the present invention. In these figures, parts that are the same as those shown in the previously described figures are given the same reference numbers.

Figure 8:
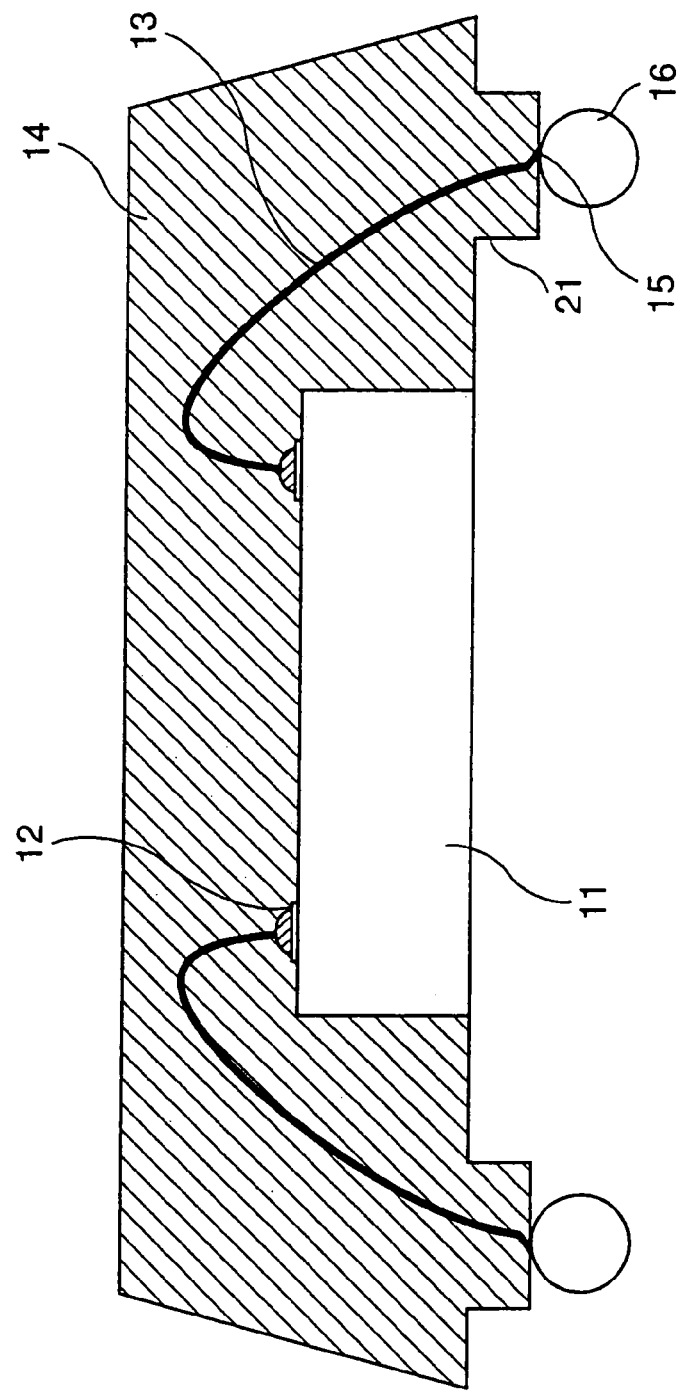
FIG. 8 is a cross-sectional view of a semiconductor device according to a second embodiment of the present invention.

FIG. 8 shows a semiconductor device according to the second embodiment of the present invention, which has resin projections 21 projecting from the bottom surface (the mounting side) of the package by, for example, 0.05–1.00 mm. The bonding wires 13 are exposed from the bottom surfaces of the resin projections 21. The area of each of the wire exposing portions 15 is greater than the area of the cross-section of each of the bonding wires 13.

Figure 9:
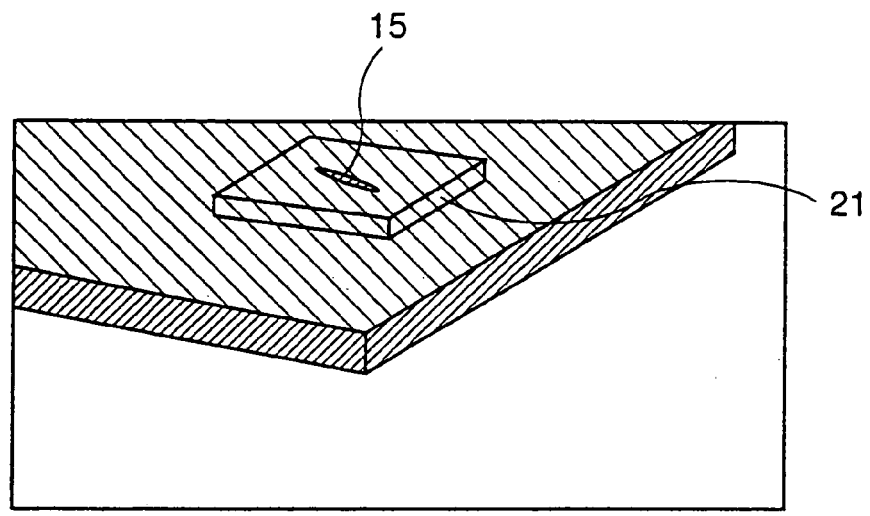
FIG. 9 is an enlarged perspective view of a resin projection used in the semiconductor device shown in FIG. 8.
Figure 10:
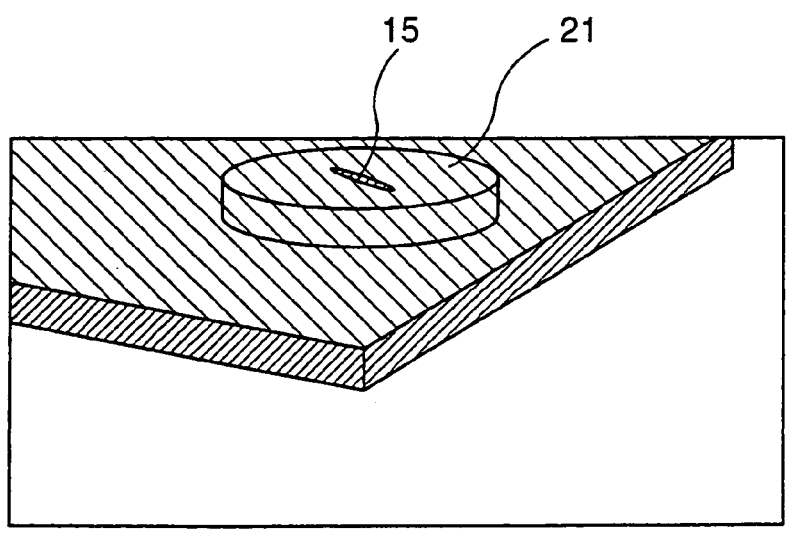
FIG. 10 is an enlarged perspective-view of an alternative of the resin projection used in the semiconductor device shown in FIG. 8.

The resin projections 21 may have a rectangular parallelepiped shape as shown in FIG. 9, a cylindrical shape as shown in FIG. 10, or an arbitrary shape.

The solder balls 16 are joined to the wire exposing portions 15. Due to the resin projections 21, the solder balls 16 do not flush with the bottom surface of the package. This structure is not affected by a curvature or deformation of the package. Further, the above structure reduces the possibility of occurrence of a bridge of solder, which connects some solder balls.

The semiconductor device according to the second embodiment of the present invention can be produced as follows.

Figure 11:
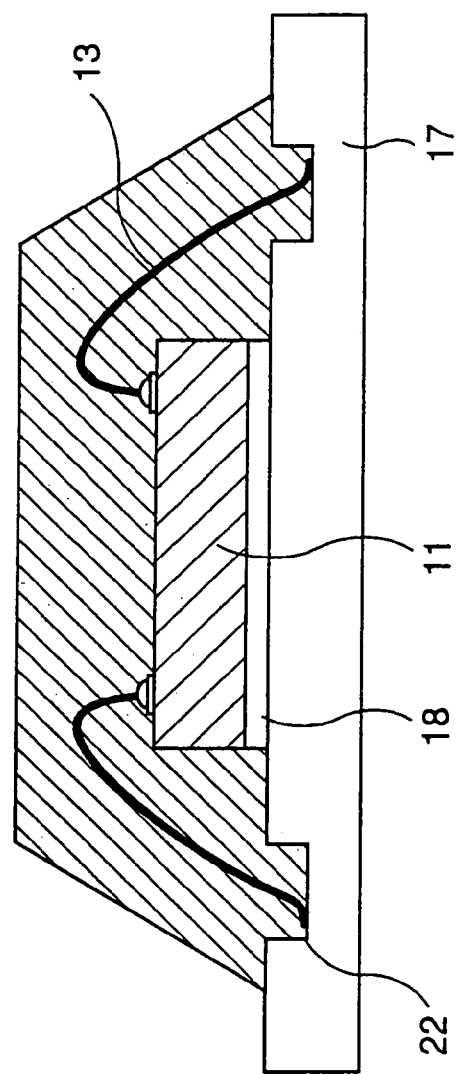
FIG. 11 is a cross-sectional view showing a step of a method of producing the semiconductor device according to the second embodiment of the present invention.

As shown in FIG. 11, the chip 11 is mounted on the lead frame 17 by the die attaching agent 18. Next, the electrode pads provided on the chip 11 and recess portions 22 formed on the lead frame 17 are bonded together by the bonding wires 13. The bottom surfaces of the recess portions 22 formed on the lead frame 17 are plated in order to enable wire bonding.

Then, in the same manner as that of the first embodiment of the present invention, the lead frame 17 on which the chip 11 is mounted is accommodated in a die (not shown), and is then sealed by molding resin. In this process, the resin is molded up to the area which encloses the wire exposing portions 15, as in the case of the first embodiment of the present invention.

Figure 12:
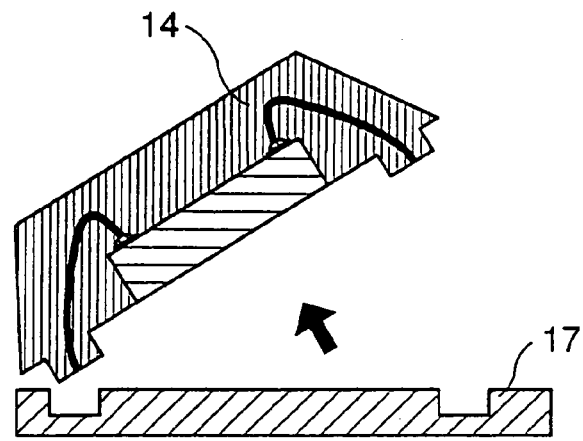
FIG. 12 is a cross-sectional view showing another step of the method of producing the semiconductor device according to the second embodiment of the present invention.

Thereafter, as shown in FIG. 12, the resin package 14 is separated from the lead frame 17 in the same manner as that of the first embodiment of the present invention.

Figure 13:
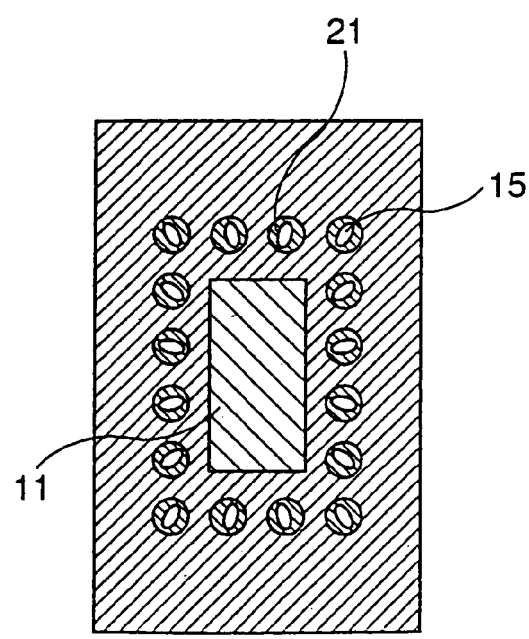
FIG. 13 is a bottom view of a package after the step shown in FIG. 12 is completed.

FIG. 13 shows a bottom view of the package after the separating process is carried out. The wire exposing portions 15 in the resin projections 15 are located so as to surround the chip 11. The area of each of the wire exposing portions 15 is greater than the area of the cross section of each of the bonding wires 13.

In the state shown in FIG. 13, solder paste may be coated to lands provided on a circuit board, and then the package may be mounted on the circuit board. Alternatively, solder balls 16 shown in FIG. 8 may be provided to the wire exposing portions 15. The solder balls 16 can be formed in the same manner as those used in the first embodiment of the present invention.

[Third Embodiment]

A description will now be given, with reference to FIGS. 14 through 18, of a semiconductor device according to a third embodiment of the present invention and its production method. In these figures, parts that are the same as those shown in the previously described figures are given the same reference numbers.

Figure 14:
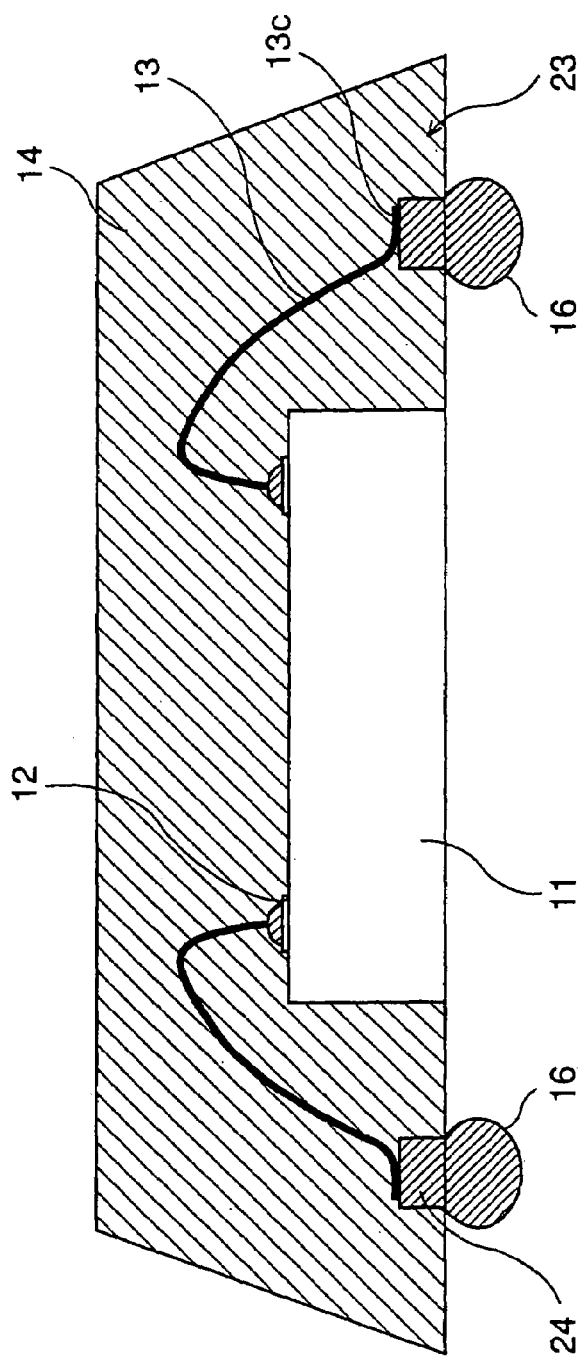
FIG. 14 is a cross-sectional view of a semiconductor device according to a third embodiment of the present invention.

FIG. 14 shows a semiconductor device according to the third embodiment of the present invention, which has recess portions 23 formed in the resin package 14 and solder-buried portions 24. The solder balls 16 are connected to the bonding wires 13 via the solder-buried portions 24.

Figure 15:
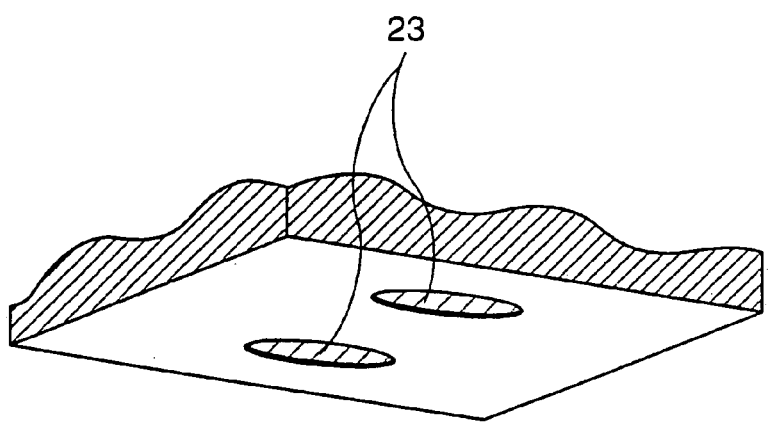
FIG. 15 is an enlarged perspective view of resin projections used in the semiconductor device according to the third embodiment of the present invention.

FIG. 15 shows a package observed before the solder balls 16 are provided and the solder-buried portions 24 are formed. The bottoms of the recess portions 23 are 0.05–0.20 mm lower than the bottom surface of the package. The ends of the bonding wires 13 are exposed in the bottoms of the recess portions 23. The area of each of the wire exposing portions is greater than the area of the cross section of each of the bonding wires 13. The recess portions 23 may have a rectangular parallelepiped shape, a cylindrical shape or an arbitrary shape.

The solder-buried portions 24 are provided between the solder balls 16 and the wire exposing portions 15. Due to the solder-buried portions 24, the strength of joining the solder balls 16 and the wire exposing portions 15 can be enhanced as compared with those in the first and second embodiments of the present invention. This is because larger end portions 13c of the bonding wires 13 can be joined to the solder-buried portions 24, and the solder balls 16 can be joined to the entire exposed surfaces of the solder-buried portions 24.

A method of producing the semiconductor device shown in FIG. 14 will be described below.

Figure 16:
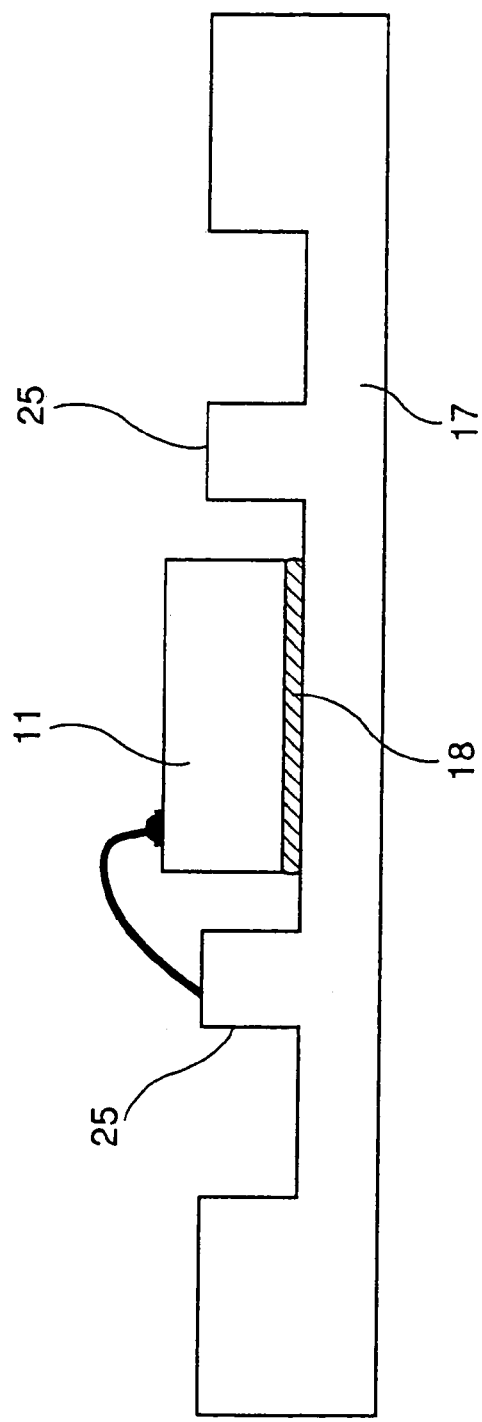
FIG. 16 is a side view showing a step of a method of producing the semiconductor device according to the third embodiment of the present invention.

As shown in FIG. 16, the chip 11 is mounted on the lead frame 17 by the dice attaching agent 18. Next, the electrode pads provided on the chip 11 and protruding portions 25 formed on the lead frame 17 are bonded together by the bonding wires 13. The protruding portions 25 formed on the lead frame 17 are plated in order to enable wire bonding.

Figure 17:
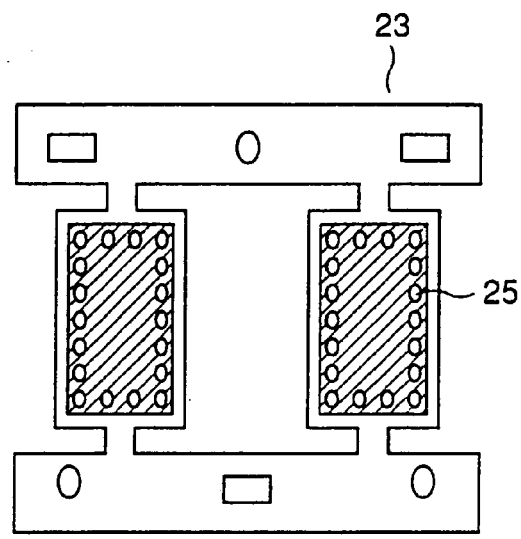
FIG. 17 is a plan view of a lead frame used to produce semiconductor devices according to the third embodiment of the present invention.

A half-etching step is carried out for the lead frame 17, as shown by oblique lines shown in FIG. 17 except for the protruding portions 25 in order to define the protruding portions 25. Alternatively, a stamping process can be used to form the protruding portions 25. In the stamping process, punches are provided to terminal forming areas and the lead frame 17 is plastically deformed Then, in the same manner as that of the first embodiment of the present invention, the lead frame 17 on which the chip 11 is mounted is accommodated in a die (not shown,), and is then sealed by molding resin. In this process, the molded resin extends up to the area which encloses the wire exposing portions 15, as in the case of the first embodiment of the present invention.

Figure 18:
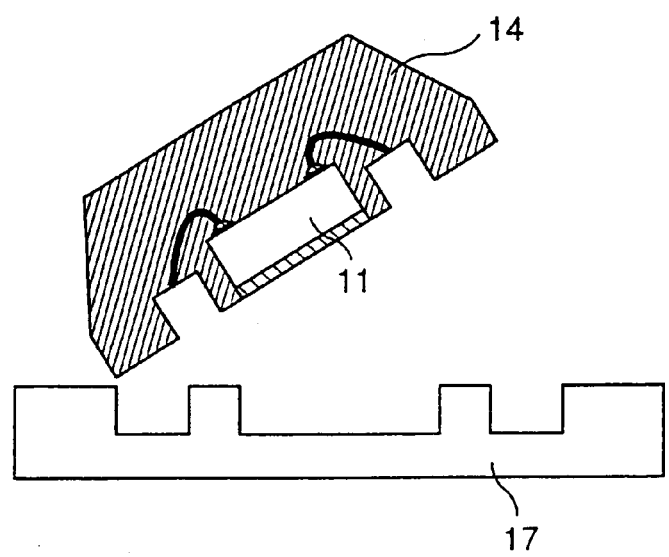
FIG. 18 is a cross-sectional view showing another step of the method of producing the semiconductor device according to the third embodiment of the present invention.

Thereafter, as shown in FIG. 18, the resin package 14 is separated from the lead frame 17 in the same manner as that of the first embodiment of the present invention.

FIG. 13 shows a bottom view of the package after the separating process is carried out it will be noted that FIG. 13 was used in the aforementioned description directed to the second embodiment of the present invention. It will be noted that the recess and protruding portions cannot be discriminated in the bottom views of the packages used in the second and third embodiments. The wire exposing portions 15 exposed in the recess portions 23 are located so as to surround the chip 11. The area of each of the wire exposing portions 15 is greater than the area of the cross section of each of the bonding wires, as in the case of the first embodiment of the present invention.

The solder balls 16 provided to the wire exposing portions 15 shown in FIG. 14 are needed to mount the semiconductor device on a circuit board. The solder balls 16 can be formed by directly placing solder balls in the recess portions 23 and forming them into a spherical shape after the reflow heat treatment. In this step, solder is provided in the solder-buried portions 24. Alternatively, solder paste can be buried in the solder-buried portions 24 by a screen printing process, and solder balls are given thereto and heated so that the solder balls are shaped in a sphere.

[Fourth Embodiment]

A description will now be given, with reference to FIGS. 19 and 20, of a semiconductor device according to a fourth embodiment of the present invention. In these figures, parts that are the same as those shown in the previously described figures are given the same reference numbers.

The fourth embodiment of the present invention differs from the first embodiment thereof in that bonding balls (bumps) 26 are provided between the ends of the bonding wires 13 and the solder balls 16. The area of each of the wire exposing portions 15 is greater than the area of the cross-section of each of the bonding wires 13. Hence, it is possible to make a more reliable contact between the bonding wires 13 and the solder balls 16.

Figure 19A:
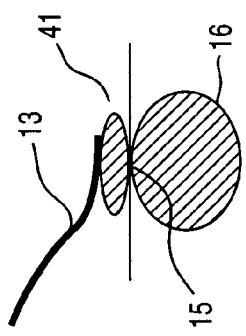
FIG. 19 is a cross-sectional view of a semiconductor device according to a fourth embodiment of the present invention.
Figure 19:
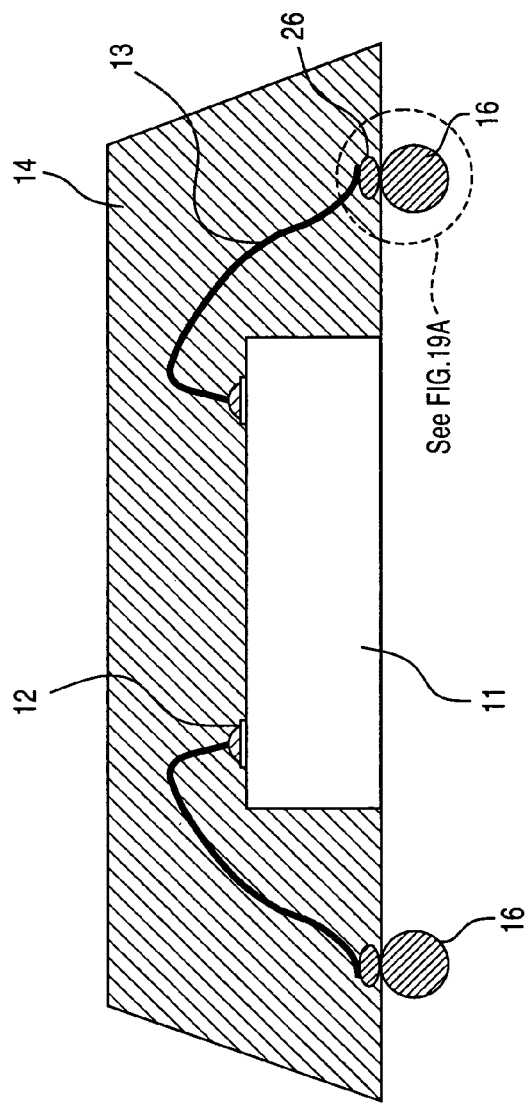
Figure 20:
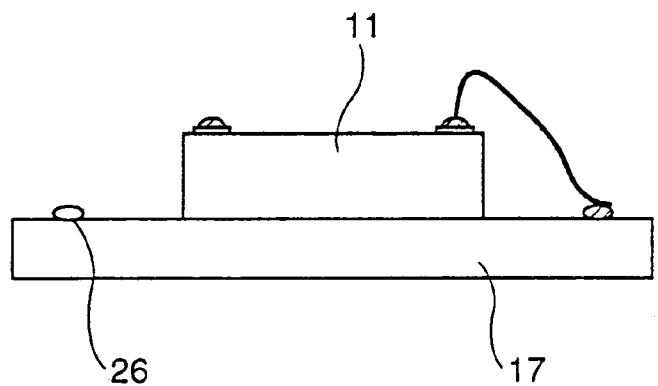
FIG. 20 is a side view showing a process of a method of producing the semiconductor device shown in FIG. 19.

The device shown in FIG. 19 is produced as follows. Referring to FIG. 20, the chip 11 is mounted on the lead frame 17, and then the bonding wires 13 are bonded, by means of a wire bonder, to electrode pads provided on the chip 11 and the bonding balls 26 provided on the lead frame 17. The bonding balls 26 are provided in given positions on the lead frame 17 after the chip 11 is mounted on the lead frame 17 and before the bonding wires 13 are bonded.

Then, in the same manner as that of the first embodiment of the present invention, the lead frame 17 on which the chip 11 is mounted is accommodated in a die (not shown), and is then sealed by molding resin. Thereafter, the resin package 14 is separated from the lead frame 17 in the same manner as that of the first embodiment of the present invention. In this state, the device may be mounted on a circuit board. Alternatively, the solder balls 16 may be provided to the wire exposing portions 15, as shown in FIG. 19. The solder balls 16 can be formed in the same manner as those of the first embodiment of the present invention.

[Fifth Embodiment]

Figure 21:
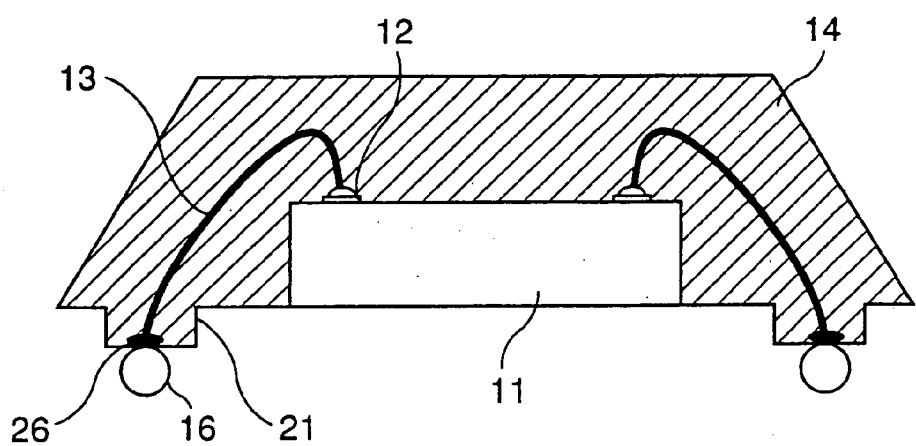
FIG. 21 is a cross-sectional view of a semiconductor device according to a fifth embodiment of the present invention.

A description will now be given, with reference to FIG. 21, of a semiconductor device according to a fifth embodiment of the present invention. The semiconductor device shown in FIG. 21 corresponds to a combination of the second embodiment of the present invention shown in FIG. 8 and the fourth embodiment thereof shown in FIG. 19. In FIG. 21, parts that are the same as those shown in the previously described figures are given the same reference numbers.

The fifth embodiment of the present invention has a feature such that the bonding balls 26 are exposed from the bottom surfaces of the resin projections 21, and the solder balls 16 are connected to the exposed bonding balls 26. This structure is not affected by a curvature of the package. Further, the above structure reduces the possibility of occurrence of a bridge of solder, which connects some solder balls. Furthermore, the bonding balls 26 are greater than the ends of the bonding wires 13, so that a more reliable contact can be made when mounting the device on a circuit board.

[Sixth Embodiment]

A description will now be given, with reference to FIGS. 22 and 23, of a semiconductor device according to a sixth embodiment of the present invention. In these figures, parts that are the same as those shown in the previously described figures are given the same reference numbers.

Figure 22:
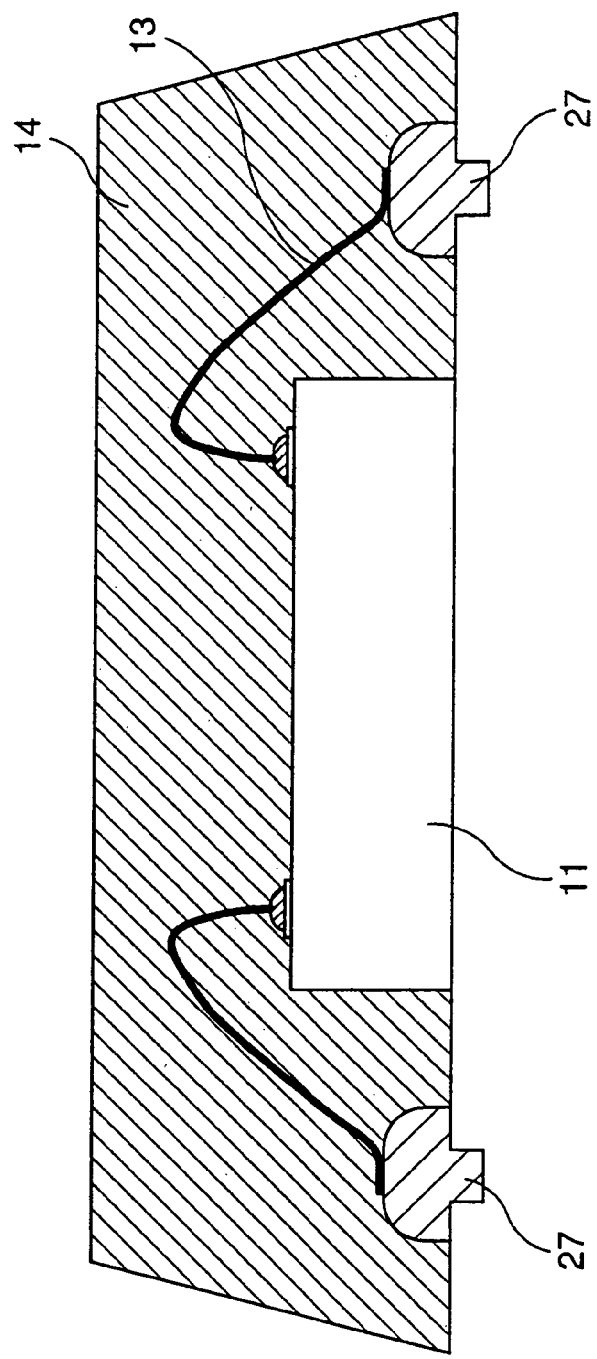
FIG. 22 is a cross-sectional view of a semiconductor device according to a sixth embodiment of the present invention.

The sixth embodiment of the present invention has a feature such that bonding balls 27 as shown in FIG. 22 serving as terminals for mounting are provided instead of the above-mentioned solder balls 16. Each of the bonding balls 27 has a projection projecting from the bottom surface of the resin package 14. The length of the projection is, for example, tens of microns. Hence, the bonding balls 27 do not need any solder balls like the solder balls 16. That is, the bonding balls 27 can be directly mounted to a circuit board.

The semiconductor device shown in FIG. 22 can be produced as follows.

Figure 23:
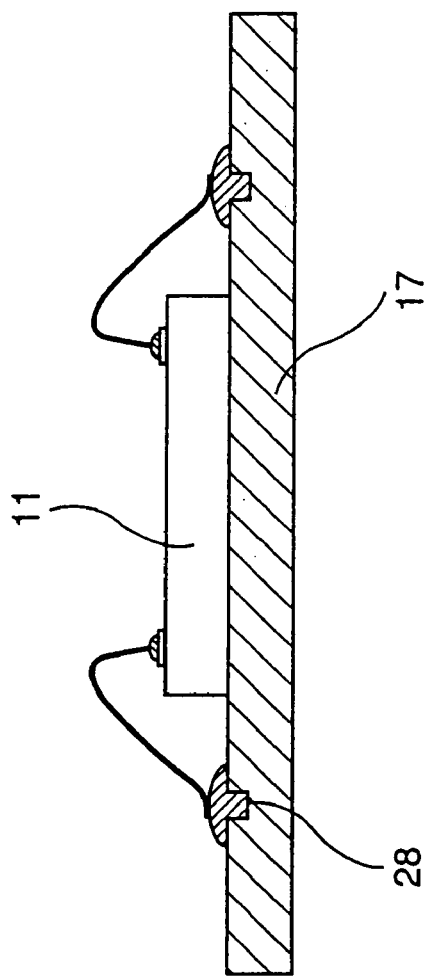
FIG. 23 is a cross-sectional view showing a step of a method of producing the semiconductor device shown in FIG. 22.

Referring to FIG. 23, the chip 11 is mounted on the lead frame 17 by the die attaching agent 18, as in the case of the first through fifth embodiments of the present invention. Next, the bonding wires 13 are bonded to the electrode pads provided on the chip 11 and recess portions 28 formed on the lead frame 17. The diameter of the recess portions 28 is less than that of the bonding balls 27. When the bonding balls 27 are pressed against the recess portions 28, the bonding balls 27 are partially inserted into the recess portions 28, so that the relationship between the bonding balls 27 and the recess portions 28 is as shown in FIG. 23. The bottom surfaces of the recess portions 28 formed in the lead frame 17 are plated in order to enable wire bonding.

Then, in the same manner as that of the first embodiment of the present invention, the lead frame 17 on which the chip 11 is mounted is accommodated in a die (not shown), and is then sealed by molding resin. Thereafter, the resin package 14 is separated from the lead frame 17 in the same manner as that of the first embodiment of the present invention.

[Seventh Embodiment]

A description will now be given, with reference to FIG. 24, of a semiconductor device according to a seventh embodiment of the present invention, which has almost the same structure as that of the third embodiment thereof except that the device shown in FIG. 24 employs bonding balls 29.

Figure 24:
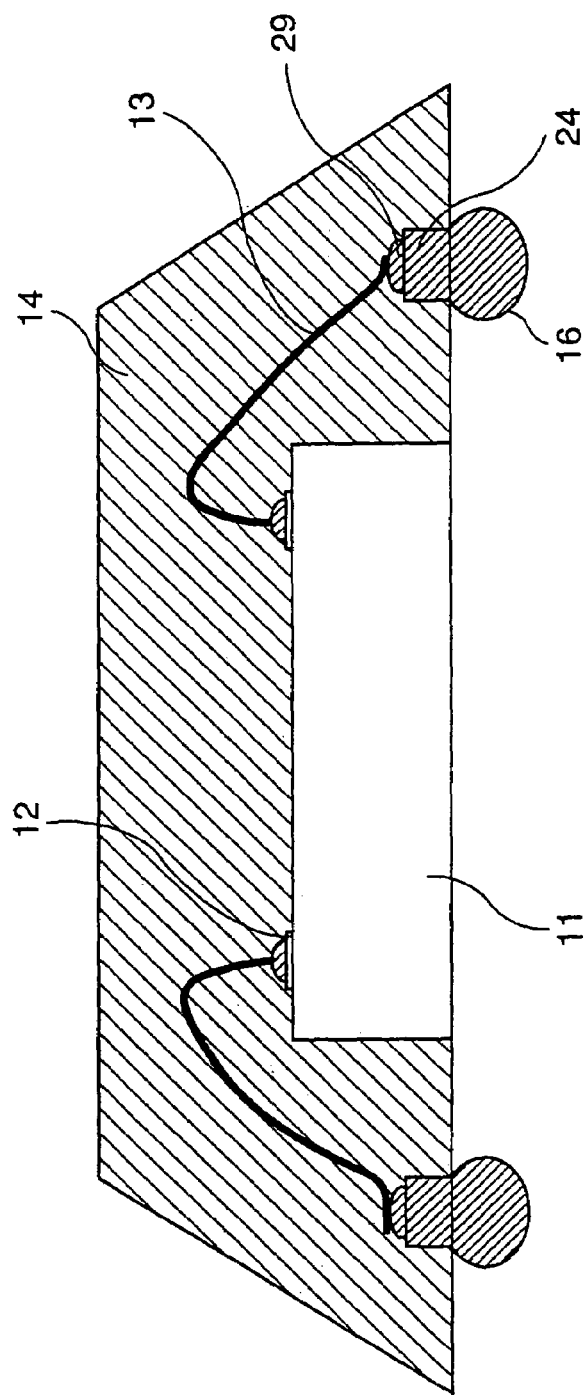
FIG. 24 is a cross-sectional view of a semiconductor device according to a seventh embodiment of the present invention.

As shown in FIG. 24, the solder balls 16 are connected to the bonding wires, 13 through the solder-buried portions 24. Further, the bonding balls 29 are provided between the solder-buried portions 24 and the bonding wires 13. The bonding balls 29 are greater in size than the ends of the bonding wires 13, so that the reliability of making a contact can be increased. Further, due to the solder-buried portions 24, the strength of joining the solder balls 16 thereto can be enhanced.

[Eighth Embodiment]

Figure 28:
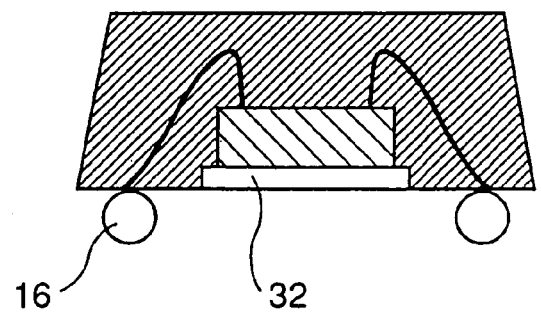
FIG. 28 is a cross-sectional view of the semiconductor device according to the eighth embodiment of the present invention.

A description will now be given, with reference to FIGS. 25 through 28, of a semiconductor device and its production method according to an eighth embodiment of the present invention. In the above-mentioned first-through seventh embodiments of the present invention, the chip 11 is exposed in the bottom surface of the resin package 14. In the eighth embodiment of the present invention, the chip 11 is mounted on a die stage 32, which is exposed in the bottom surface of the resin package 14, as shown in FIGS. 26 and 28.

The semiconductor device shown in FIG. 28 can be produced as follows.

The chip is mounted on the die stage 32 of a lead frame 31 by a die attaching agent. Next, the lead frame 31 is stacked on a lead frame 30, and is fixed thereto by spot welding. Then, the bonding wires 13 are bonded to electrode pads on the chip 11 and given positions on the lead frame 30. The given positions of the lead frame 30 or the entire lead frame 30 is plated in order to enable wire bonding.

Figure 25:
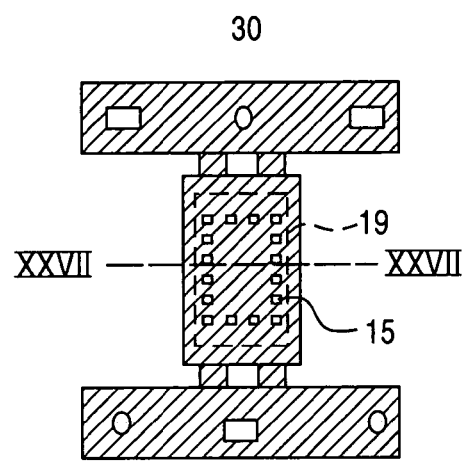
FIG. 25 is a plan view of a lead frame used to produce a semiconductor device according to an eighth embodiment of the present invention.
Figure 26:
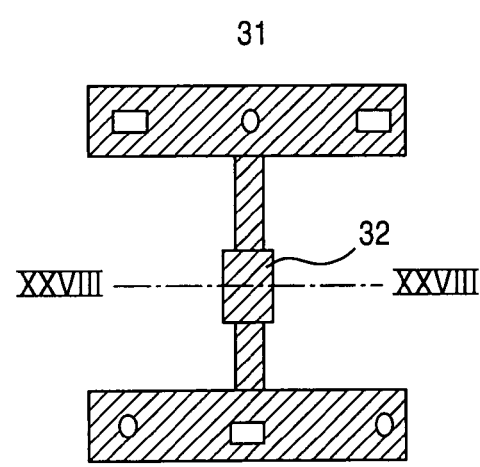
FIG. 26 is a plan view of another lead frame used to produce the semiconductor device shown in FIG. 24.
Figure 27:
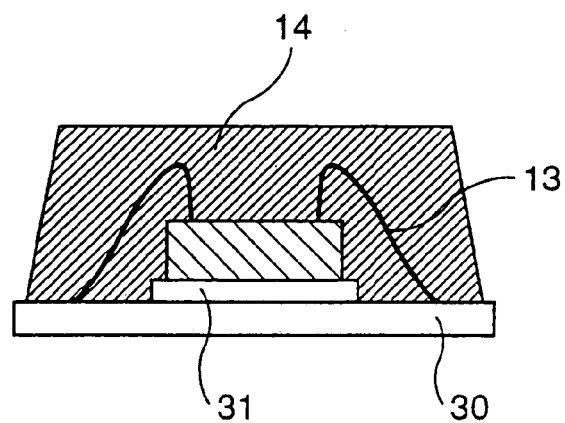
FIG. 27 is a cross-sectional view showing a step of a method of producing the semiconductor device according to the eighth embodiment of the present invention.

As shown in FIG. 25, the lead frames 30 and 31 are accommodated in a die (not shown), and are then sealed by molding resin. In this process, the molded resin extends up to the area which encloses the wire exposing portions 15. Thereafter, only the lead frame 30 is mechanically separated from the resin package 14. Then, the solder balls 16 are provided as in the case of the first embodiment of the present invention.

[Ninth Embodiment]

A description will now be given, with reference to FIGS. 29 through 31, of a semiconductor device and its production method according to a ninth embodiment of the present invention. In these figures, parts that are the same as those shown in the previously described figures are given the same reference numbers.

Figure 29:
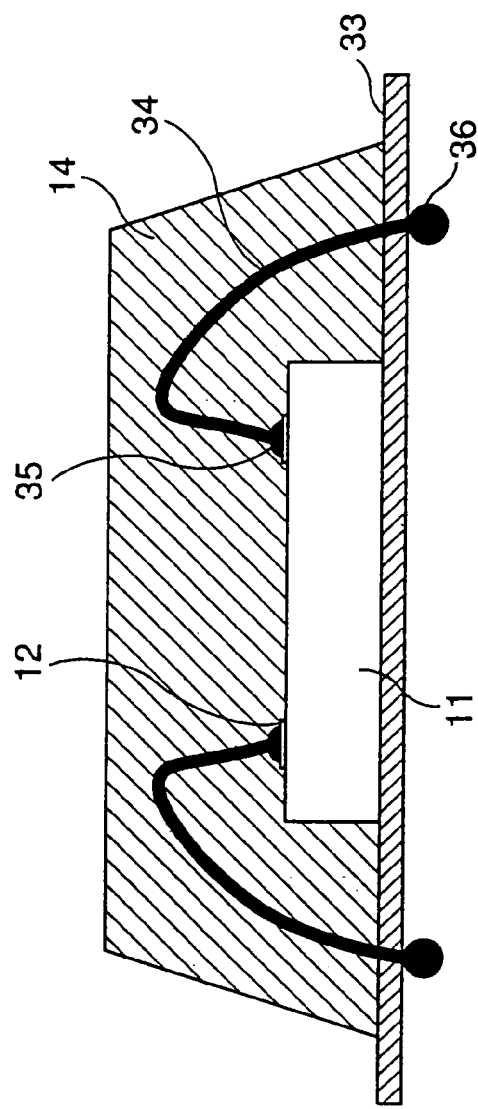
FIG. 29 is a cross-sectional view of a semiconductor device according to a ninth embodiment of the present invention.

As shown in FIG. 29, first balls 35 are formed by bonding solder wires 34 mainly containing Pb—Sn to the electrode pads 12 on the chip 11. The solder wires 34 penetrate through a lead frame 33, and form second balls 36 on the surface of the lead frame 33 opposite to the surface thereof on which the chip 11 is mounted.

The mounting of the semiconductor device shown in FIG. 29 on a circuit board is completed by soldering the second balls 36 to a foot print on the circuit board. Since the ends of the solder wires 34 form the second balls 36 for electrical connections to the circuit board, the wire bonding process and the process for forming the terminals for electrical connections to the circuit board are simultaneously carried out.

The semiconductor device shown in FIG. 29 can be produced as follows.

Figure 30:
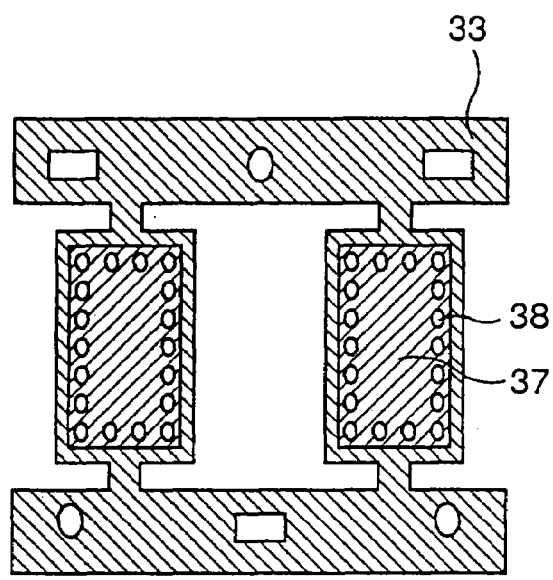
FIG. 30 is a plan view of a lead frame used to produce semiconductor devices according to the ninth embodiment of the present invention.
Figure 31:
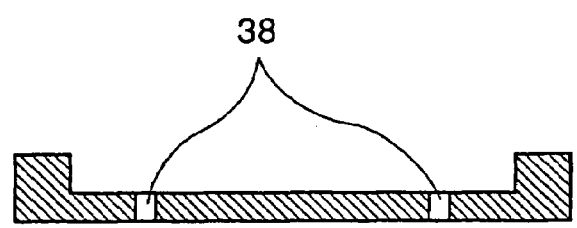
FIG. 31 is a cross-sectional view of the lead frame shown in FIG. 30.

As shown in FIG. 30, a half-etching process is carried out so that the central portion of the lead frame 33 is half-etched so that the peripheral portion of each die stage remains.

Hence, a half-etched area 37 is formed. The lead frame 33 has through holes 38, as shown in FIGS. 30 and 31. Next, the chip 11 is mounted on the die stage of the lead frame 33 by a dice attaching agent.

Then, the solder wires 34 first are bonded to the electrode pads 12 on the chip 11, and second are bonded to the given positions on the lead frame 33. In the second bonding process, the solder balls formed by a spark are pushed against the through holes 38 by means of an end of a capillary (not shown), so that the solder balls are pushed out of the through holes 38. Hence, the second balls 36 are formed on the surface of the lead frame 33 opposite to its chip mounting surface.

Thereafter, the lead frame 33 on which the chip 11 is mounted is accommodated in a die, and is then sealed by molding resin. In this process, the molded resin extends up to the area which surrounds the second balls 36. Then, the resin package 14 is separated from the lead frame 33.

[Tenth Embodiment]

A description will now be given of a semiconductor device and its production method according to a tenth embodiment of the present invention.

Figure 32:
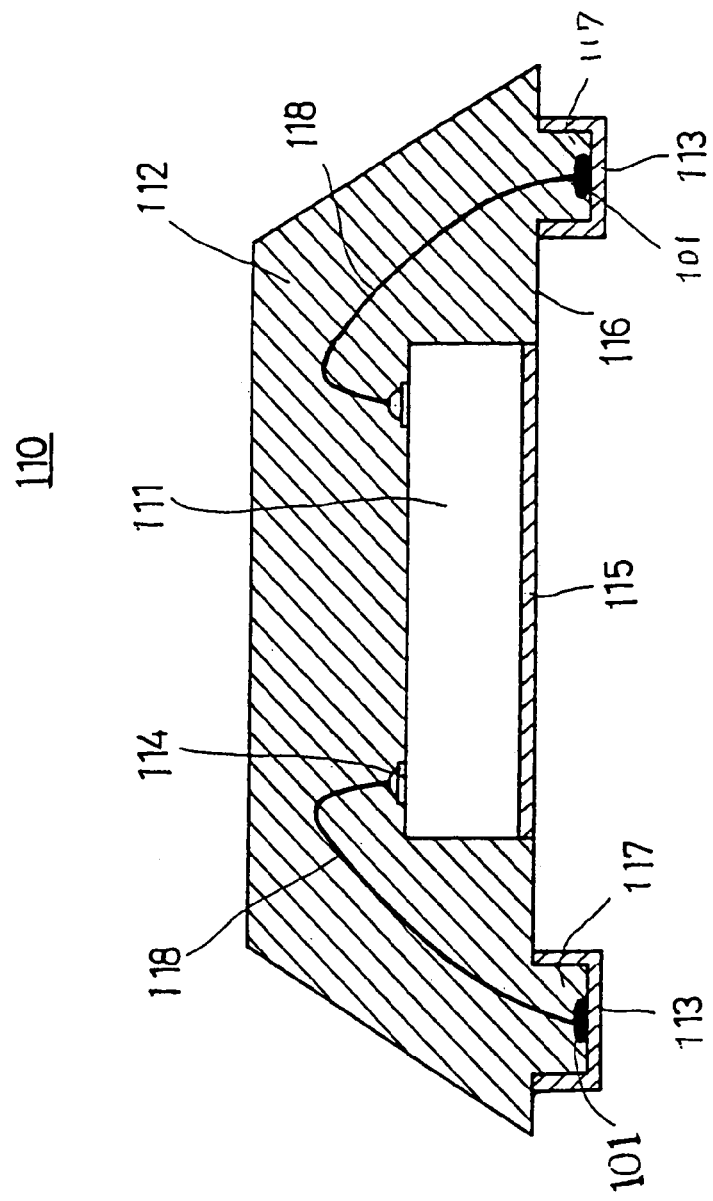
FIG. 32 is a cross-sectional view of a semiconductor device according to a tenth embodiment of the present invention.
Figure 33:
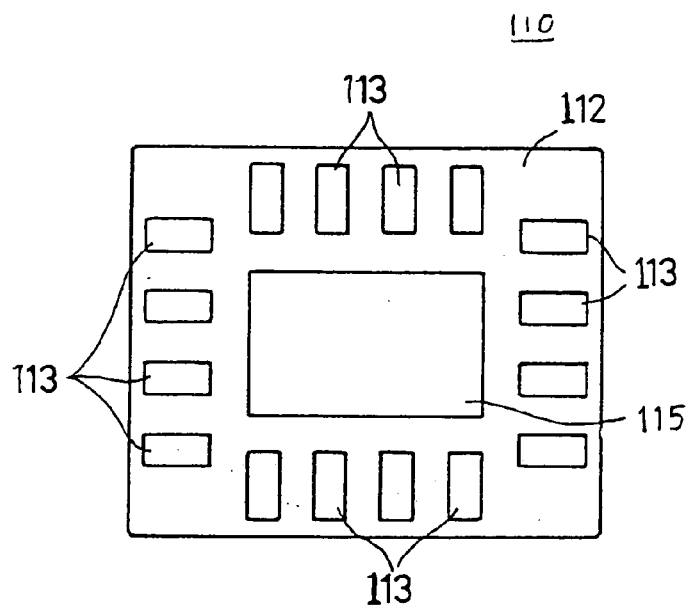
FIG. 33 is a bottom view of the semiconductor device according to the tenth embodiment of the present invention.
Figure 34:
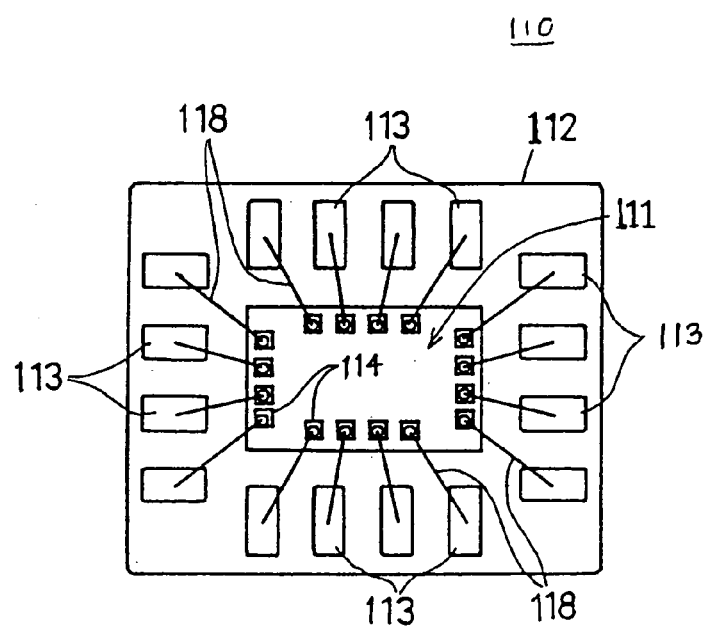
FIG. 34 is a plan view of the semiconductor device according to the tenth embodiment of the present invention, in which inner parts thereof are seen through a resin package.

FIG. 32 is a cross-sectional view of a semiconductor device 110 according to the tenth embodiment of the present invention, and FIG. 33 is a bottom view of the semiconductor device 110. FIG. 34 is a plan view of the semiconductor device 110 seen through a resin package 112 which will be described later.

The semiconductor device 110 is mainly made up of a chip 111, a resin package 112 and metallic films 113. A plurality of electrode pads 114 are provided on the upper surface of the chip 111, which is mounted on a chip fixing resin, 115. The chip 111 may be a semiconductor chip, a SAW chip, a multichip module or the like.

The resin package 112 is formed by molding epoxy resin or the like, as will be described later. A potting can be used to form the resin package 112. Resin projections 117, which are integrally formed with the resin package 112, are located in given positions on the bottom surface (mounting-side surface) of the resin package 112. The resin projections 117 are arranged at a pitch equal to, for example, 0.8 mm.

The metallic films 113 are provided so that they respectively cover the resin projections 117. Bonding wires 118 are provided between the metallic films 113 and the electrode pads 114, so that the metallic film 113 and the chip 111 are electrically connected together. Bonding balls 101 like the aforementioned bonding balls 26 are provided in order to improve the bondability of the bonding wire 118 to the metallic film 113. The details of the metallic films 113 will be described later.

The semiconductor device 110 thus formed does not need any inner and outer leads used in the SSOP. Hence, there is no need to provide an area for leading the inner leads and a space in which the outer leads extend. Hence, a down-sized semiconductor device can be provided. Further, the semiconductor device 110 does not need any solder balls used in the BGA type, and is thus less expensive. Furthermore, the resin projections 117 and the metallic films 113 cooperate with each other as if they function as solder bumps of the BGA-type devices, so that a high mounting density can be obtained. Furthermore, the semiconductor device 110 is not affected by a curvature or deformation of the resin package 112.

A description will now be given, with reference to FIGS. 35 through 38, of the metallic films 113. These figures are enlarged views of one of the metallic films 113.

As described above, the metallic film 113 covers the resin projection 117 and is electrically connected to the chip 111 by the bonding wire 118. The metallic film 113 functions as a terminal for an external connection, and is connected to an electrode part formed on a circuit board by soldering.

Figure 35:
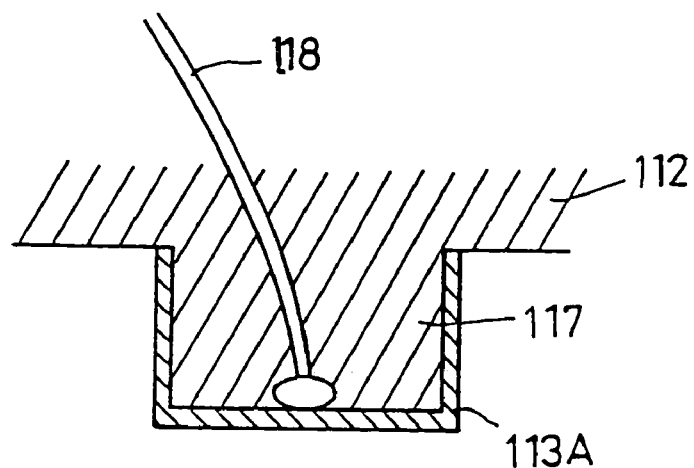
FIG. 35 is a cross-sectional view of a metallic film having a single-layer structure.

The metallic film 113 can be formed of a single metallic layer or a plurality of metallic layers stacked. FIG. 35 shows a metallic film 113A, which is formed of a single metallic layer, and FIGS. 36 through 38 respectively show metallic films 113B, 113C and 113D formed of a plurality of metallic layers.

A substance or substances of the metallic films 113 (113A–113D) should be selected taking into account the following. The inner portion of the metallic film 113 is to be bonded to the bonding wire 118, and the outer portion thereof is to be soldered to an electrode on the circuit board. Hence, it is required that the inner portion (the innermost layer) of the metallic film 113 has a good bondability and the outer portion (the outermost layer) thereof has a good ability of soldering. The above requirement (hereinafter referred to as a film requirement) can be satisfied by the following substances.

It is required that a substance of the metallic film 113A shown in FIG. 35 has both a good bondability and a good ability of soldering. Such a material is, for example, silver (Ag) or palladium (Pd).

Figure 36:
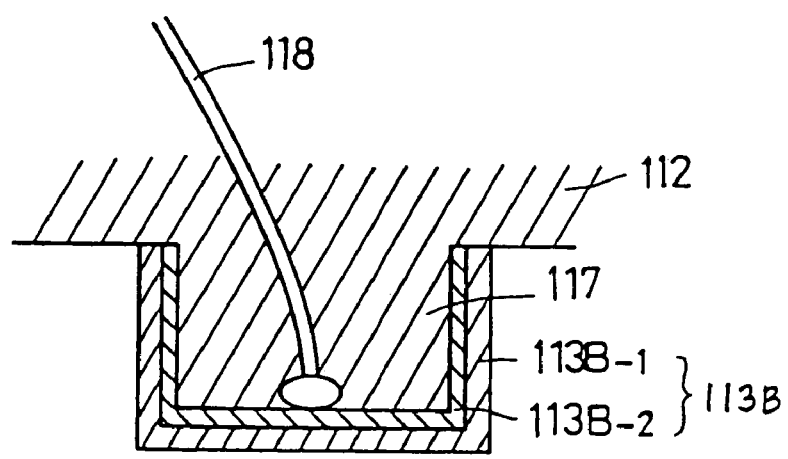
FIG. 36 is a cross-sectional view of a metallic film having a two-layer structure.

The metallic film 113B shown in FIG. 36 is made up of an outer layer 113B-1 and an inner layer 113B-2. By way of example, the outer layer 113B-1 can be made of palladium (Pd), and the inner layer 113B-2 can be made of gold (Au) so that the film requirement can be satisfied.

Figure 37:
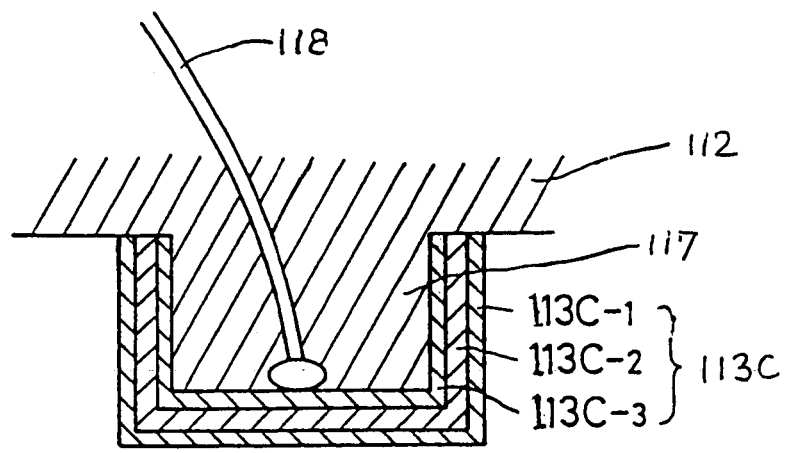
FIG. 37 is a cross-sectional view of a metallic film having a three-layer structure.

The metallic film 113C shown in FIG. 37 is made up of an outer layer 113C-1, an intermediate layer 113C-2 and an inner layer 113C-3. By way of example, the outer layer 113C-1 can be made up of gold (Au), the intermediate layer 113C-2 can be made up of nickel (Ni), and the inner layer 113C-3 can be made up of gold (Au) so that the film requirement can be satisfied.

Alternatively, the following combinations can be employed.

| 113C-1 | 113C-2 | 113C-3 |
|---|---|---|
| palladium (Pd) | nickel (Ni) | palladium (Pd) |
| gold (Au) | palladium (Pd) | gold (Au) |
| solder | nickel (Ni) | gold (Au) |
| solder | nickel (Ni) | palladium (Pd) |

The above combinations satisfy the film requirement and improve the ability of joining the outer layer 113C-1 and the inner layer 113C-3 due to the intermediate layer 113C-2.

Figure 38:
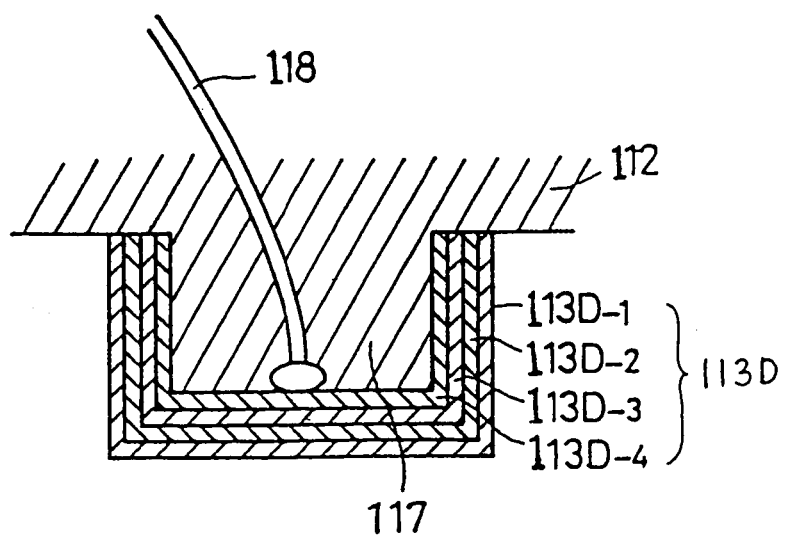
FIG. 38 is a cross-sectional view of a metallic film having a four-layer structure.

The metallic film 113D shown in FIG. 38 is made up of an outer layer 113D-1, a first intermediate layer 113D-2, a second intermediate layer 113D-3 and an inner layer 113D-4. These layers can be formed by the following substances.

| 113D-1 | 113D-2 | 113D-3 | 113D-4 |
|---|---|---|---|
| solder | nickel (Ni) | palladium (Pd) | gold (Au) |
| palladium (Pd) | nickel (Ni) | palladium (Pd) | gold (Au) |

The above combinations satisfy the film requirement and improve the ability of joining the outer layer 113D-1 and the inner layer 113D-4 due to the intermediate layers 113D-2 and 113D-3.

A description will now be given of a method of producing the semiconductor device 110 according to the tenth embodiment of the present invention. By way of example, the following description is directed to forming the semiconductor device 110 equipped with the three-layer structure metallic film 113C made up of the outer layer 113C-1, the intermediate layer 113C-2 and the inner layer 113C-3.

Figure 45:
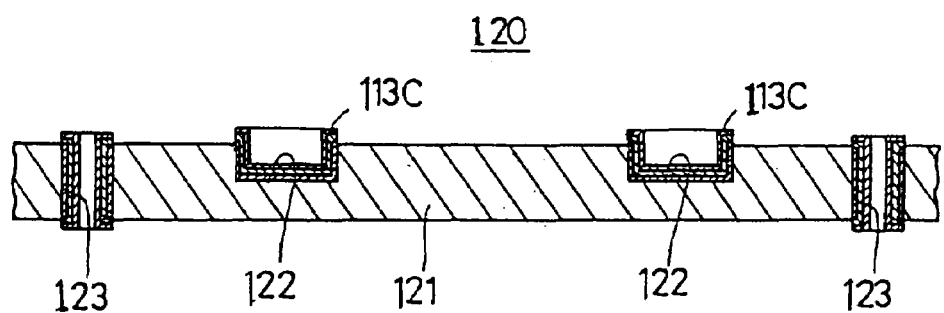
FIG. 45 is a cross-sectional view of the completed lead frame.

The semiconductor device 110 is produced by using a lead frame 120 shown in FIG. 45. The lead frame 120 has an electrically conductive metallic member 121 having a plurality of recess portions 122. The metallic films 113C are respectively provided in the recess portions 122. The recess portions 122 are positioned so that they correspond to the positions in which the resin projections 117 should be formed. The metallic films 113C are formed so as to engage the resin projections 117.

Figure 42A:
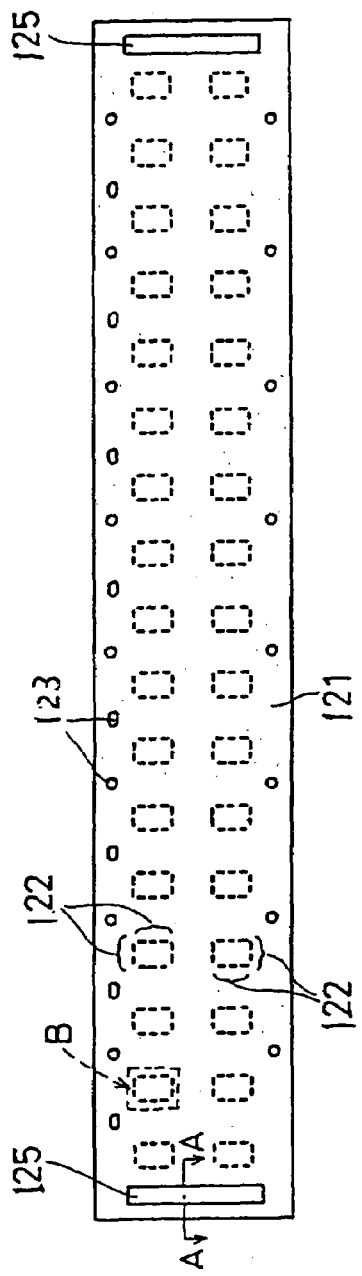
FIG. 42A is a plan view for explaining power supply portions formed in a lead frame.

As will be described later, the lead frame 120 is configured so that a plurality of semiconductor devices 110 can be produced. Hence, the metallic member 121 has the plurality of recess portions 122 and the plurality of metallic films 113C, as shown in FIG. 42A, in which a reference number 123 indicates tool engagement holes with which a tool for handling the lead frame 120 engages.

Before describing the method of producing the semiconductor device 110, a description will first be given, with reference to FIGS. 39 through 45, of a method of producing the lead frame 120.

Figure 39:
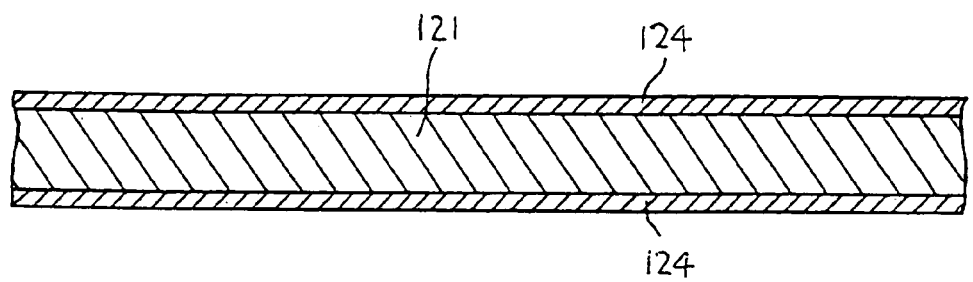
FIG. 39 is a cross-sectional view showing a resist forming step of a method of producing the semiconductor device according to the tenth embodiment of the present invention.

As shown in FIG. 39, the plate-shaped metallic member 121 made of an electrically conductive material such as copper is prepared. Etching resist films 124 are provided on the upper and lower surfaces of the metallic member 121 (resist coating step). The etching resist films 124 are made of a photosensitive resin, and are provided to a given thickness by means of a spinner. Alternatively, it is possible to use a metallic member in which the tool engagement holes 123 are formed by stamping or the like before the etching resist films 124 are provided.

Figure 40:
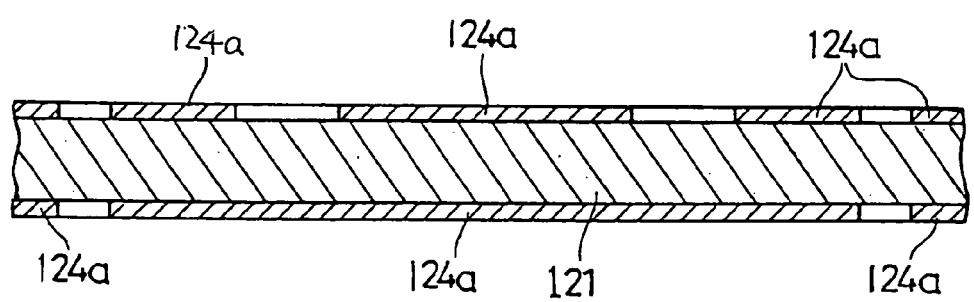
FIG. 40 is a cross-sectional view showing a resist pattern forming step of the method of producing the semiconductor device according to the tenth embodiment of the present invention.

Then, an exposure step is carried out by using masks (not shown) formed on the etching resist films 124. Subsequently, a developing step is carried out so that portions of the etching resist films 124 corresponding to the positions of the recess portions 122 and the tool engagement holes 123 are removed. Hence, resist patterns 124a are formed, as shown in FIG. 40 (resist pattern forming step). In the resist pattern forming step, portions of the etching resist films 124 in which power supply portions 125 (FIGS. 42A and 42B) should be formed are removed. The power supply portions 125 are plated in a metallic film forming step which will be described later. If the above alternative metallic member is used, there is no need to form windows therein directed to forming the tool engagement holes 123.

Subsequent to the above resist pattern forming step, the metallic member 121 on which the resist patterns 124a are formed is etched (etching step). In the etching step, portions of the metallic member 121 corresponding to the recess portions 122 and the power supply portions 125 are half-etched from the upper surface thereof. Further, portions of the metallic member 121 corresponding to the tool engagement holes 123 are etched from the upper and lower surfaces of the metallic member 121. When the metallic member 121 is made of copper, an etchant used in the etching step is, for example, ferric chloride.

Figure 41:
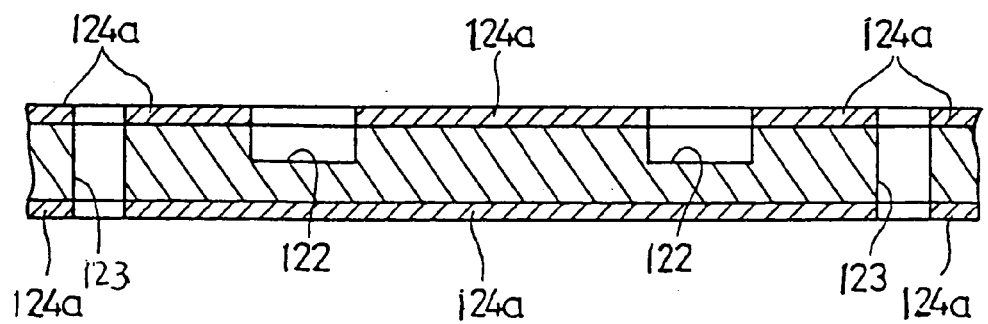
FIG. 41 is a cross-sectional view showing an etching step of the method of producing the semiconductor device according to the tenth embodiment of the present invention.
Figure 42B:
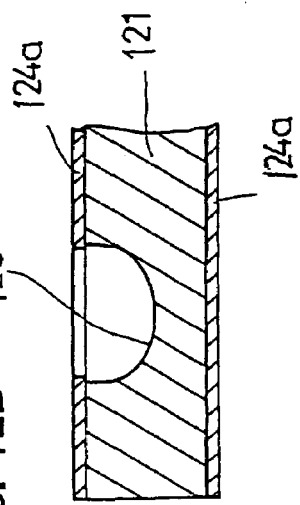
FIG. 42B is a cross-sectional view taken along a line A—A shown in FIG. 42A.

Hence, as shown in FIG. 41, the recess portions 122 and the tool engagement holes 123 are formed in given positions of the metallic member 121. As shown in FIGS. 42A and 42B, the power supply portions 125 are formed in the metallic member 121. The depth of the recess portions 122 defined by the half-etching process is made equal to 60% of the thickness of the metallic member 121.

The power supply portions 125 are located in end portions of the metallic member 121 in the longitudinal direction thereof. In the power supply portions 125, the metallic member 121 is exposed. Hence, by plating the power supply portions 125, the metallic member 121 can be set to a given potential. It will be noted that FIG. 42B is a cross-sectional view taken along a line A—A shown in FIG. 42A.

In FIG. 42A, blocks depicted by broken lines respectively denote positions in which the semiconductor devices 110 are formed. In the metallic member 121 shown in FIG. 42A, 34 semiconductor devices 110 can be derived therefrom. A plurality of recess portions 122 are formed for each of the plurality of semiconductor devices 110.

Figure 43:
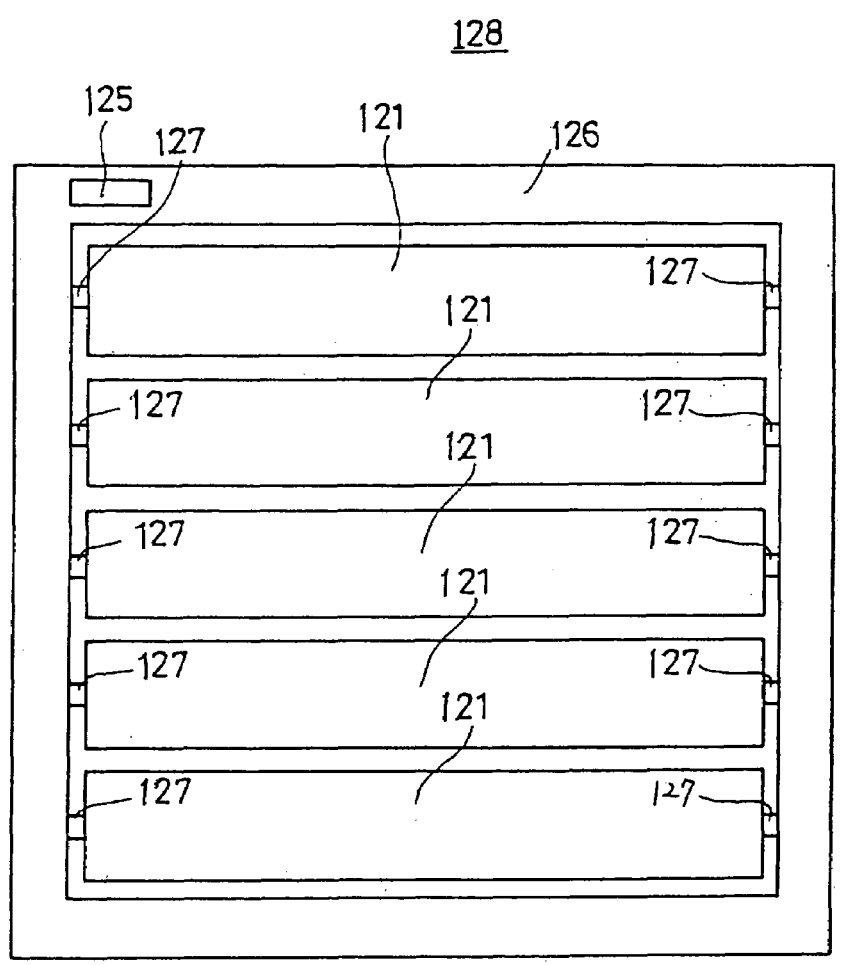
FIG. 43 is a plan view of a lead frame unit which can be used in the method of producing the semiconductor devices according to the tenth embodiment of the present invention.

In order to form more semiconductor devices 110 from a single metallic member, a lead frame unit 128 as shown in FIG. 43 can be used. The lead frame unit 128 has a frame 126, and a plurality of metallic members 121 joined to the frame 126 by means of joint portions 127 provided on two opposite sides of each of the metallic members 121 in the longitudinal direction thereof. It is necessary to form power supply portions 125 in the lead frame unit 128. The power supply portions 125 can be formed in the frame 126 so that electricity can be supplied to all the metallic members 121 via the joint portions 127.

The use of the lead frame unit 128 contributes to improving the efficiency of the method of producing the semiconductor devices 110. Further, as compared to the structure shown in FIG. 42A, a simplified resist pattern forming step and a simplified etching step can be employed.

After the etching step, the metallic film forming step which has been briefly referred to is carried out in order to form the metallic film 113C. In the tenth embodiment of the present invention, the metallic film 113C is formed by plating. For example, electrolytic plating can be employed in which the metallic member 121 is placed in a plating chamber. In this step, the aforementioned power supply portions 125 are concurrently plated.

Figure 44:
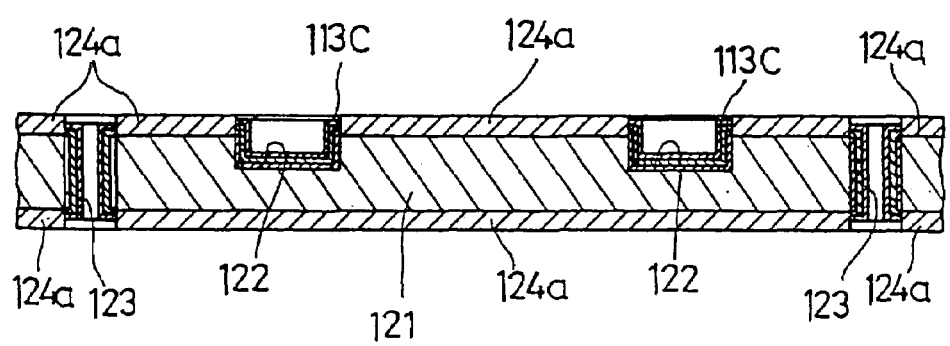
FIG. 44 is a cross-sectional view showing a metallic film forming step of the method of producing the semiconductor device according to the tenth embodiment of the present invention.

Since the metallic film 113C is made up of the outer layer 113C-1, the intermediate layer 113C-2 and the inner layer 113C-3, the plating step is carried out for each of these three layers. If the outer layer 113C-1, the intermediate layer 113C-2 and the inner layer 113C-3 are respectively formed of gold (Au), palladium (Pd) and gold (Au), the plating step commences with plating of the inner layer 113C-1 with gold. Next, the intermediate layer 113C-2 is plated with palladium (Pd), and then the outer layer 113C-3 is plated with gold (Au). The thickness of each of the layers 113C-1 through 113C-3 can be regulated by controlling the plating time. FIG. 44 shows the metallic member 121 on which the metallic films 113C are formed.

As will be described in detail later, it is necessary to separate the metallic films 113C together with the resin package 112 from the lead frame 120. Hence, it is required that the metallic films 113C have a nature which enables the metallic films 113C to be smoothly separated from the metallic member 121. With the above in mind, a material which facilitates the separating process, such as an electrically conductive paste, is provided in the recess portions 122 before the metallic films 113C are formed therein. Hence, the metallic films 113C are formed on the above material.

It should be noted that the metallic films 113C can be formed by thin-film forming processes other than the plating process, such as an evaporating process and a sputtering process.

In addition to the recess portions 122, the metallic member 121 is exposed in the tool engagement holes 123, so that a film having the same structure as that of the metallic film 113C is formed in each of the tool engagement portions 123 in the metallic film plating step. However, there is no problem because the tool engagement portions 123 are specifically directed to being engaged with the tool and used to position and handle the metallic member 121.

Then, a resist removing step is carried out in order to remove the resist patterns 124a (etching resist films 124). Hence, the lead frame 120 shown in FIG. 45 is formed. As described above, the lead frame 120 can be formed by a simple sequence including the resist coating step, the resist pattern forming step, the etching step, the metallic film forming step and the resist removing step.

A description will now be given, with reference to FIGS. 46 through 59, of a method of producing the semiconductor device 110 using the lead frame 120 produced in the above-mentioned process.

Figure 46:
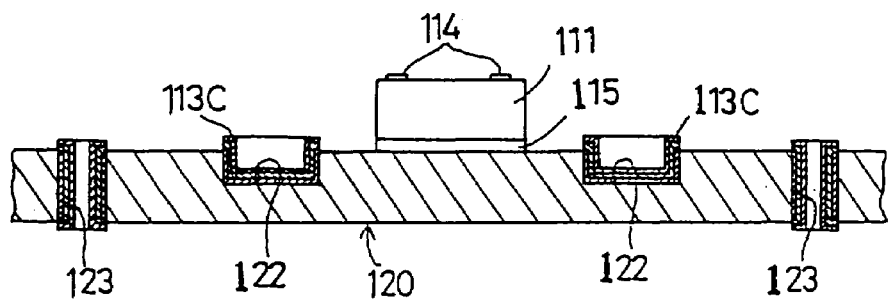
FIG. 46 is a cross-sectional view showing a chip mounting step of the method of producing the semiconductor device according to the tenth embodiment of the present invention.

As shown in FIG. 46, a chip fixing resin 115 is provided on a portion of the lead frame 120 on which the chip 111 should be placed. Then, the chip 111 is mounted on the chip fixing resin 115 (chip mounting step). The chip fixing resin 115 has insulation, and functions as an adhesive. Thus, the chip 111 is fixed to the lead frame 120 by adhesive force of the chip fixing resin 115.

Figure 47:
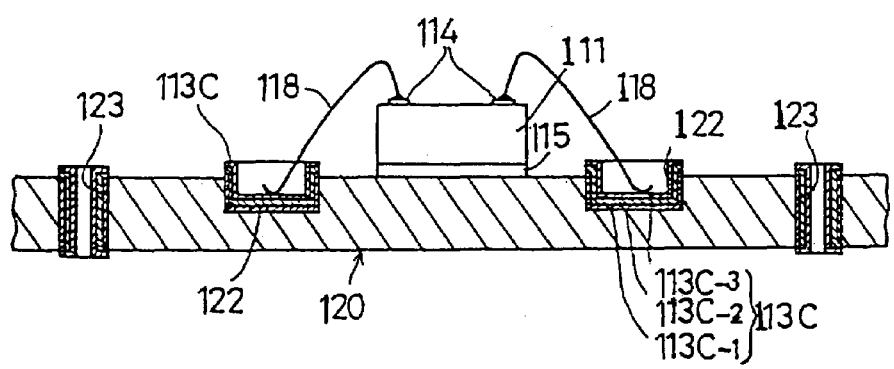
FIG. 47 is a cross-sectional view showing a connecting step of the method of producing the semiconductor device according to the tenth embodiment of the present invention.

After the chip mounting step, the lead frame 120 is loaded to a wire bonding apparatus. As shown in FIG. 47, the bonding wires 118 are provided between the electrode pads 114 provided on the chip 111 and the metallic films 113C (more particularly, the inner layer 113C-3). Hence, the chip 111 and the metallic films 113C are electrically connected together. In the wire bonding step, the ends of the bonding wires 118 are bonded to the electrode pads 114 first (first bonding step), and the other ends thereof are bonded to the metallic films 113C.

Figure 48:
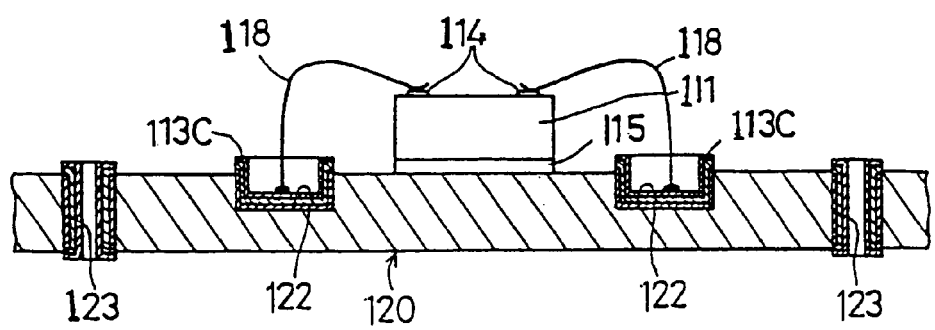
FIG. 48 is a cross-sectional view showing a variation of the connecting step shown in FIG. 47.

Alternatively, as shown in FIG. 48, the ends of the wires 118 are bonded to the metallic films 113C first, and the other ends thereof are bonded to the electrode pads 114 second. This alternative makes it possible to reduce the height of the bonding wires 118. This leads to a reduction in the thickness of the semiconductor device 110.

Further, the aforementioned bonding balls 101 as shown in FIG. 32 can be employed. In this case, the bonding wires 118 are bonded to the bonding balls 101.

The electrode pads 114 are arranged at a pitch less than that at which the metallic films 113C are arranged. Further, the area in which the first bonding is carried out is greater than the area in which the second bonding is carried out. Hence, it is possible to arrange the bonding wires 118 at a high density by performing the first bonding to the metallic films 113C first and the second bonding to the electrode pads 114 second.

After the bonding step, a sealing step is carried out so that a resin 129 is formed on the lead frame 120 so as to seal the chip 111 and thus form the resin package 112. In the following description, the resin package 112 is formed by molding. Alternatively, a potting process can be employed.

Figure 49:
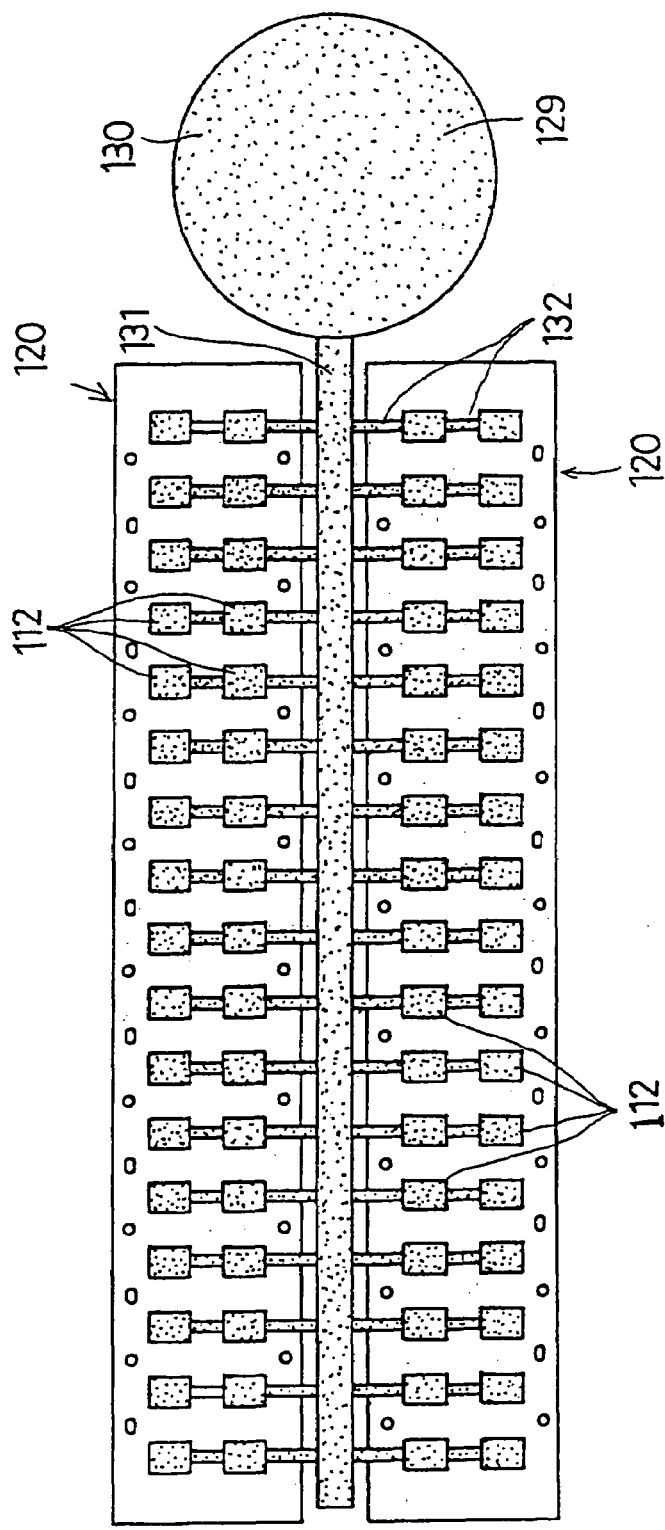
FIG. 49 is a plan view of a sealing step of the method of the semiconductor device according to the tenth embodiment of the present invention.

FIG. 49 schematically shows the state observed immediately after the lead frame 120 is loaded to a die and the resin 129 is molded. In FIG. 49, a reference number 130 indicates a curl, a reference number 131 indicates a runner, and a reference number 132 indicates a gate. As shown in FIG. 49, a plurality of resin packages 112 are formed on the lead frame 120. In the state immediately after the sealing step, the resin packages 112 are joined via portions of the resin 129 located on the gates 132. Hereinafter, such resin portions are referred to as on-gate resin portions.

Figure 50:
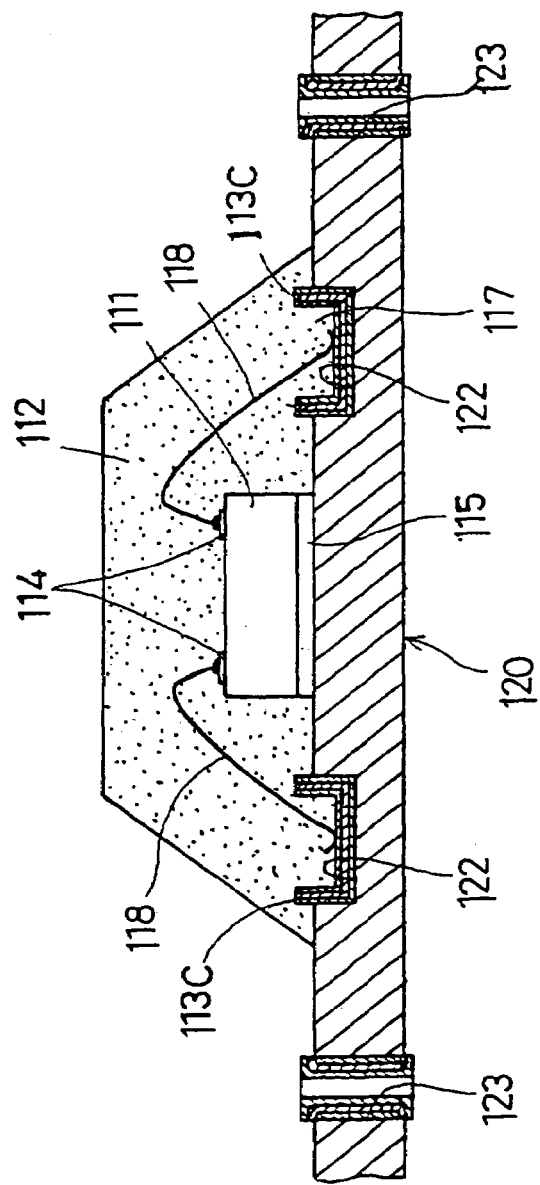
FIG. 50 is a cross-sectional view of the lead frame observed when the sealing step is completed.

FIG. 50 is an enlarged cross-sectional view of one of the resin packages 112 corresponding to one semiconductor device 110. As shown in FIG. 50, the resin 129 is formed in a given shape by a cavity (not shown) of a die (upper die), while the lead frame 120 functions as a lower die. The resin 129 is filled in the recess portions 122 (more particularly, recesses respectively defined by the metallic films 113C), so that the aforementioned resin projections 117, which are counterparts of the recess portions 122, are formed. In this state, the resin package 112 is impregnated to the lead frame 120.

After the resin packages 112 are formed, the on-gate resin, resin remaining in the runner 131 and the curl 130 are removed. Hence, as shown in FIGS. 51A and 51B, the resin packages 112 are separated from each other on the lead frame 120. As described above, the resin packages 112 are impregnated to the lead frame 120 and thus are not detached from the lead frame 120 even if the resin packages 112 are separated from each other.

Figure 52A:
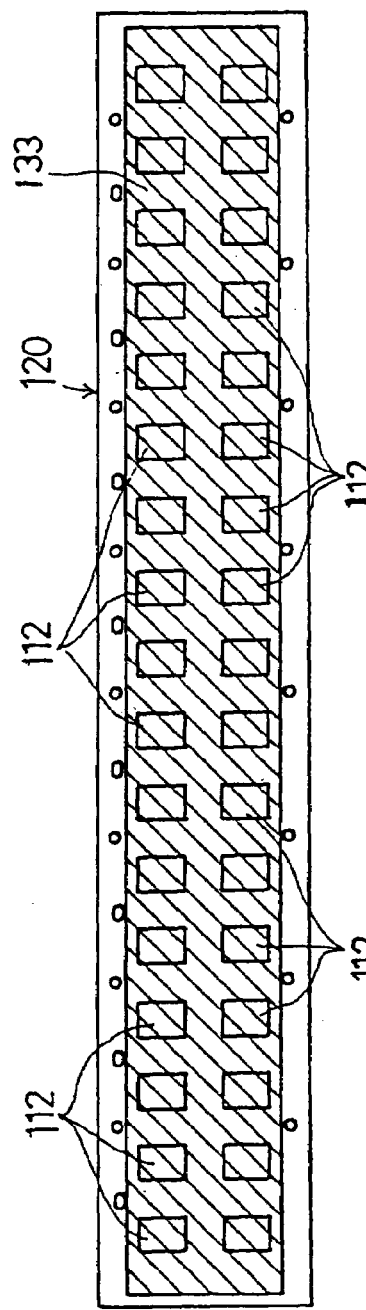
FIG. 52A is a plan view showing a tape arranging step of the method of the semiconductor device according to the tenth embodiment of the present invention.
Figure 52B:
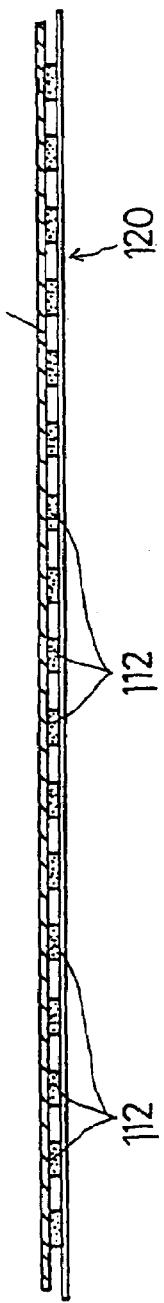
FIG. 52B is a side view of the tape arranging step of the method of the semiconductor device according to the tenth embodiment of the present invention.

Subsequent to the sealing step, a tape arranging step is carried out. In this step, as shown in FIGS. 52A and 52B, a tape member 133 is arranged on the tops of the resin packages 112. The tape member 133 has a surface coated with an adhesive, and a base tape which cannot be damaged by an etchant used in a separating step which will be carried out later. The tape member 133 joins the resin packages 112 together, so that the resin packages 112 are supported by the tape member 133 even when the resin packages 112 are separated from the lead frame 120.

The tape member 133 can be arranged at an appropriate time before the resin packages 112 are formed. For example, the tape member 133 can be arranged within the die prior to the sealing step. In this case, when the resin packages 112 are formed, the resin packages 112 are joined together by the tape member 133.

Following the tape arranging step, a separating step is carried out in order to separate the resin packages 112 from the lead frame 120. FIG. 53 shows the separating step, in which the lead frame 120 is placed in the etchant and is thus dissolved. It is required that the etchant used in the separating step can dissolve the lead frame 120 only and does not dissolve the metallic films 113C. When the lead frame 120 is completely dissolved, the resin packages 112 are separated from the lead frame 120. The above separating step makes it possible to certainly and easily separate the resin packages 112 from the lead frame 120.

FIGS. 54A and 54B show the semiconductor devices 110 when the separating step is completed. At this time, the semiconductor devices 110 are supported by the tape member 133. Hence, it is easy to handle the chips 110 after the separation step. When the tape member 133 is wound and shipped, it is possible to automatically mount the semiconductor devices 110 to a circuit board, as in the case of chips or electronic components.

The above-mentioned production method does not need a lead cutting step and lead shaping step (into a gull wing) necessary for the conventional production process, and is therefore simple.

A description will now be given of variations of the above-mentioned method of producing the semiconductor device 110.

Figure 55A:
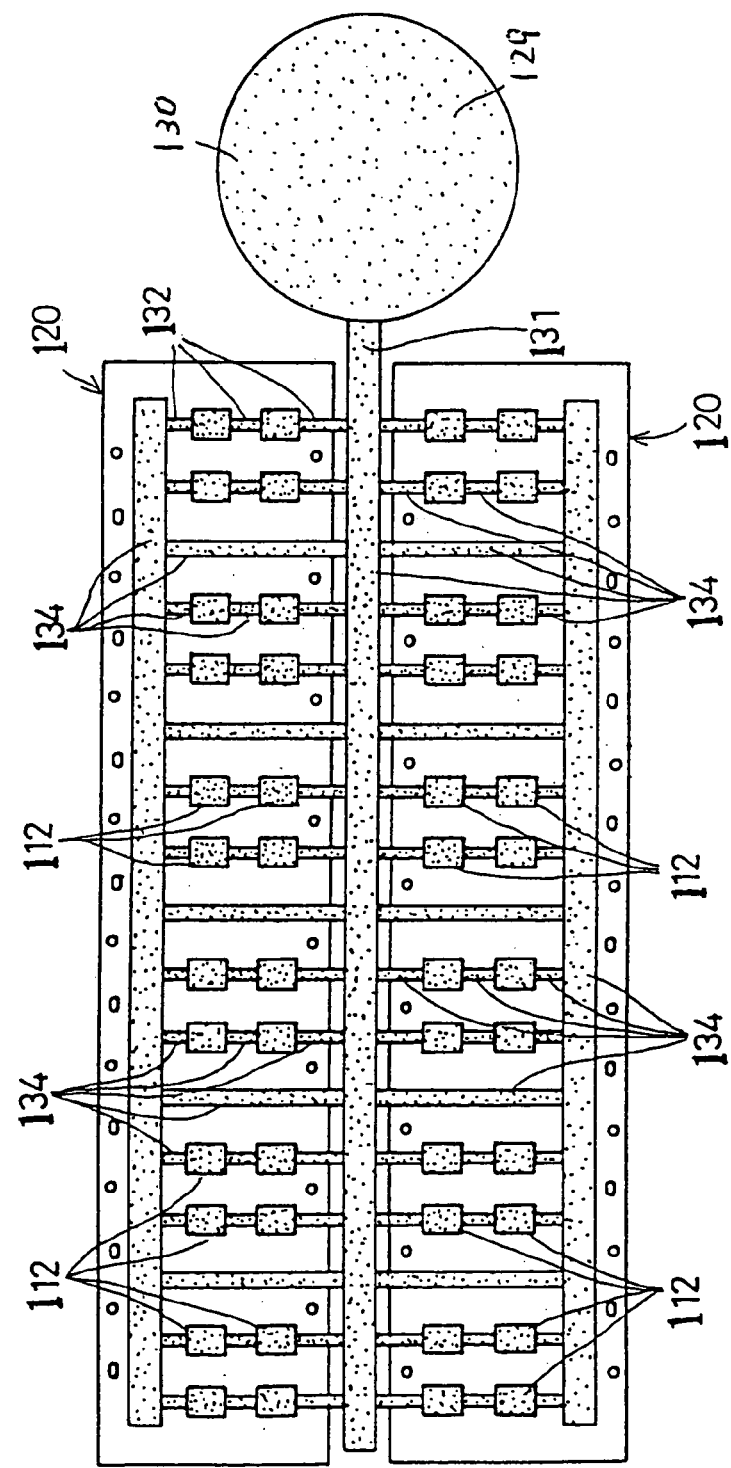
FIG. 55A is a plan view showing a first variation of the sealing step of the method of producing the semiconductor device according to the tenth embodiment of the present invention.

FIG. 55A shows a first variation of the sealing step. In the above-mentioned method, the resin packages 112 are joined by the on-gate resin portions as has been described with reference to FIG. 49. The on-gate resin portions are removed as shown in FIGS. 51A and 51B, and the tape member 133 is arranged as shown in FIGS. 52A and 52B. As has been described, the tape member 133 is used to maintain the separated resin packages 112 in the respective original positions.

Figure 56:
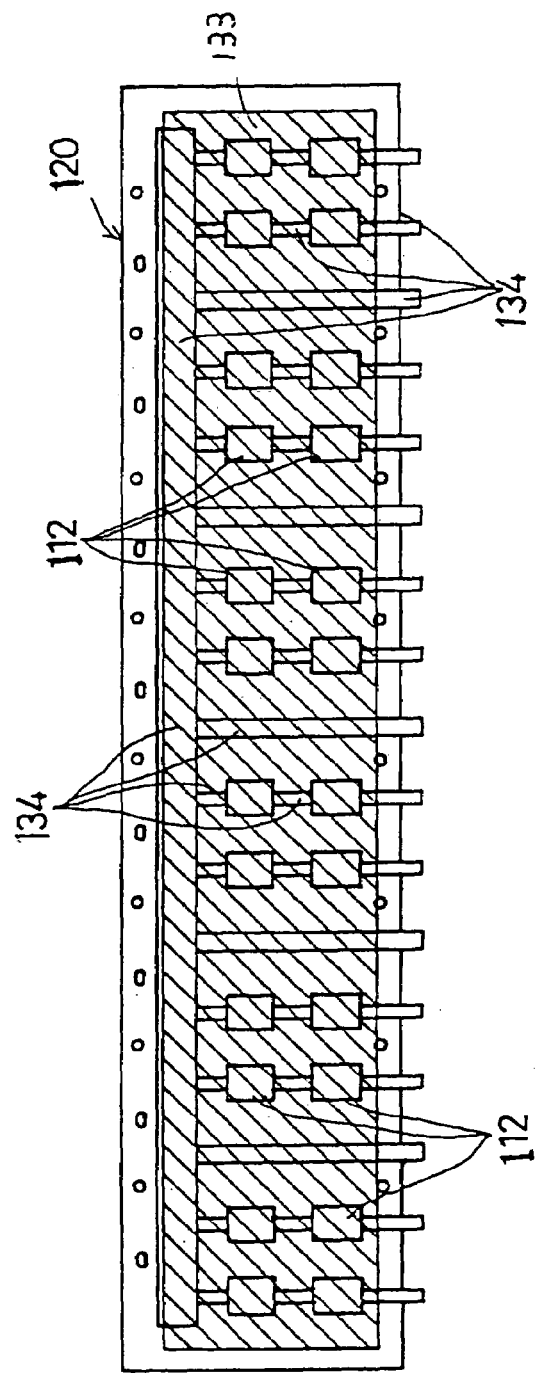
FIG. 56 is a plan view observed when the tape arranging step for the lead frame shown in FIG. 55A is completed.
Figure 57:
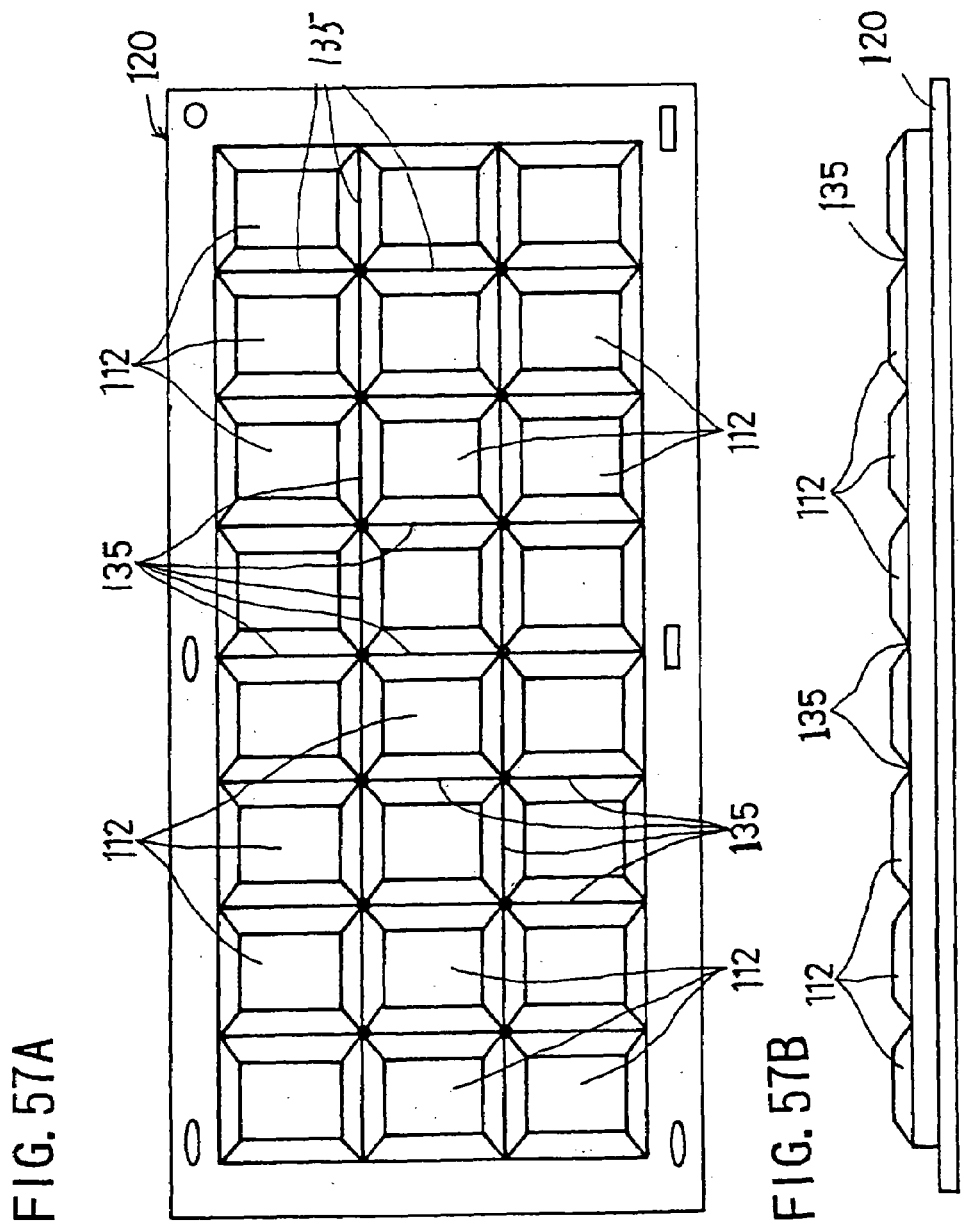
FIG. 57A is a plan view showing a fourth variation of the sealing step of the method of producing the semiconductor device according to the tenth embodiment of the present invention.
FIG. 57B is a side view showing the fourth variation of the sealing step of the method of producing the semiconductor device according to the tenth embodiment of the present invention.

In the first variation, the on-gate resin portions and the resin 129 remaining in the runner 131 are used, instead of the tape member 133, as resin joint members joining the resin packages 112 together. Hereinafter, such resin joint members are referred to as a runner frame 134. Hence, it is possible to efficiently utilize the on-gate resin portions and the resin 129 remaining in the runner 131. The runner frame 134 should be removed when shipping the semiconductor devices 110. In this case, before shipping, the tape member 133 is provided as shown in FIG. 56, and the runner frame 134 is removed (resin joint member removing step).

It is possible to prevent the tape member 133 from being damaged in the separating step and a step of testing the semiconductor devices 110 by providing the tape member 133 before shipping. This is advantageous when the semiconductor devices 110 are shipped in the state in which the devices 110 are shipped.

FIG. 55B shows a variation of the sealing step shown in FIG. 55A, in which the runner frames 134 extend laterally and longitudinally.

Figure 55C:
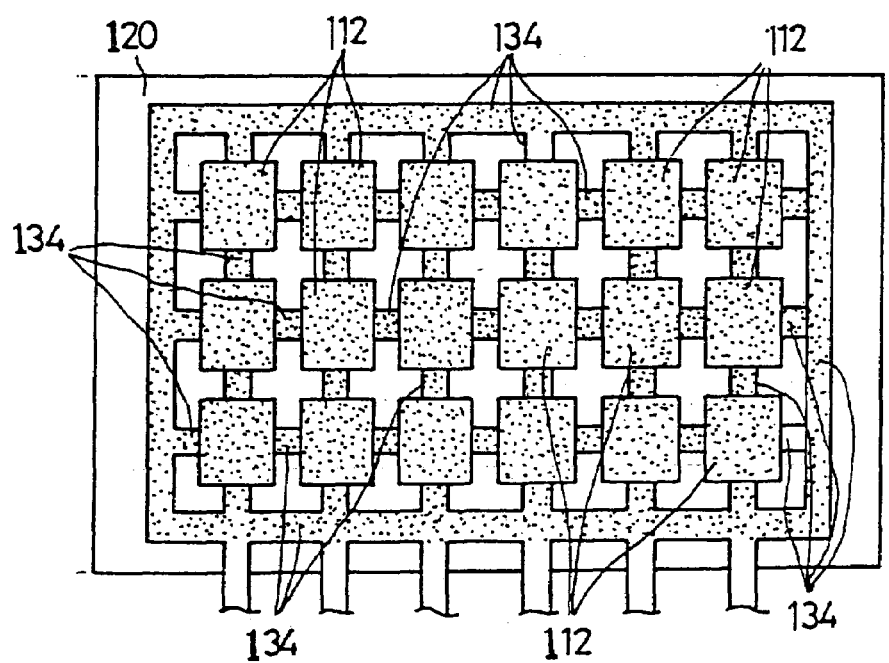
FIG. 55C is a plan view showing a third variation of the sealing step of the method of producing the semiconductor device according to the tenth embodiment of the present invention.

FIG. 55C shows another variation of the sealing step shown in FIG. 55A, in which the resin frames 112 are laterally and longitudinally supported by the runner frames 134. The resin to be removed can be efficiently utilized as the on-gate resin portions and the runner frames.

Figure 58:
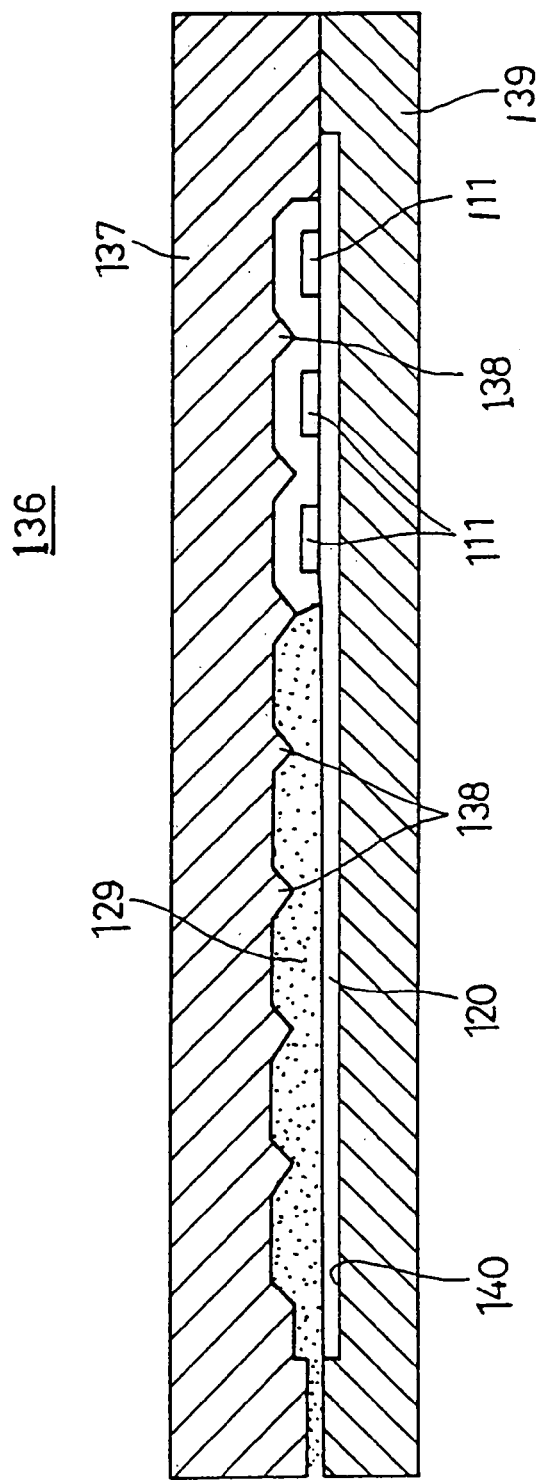
FIG. 58 is a cross-sectional view of the lead frame observed when the fourth variation shown in FIGS. 57A and 57B is completed.

FIGS. 57A, 57B and 58 show a fourth variation of the sealing step. In the aforementioned tenth embodiment of the present invention, the resin packages 112 are separated from each other when the sealing step is completed. In the fourth variation, the resin packages 112 are joined together when the sealing step is completed.

FIGS. 57A and 57B show the lead frame 120 when the sealing step is completed in the fourth variation. As shown in these figures, the resin packages 112 are joined like a plate-shaped chocolate. There are grooves 135 at the boundaries of the adjacent resin packages 112. Hence, it is possible to keep the original positions of the resin packages 112 without the tape member 133. The resin packages 112 can be separated from each other in the grooves 135, which facilitate the separating step.

FIG. 58 shows a die 136 used to form the resin packages 112 shown in FIGS. 57A and 57B. As shown in FIG. 58, an upper die of the die 136 has a cavity in which projections 138 corresponding to the grooves 135 are formed. A lower die 139 of the die 136 has a recess portion 140 in which the lead frame 120 is placed. The resin packages 112 joined together as shown in FIGS. 57A and 57B can be formed by using the die 136 having a simple structure.

Figure 59:
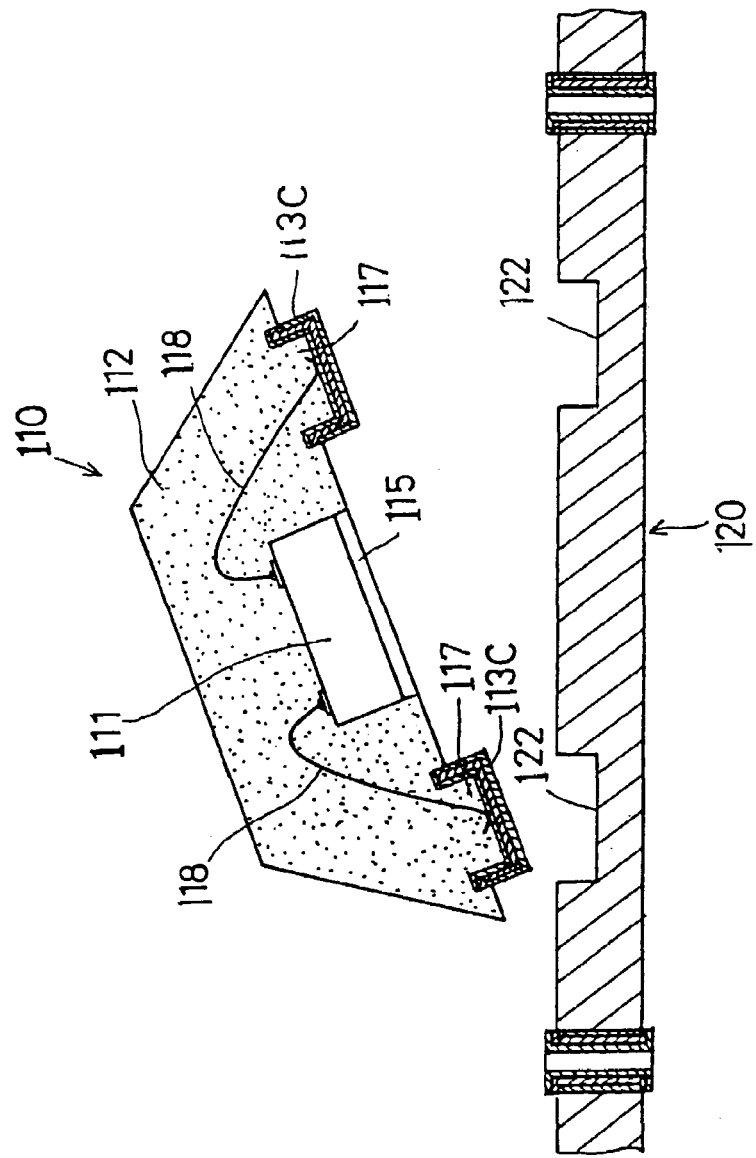
FIG. 59 is a cross-sectional view of another separation step of the method of producing the semiconductor device according to the tenth embodiment of the present invention.

FIG. 59 shows a variation of the separating step. The above-mentioned separating step employs etching. Instead, the variation is intended to mechanically separate the resin packages 112 from the lead frame 120 rather than dissolving the lead frame 20. The variation does not need any etchant and a smaller amount of time is necessary for the separation step. On the other hand, it should be considered whether the mechanical separating process certainly allows the metallic films 113C to move to the resin projections 117. The above possibility will be eliminated by providing a member which facilitates the mechanical separating process in the recess portions 122 beforehand.

[Eleventh Embodiment]

A description will now be given of a semiconductor device according to an eleventh embodiment of the present invention.

Figure 60:
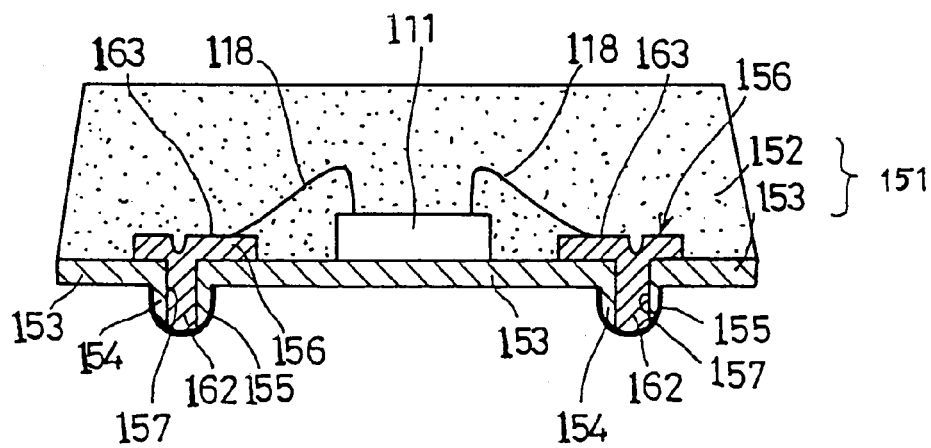
FIG. 60 is a cross-sectional view of a semiconductor device according to an eleventh embodiment of the present invention.

FIG. 60 shows a semiconductor device 150 according to the eleventh embodiment of the present invention. In this figure, parts that are the same as those shown in the previously described figures relating to the semiconductor device 110 are given the same reference numbers.

The semiconductor device 150 has a feature in which it has a resin package 151 having a two-layer structure made up of a upper resin layer 152 and a lower resin layer 153. A plurality of resin projections 154 are formed in given positions of the lower resin layer 153. Metallic films 155 each having a single-layer structure made of, for example, palladium (Pd) respectively cover the resin projections 154.

Connection electrodes 156 are provided to the lower resin layer 153, and have lower extending portions 162 extending through through holes 157 formed in the lower resin layer 153. The ends of the lower extending portions 162 are electrically connected to the corresponding metallic films 155. The connection electrodes 156 respectively have upper bonding portions 163.located on the lower resin layer 153. The bonding wires 118 are bonded to the upper bonding portions 163.

The upper resin layer 152 and the lower resin layer 153 can be made of an identical substance or different substances. For example, the lower resin layer 153 on which the chip 111 is mounted is made of a resin having a good heat resistance and a good mechanical strength. The upper resin layer 152 is made of a resin having a good heat radiating nature. Hence, the characteristic of the chip 111 can be improved.

It is possible to employ a resin package consisting of three resin layers or more.

A description will now be given, with reference to FIGS. 61 through 70, of a method of producing the semiconductor device 150 according to the eleventh embodiment of the present invention. The method of producing the semiconductor device 150 has a step of forming the metallic films 155 and the connection electrodes 156 which is not used in the method of producing the semiconductor device 110. The steps of producing the other portions of the semiconductor device 150 can be the same as corresponding ones of the step of producing the semiconductor device 110. Hence, the following description will be focused on the step of producing the metallic films 155 and the connection electrodes 156.

Figure 61:
FIG. 61 is a cross-sectional view showing a metallic base forming step of a method of producing the semiconductor device according to the eleventh embodiment of the present invention.
Figure 62:
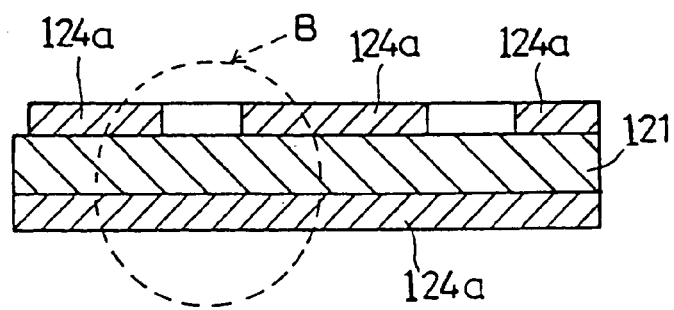
FIG. 62 is a cross-sectional view showing a resist forming step of the method of producing the semiconductor device according to the eleventh embodiment of the present invention.

As shown in FIG. 61, the plate-shaped metallic member 121 made of copper (Cu) or the like is prepared. An etching resist film made of a photosensitive resin is provided on the upper and lower surfaces of the metallic member 121 (resist coating step). Then, an exposure process is carried out using masks provided to the etching resist films. Thereafter, a developing process is carried out in order to remove portions of the etching resist films corresponding to the recess portions. Hence, the resist patterns 124a shown in FIG. 62 can be obtained (resist pattern forming step).

Figure 63:
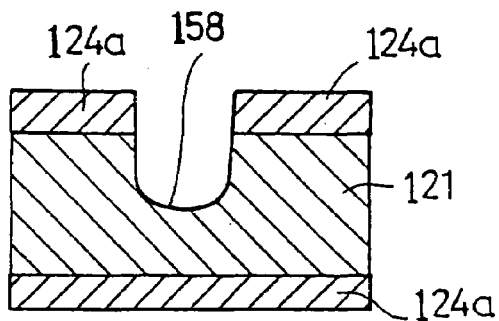
FIG. 63 is a cross-sectional view showing a half-etching step of the method of producing the semiconductor device according to the eleventh embodiment of the present invention.

After the resist pattern forming step, the metallic member 121 on which the resist patterns 124a are formed is etched (etching step). In the etching step, the metallic member 121 is half-etched from only the upper surface thereof. Hence, as shown in FIG. 63, which is an enlarged view of a part B shown in FIG. 62, a recess portion 158 is formed in the recess forming portion defined by the upper resist pattern 124a.

Figure 64:
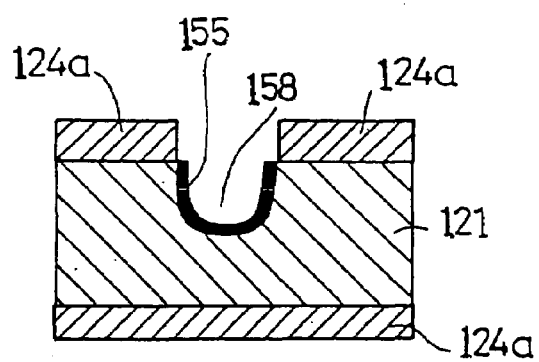
FIG. 64 is a cross-sectional view showing a plating step of the method of producing the semiconductor device according to the eleventh embodiment of the present invention.

The etching step is followed by a metallic film forming step in which the metallic films 155 are formed by plating. The metallic member 121 is placed in the plating chamber and electrolytic plating is carried out. Each of the metallic films 155 used in the embodiment of the present invention being considered has a palladium (Pd) single-layer structure. Hence, the metallic films 155 can be formed by performing the plating step once. FIG. 64 shows the metallic member 121 with the metallic film 155 plated in the recess portion 158.

It should be noted that the metallic films 155 can be formed by thin-film forming processes other than the plating process, such as an evaporating process and a sputtering process.

Figure 65:
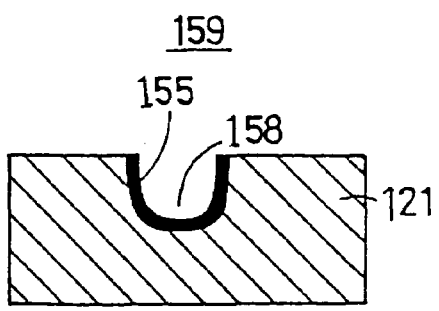
FIG. 65 is a cross-sectional view showing a resist removing step of the method of producing the semiconductor device according to the eleventh embodiment of the present invention.

After the metallic films 155 are formed, a resist removing step is carried out in which the resist pattern films 124a are removed. Hence, the lead frame 159 shown in FIG. 65 is formed.

Figure 66:
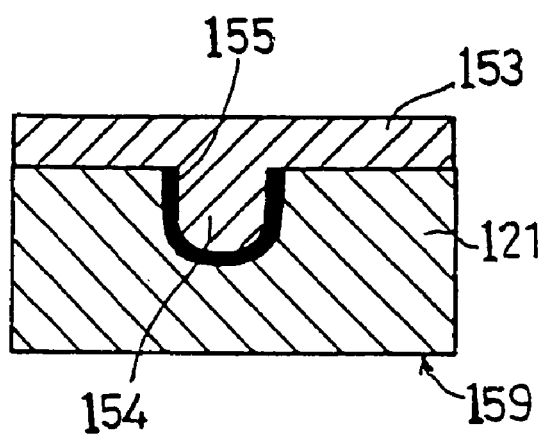
FIG. 66 is a cross-sectional view showing a photosensitive resin coating step of the method of producing the semiconductor device according to the eleventh embodiment of the present invention.

Then, the semiconductor devices 150 are produced by using the lead frame 159 thus formed. First, the lower resin layer 153 is formed on the surface on which the plated recess portions 155 are formed. As shown in FIG. 66, a portion of the lower resin layer 153 in the recess portion 155 forms the resin projection 154.

Figure 67:
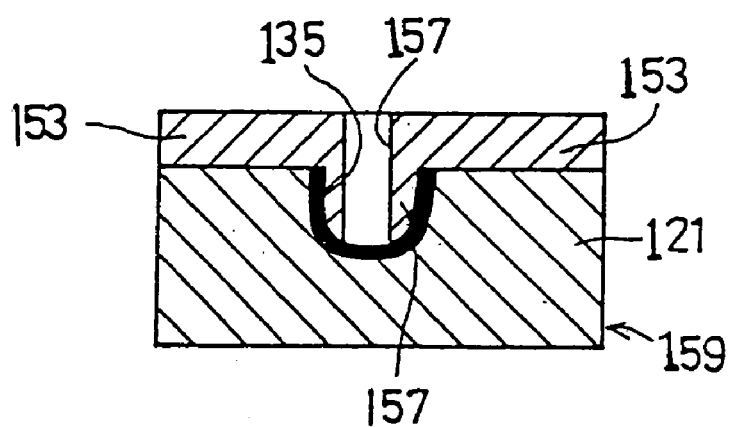
FIG. 67 is a cross-sectional view showing a through hole forming step of the method of producing the semiconductor device according to the eleventh embodiment of the present invention.

Thereafter, as shown in FIG. 67, the through hole 157 is formed in the resin projection 154 of the lower resin layer 153. Hence, the metallic film 155 is exposed through the through hole 157.

Figure 68:
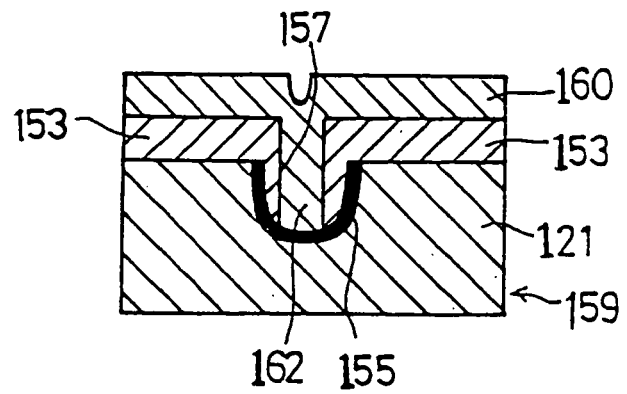
FIG. 68 is a cross-sectional view showing a plating step of the method of producing the semiconductor device according to the eleventh embodiment of the present invention.
Figure 69:
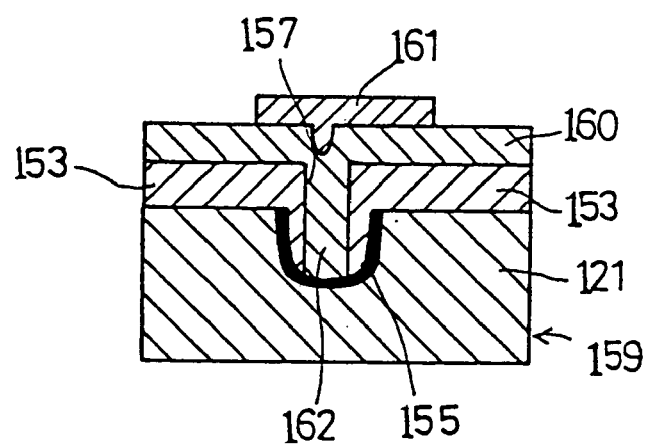
FIG. 69 is a cross-sectional view showing a resist forming step of the method of producing the semiconductor device according to the eleventh embodiment of the present invention.

Then, an electrically conductive metallic film 160 is formed to a given thickness on the entire surface of the lower resin layer 153, as shown in FIG. 68. The aforementioned connection electrodes 156 are derived from the metallic film 160. The metallic film 160 is formed by non-electrolytic plating, evaporating or sputtering. During the process of forming the metallic film 160, the metallic film 160 is filled in the through hole 157, so that the lower extending portion 162 is formed, as shown in FIG. 69. Hence, the metallic film 160 and the metallic film 155 are electrically connected together.

Subsequently, an etching resist film is coated on the metallic film 160 and exposing and developing steps are carried out. Then, as shown in FIG. 69, a resist pattern 161 is formed in the position in which the connection electrode 156 should be formed. Then, the metallic film 160 is etched so that the resist pattern 161 functions as a mask. Hence, the metallic film 160 is removed except for the portions in which the connection electrodes 156 should be formed.

Figure 70:
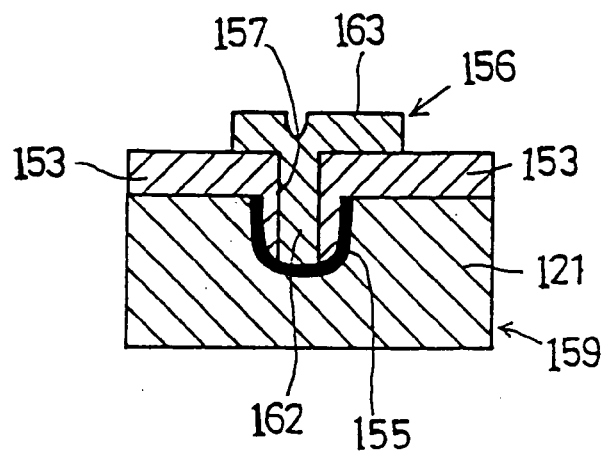
FIG. 70 is a cross-sectional view showing etching and resist removing steps of the method of producing the semiconductor device according to the eleventh embodiment of the present invention.

As shown in FIG. 70, the connection electrode 156 is formed which has a structure in which the lower extending portion 162 is connected to the metallic film 155, and the upper bonding portion 163 to which the wire 118 is to be bonded extends over the lower resin layer 153.

The remaining production steps following the step of forming the connection electrodes 156 are the same as corresponding ones which have been described with reference to FIGS. 46 through. 54B,.and a description thereof will be omitted.

[Twelfth Embodiment]

A description will now be given of a semiconductor device according to a twelfth embodiment of the present invention.

Figure 71:
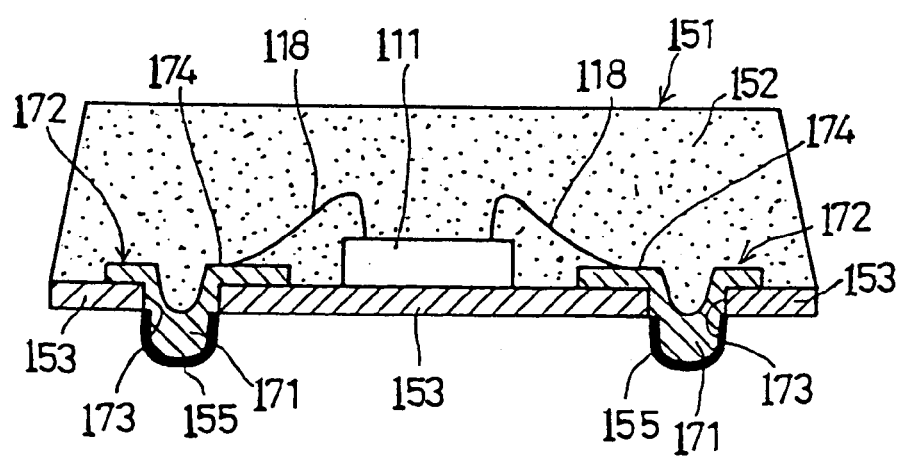
FIG. 71 is a cross-sectional view of a semiconductor device according to a twelfth embodiment of the present invention.

FIG. 71 shows a semiconductor device 170 according to the twelfth embodiment of the present invention. In FIG. 71, parts that are the same as those of the semiconductor device 150 are given the same reference numbers.

The semiconductor device 170 has the resin package 151 of the two-layer structure including the upper resin layer 152 and the lower resin layer 153, and has metallic projections 171 integrally formed in connection electrodes 172. The metallic projections 171 are substituted for the resin projections 154. The single-layer metallic film 155 made of, for example, palladium (Pd) is provided to each of the metallic projections 171.

The connection electrodes 172 are provided to the lower resin layer 153. The metallic projections 171 are electrically connected to the corresponding metallic films 155 through windows (through holes) 173 formed in the lower resin layer 153. The bonding wires 118 are bonded to bonding portions 174 which are upper portions of the connection electrodes 172 and extend on the upper surface of the lower resin layer 153.

The semiconductor device 170 has the two-layer-structure resin package 151 as in the case of the semiconductor device 150, so that the characteristics of the semiconductor device 170 can be improved. Further, it is possible to decrease the impedance between the metallic projection 171 and the metallic film 155 because the metallic film 155 is directly connected to the metallic projection 171. Hence, the electrical characteristics of the semiconductor device 170 can further be improved. It should be noted that the resin package 151 is not limited to the two-layer structure and may have a structure consisting of three layers or more.

A description will now be given, with reference to FIGS. 72 through 81, of a method of producing the semiconductor device 170. This method has particular features in the steps of forming the metallic films 155 and the connection electrodes 172, and has the other steps almost the same as those of the method of producing the semiconductor device 150. Hence, the following description is specifically directed to the steps of forming the metallic films 155 and the connection electrodes 172.

Figure 72:
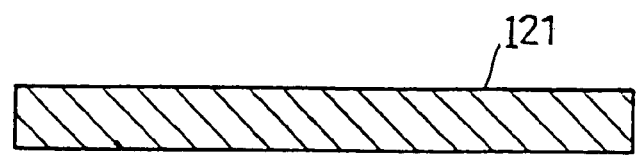
FIG. 72 is a cross-sectional view showing a metallic base forming step of a method of producing the semiconductor device according to the twelfth embodiment of the present invention.
Figure 73:
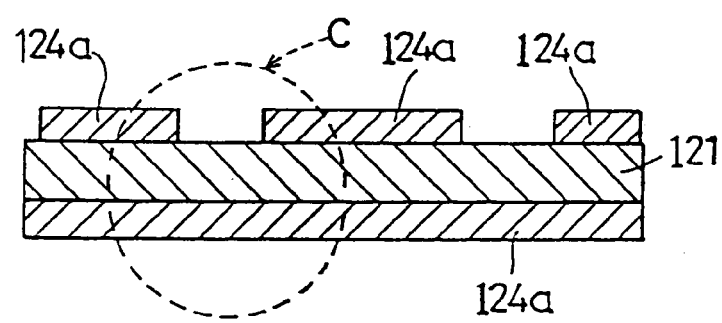
FIG. 73 is a cross-sectional view showing a resist forming step of the method of producing the semiconductor device according to the twelfth embodiment of the present invention.

As shown in FIG. 72, the plate-shaped metallic member 121 made of copper (Cu) or the like is prepared. Next, etching resist films made of photosensitive resin are provided to two opposite surfaces of the metallic member 121. Then, the etching resist films are subjected to the exposing and developing processes, so that the resist patterns 124a having windows located in the positions in which the recess portions 158 should be formed can be formed, as shown in FIG. 73.

Figure 74:
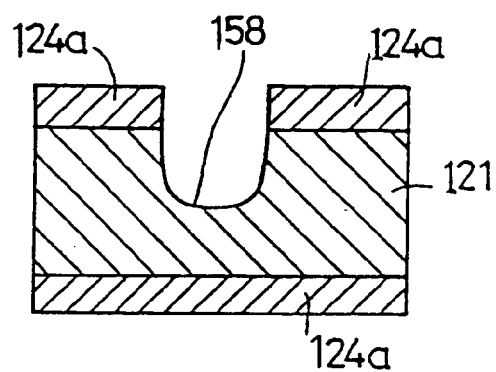
FIG. 74 is a cross-sectional view showing a half-etching step of the method of producing the semiconductor device according to the twelfth embodiment of the present invention.

The metallic member 121 on which the resist patterns 124a are formed is etched (etching step). In this etching step, the metallic member 121 is half-etched from only the upper surface thereof. Hence, the recess portions 158 are formed in the metallic member 121, as shown in FIG. 74, which is an enlarged cross-sectional view of a part C shown in FIG. 73.

Figure 75:
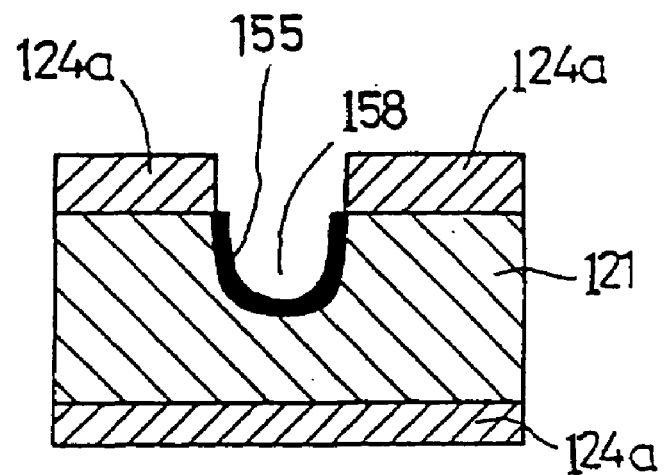
FIG. 75 is a cross-sectional view showing a half-etching step of the method of producing the semiconductor device according to the twelfth embodiment of the present invention.
Figure 76:
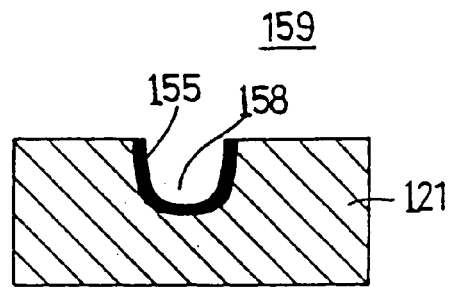
FIG. 76 is a cross-sectional view showing a resist removing step of the method of producing the semiconductor device according to the twelfth embodiment of the present invention.

After the etching step is completed, a metallic film forming step is executed so that the metallic film 155 is formed in the recess portion 158 by plating, as shown in FIG. 75. Besides the plating process, an evaporating or sputtering process can be employed. Then, the resist patterns 124a are removed by the resist removing step, so that a lead frame 159 shown in FIG. 76 can be formed.

Figure 77:
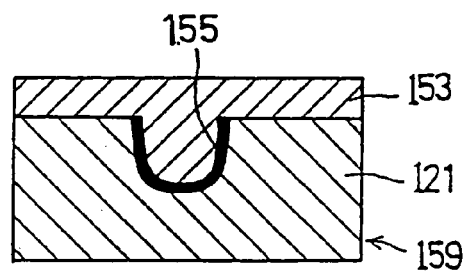
FIG. 77 is a cross-sectional view showing a photosensitive resin coating step of the method of producing the semiconductor device according to the twelfth embodiment of the present invention.
Figure 78:
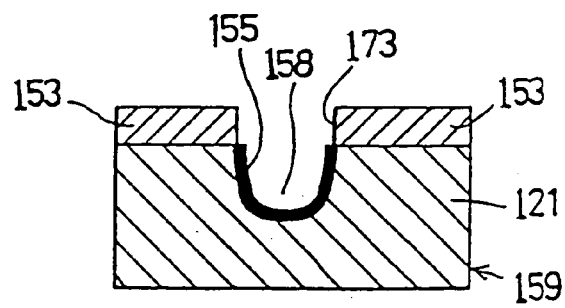
FIG. 78 is a cross-sectional view showing a window forming step of the method of producing the semiconductor device according to the twelfth embodiment of the present invention.

Then, the semiconductor devices 170 are derived from the lead frame 159. As shown in FIG. 77, the lower resin layer 153 is provided to the surface of the metallic member 121 on which the recess portions 158 are formed. Thereafter, as shown in FIG. 78, the portion of the lower resin layer 153 corresponding to the recess portion 158 is removed, so that a window or through hole 173 is formed therein. The metallic member 121 is exposed through the window 173.

Figure 79:
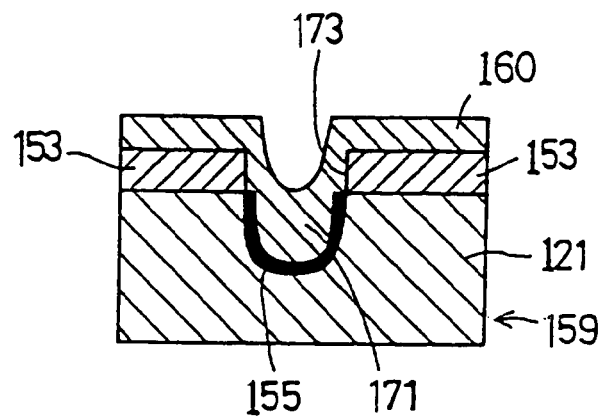
FIG. 79 is a cross-sectional view showing a plating step of the method of producing the semiconductor device according to the twelfth embodiment of the present invention.
Figure 80:
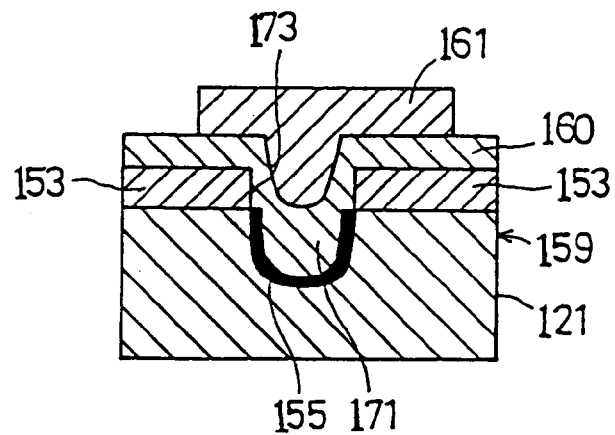
FIG. 80 is a cross-sectional view showing a resist forming step of the method of producing the semiconductor device according to the twelfth embodiment of the present invention.

Thereafter, the electrically conductive metallic film 160 is formed to a given thickness on the entire surface of the lower resin layer 153. The metallic film 160 can be formed by non-electrolytic plating, evaporating or sputtering. During the process of forming the metallic film 160, the metallic film 160 is filled in the through hole 158, so that the metallic projection 171 is formed, as shown in FIG. 79. Hence, the metallic film 160 and the metallic film 155 are electrically connected together.

The area of the window 173 is greater than the diameter of the through hole 157, so that a greater contact area between the metallic projection 171 and the metallic film 155 can be obtained. Hence, the metallic projection 171 and the metallic film 155 can be electrically connected together with a lower impedance.

After forming the metallic film 160, an etching resist film is deposited thereon, and the exposing and developing processes are carried out. Hence, the resist pattern 161 located in the position in which the connection electrode 172 should be formed is formed. Then, the metallic film 160 is etched in such a way that the resist pattern 161 serves as a mask. Hence, the metallic film 160 is removed except for the portion covered by the mask.

Figure 81:
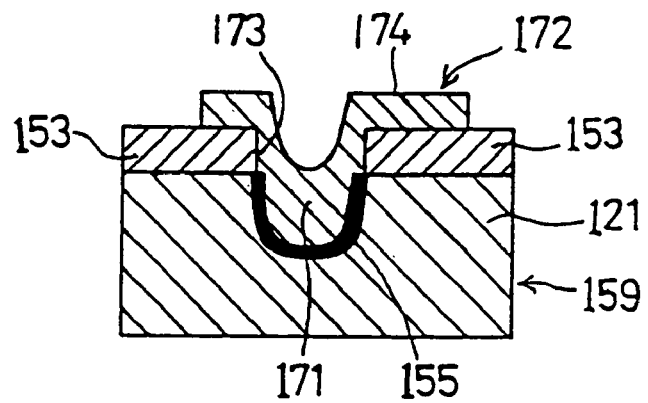
FIG. 81 is a cross-sectional view showing etching and resist separating steps of the method of producing the semiconductor device according to the twelfth embodiment of the present invention.

Hence, as shown in FIG. 81, the connection electrode 172 is formed, the connection electrode 172 having a structure in which the metallic projection 171 is connected to the metallic film 155, and the bonding portion 174 to which the wire 118 is to be bonded extends over the lower resin layer 153.

The remaining production steps following the step of forming the connection electrodes 172 are the same as corresponding ones which have been described with reference to FIGS. 46 through 54B, and a description thereof will be omitted.

[Thirteenth Embodiment]

Figure 82:
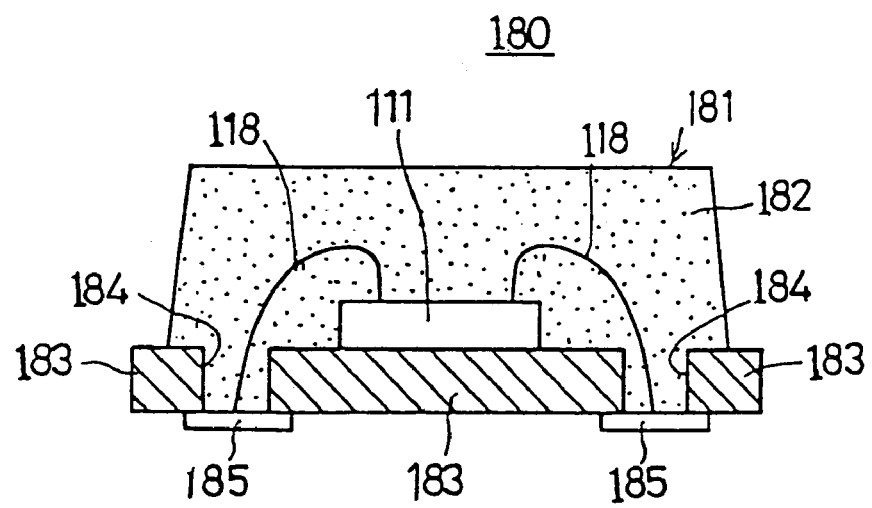
FIG. 82 is a cross-sectional view of a semiconductor device according to a thirteenth embodiment of the present invention.

A description will now be given, with reference to FIG. 82, of a semiconductor device 180 according to a thirteenth embodiment of the present invention. In FIG. 82, parts that are the same as those of the semiconductor device 150 are given the same reference numbers.

The semiconductor device 1.80 has a resin package 181 made up of an upper resin layer 182 and a lower resin layer 183, in which the lower resin layer 183 is formed by an insulation resin tape. Windows 184 are formed in given positions in the resin tape 183, and external electrode films 185 are formed to the lower surface (mounting surface) of the resin tape 183 so that the electrode films 185 cover the windows 184. The bonding wires 118 are bonded to the electrode films 185 through the windows 184.

The semiconductor device 180 has improved characteristics resulting from the two-layer package structure, and a cost reduction due to the resin tape 183 used instead of the lead frame 120 or 159.

[Fourteenth Embodiment]

Figure 83:
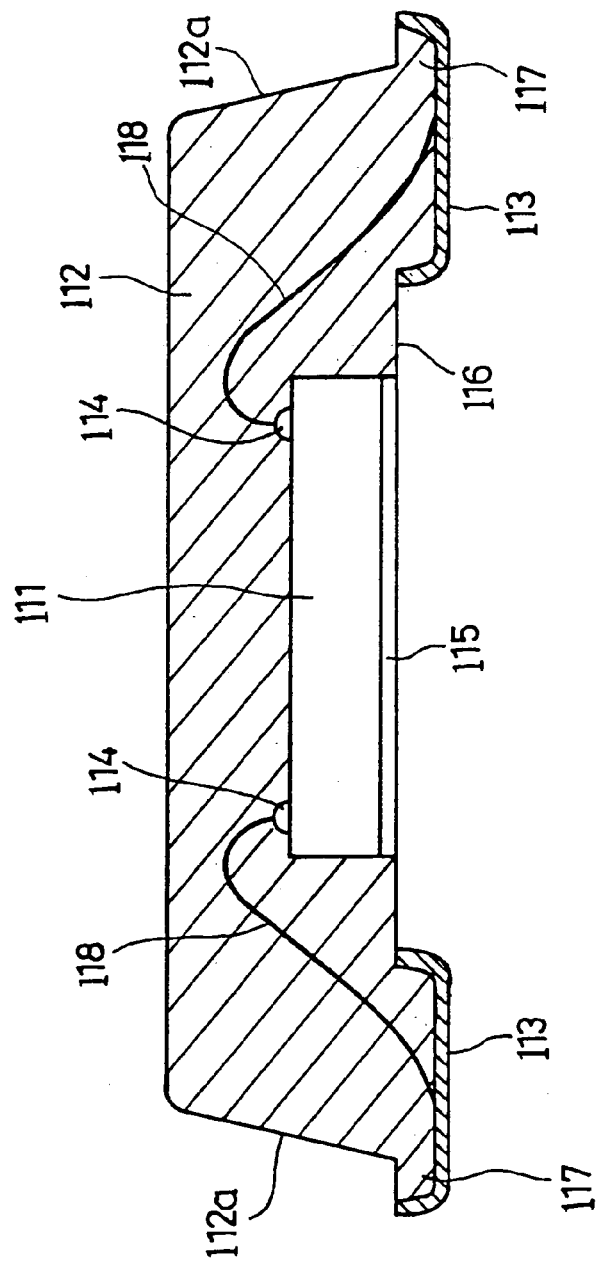
FIG. 83 is a cross-sectional view of a semiconductor device according to a fourteenth embodiment of the present invention.
Figure 84A:
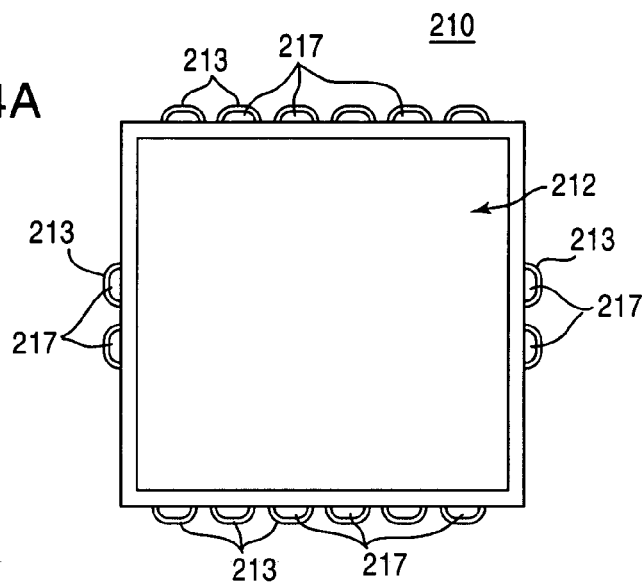
FIG. 84A is a plan view of the semiconductor device shown in FIG. 83.
Figure 84B:
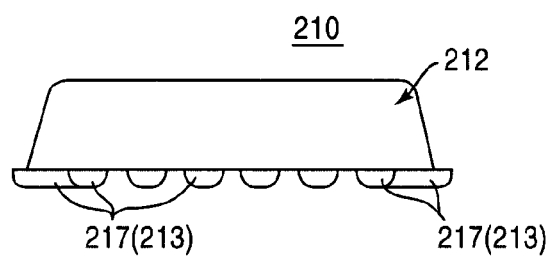
FIG. 84B is a side view of the semiconductor device shown in FIG. 83.
Figure 84C:
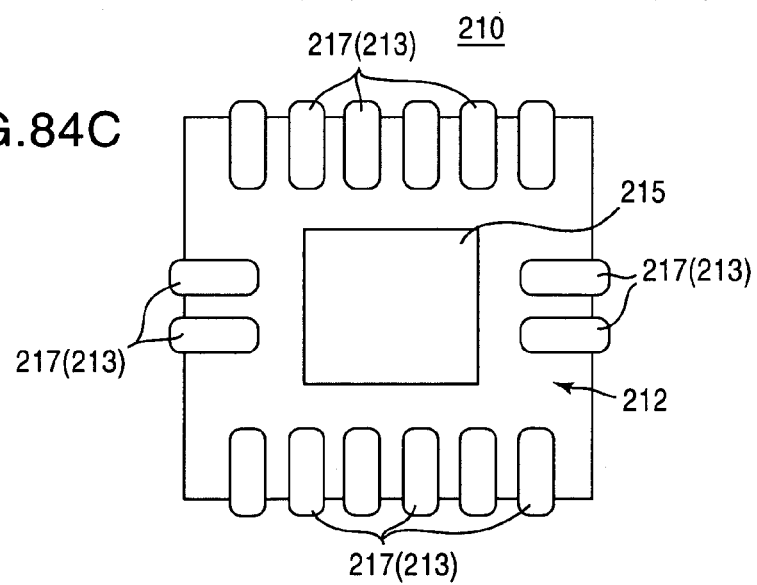
FIG. 84C is a bottom view of the semiconductor device shown in FIG. 83.

A description will now be given of a semiconductor device according to a fourteenth embodiment of the present invention. FIG. 83 is a cross-sectional view of a semiconductor device 210 according to the fourteenth embodiment of the present invention. FIG. 84A is a plan view of the semiconductor device 210, FIG. 84B is a front view thereof, and FIG. 84C is a bottom view thereof.

The semiconductor device 210 has a simple structure including a chip 211, a resin package 212 and metallic films 213. A plurality of electrode pads 214 are formed on the upper surface of the chip 211, which is mounted on a chip fixing resin 215. The chip 211 may be a semiconductor chip, a SAW chip, a multichip module or the like.

The resin package 212 is formed by molding (or potting) an epoxy resin, and has resin projections 217 integrally formed with the other portion of the resin package 212. The resin projections 217 are located in given positions. Each of the resin projections 217 projects downwards from a bottom surface (mount-side surface) 216 of the resin package 212, and also projects laterally from a side surface 212a thereof. The resin projections 217 are arranged at a pitch approximately equal to, for example, 0.8 mm.

The metallic films 213 are provided so as to cover the respective resin projections 217. Bonding wires 218 are provided between the metallic films 213 and the electrode pads 214, and are electrically connected together. The metallic films 213 can be configured as shown in FIGS. 35 through 38. The metallic films 213 may be configured as will be described later.

The semiconductor device 210 thus formed does not need any inner and outer leads used in the SSOP. Hence, there is no need to provide an area for leading the inner leads and a space in which the outer leads extend. Hence, a down-sized semiconductor device can be provided. Further, the semiconductor device 210 does not need any solder balls used in the BGA type, and is thus less expensive. Furthermore, the resin projections 217 and the metallic films 213 cooperate with each other as if they function as solder bumps of the BGA-type devices, so that a high mounting density can be obtained. Furthermore, the semiconductor device 210 is not affected by a curvature or deformation of the resin package 212.

The semiconductor device 210 has another advantage, which will now be described with reference to FIG. 85. Referring to FIG. 85, the semiconductor device 210 is mounted on a circuit board 250, on which connection electrodes 251 are provided in positions corresponding to those of the metallic films 213. The metallic films 213 are soldered to the connection electrodes 251. A reference number 219 indicates a solder portion. The solder portions 219 laterally extend along the metallic films 213 and laterally project from the resin package 212. Hence, the solder portions 219 can be visually checked, as shown in FIG. 85. This advantage facilitates the test of determining whether the semiconductor device 210 is duly mounted on and soldered to the circuit board 250.

Figure 86:
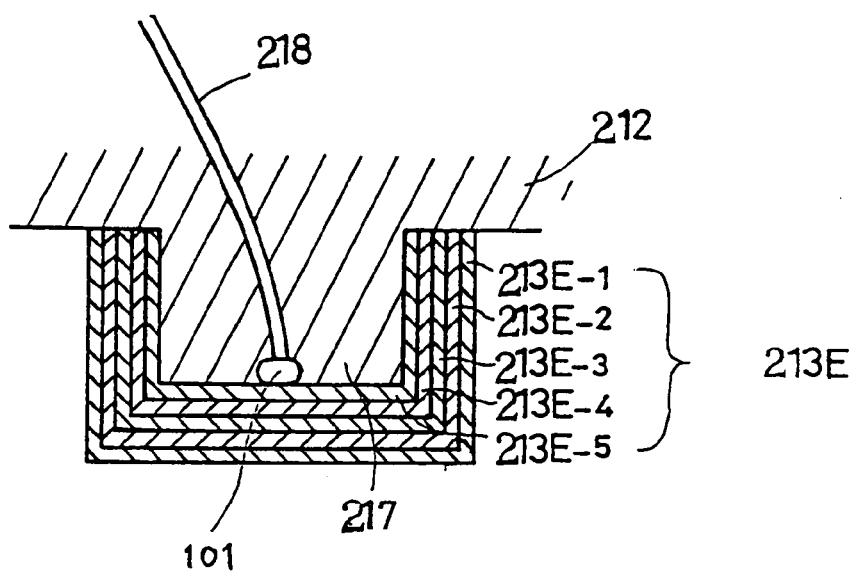
FIG. 86 is a cross-sectional view of a metallic film having a five-layer structure.
Figure 87:
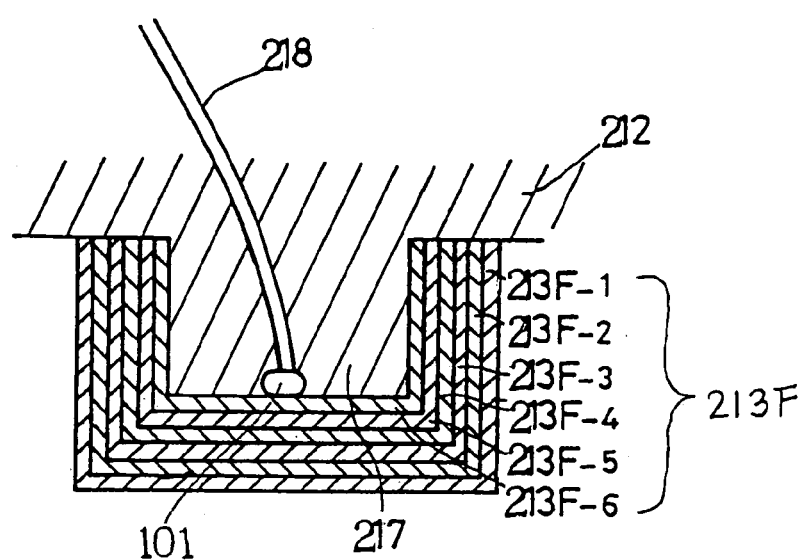
FIG. 87 is a cross-sectional view of a metallic film having a six-layer structure.
Figure 88:
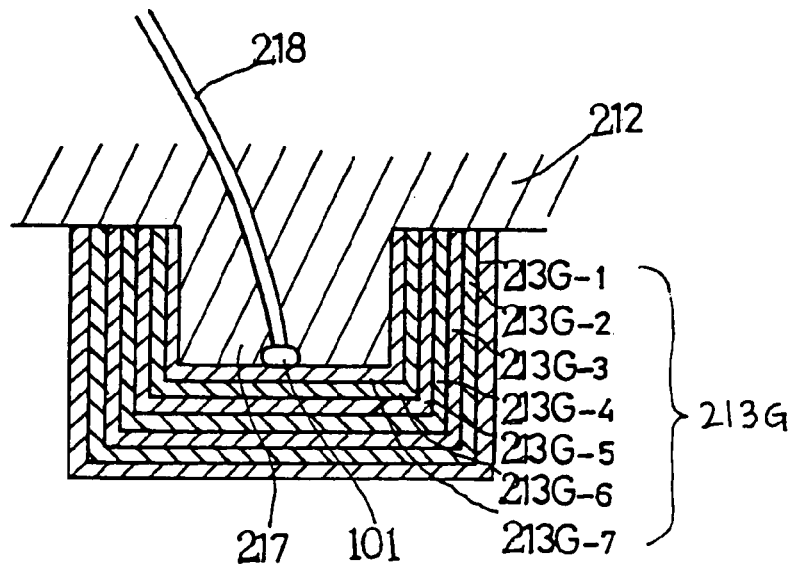
FIG. 88 is a cross-sectional view of a metallic film having a seven-layer structure.

Each of the metallic films 213 can have one of the multilayer structures shown in FIGS. 86, 87 and 88 which satisfy the aforementioned film requirement.

FIG. 86 shows a metallic film 213E having a five-layer structure consisting of an outer layer 213E-1, a first intermediate layer 213E-2, a second intermediate layer 213E-3, a third intermediate layer 213E-4, and an inner layer 213E-5. These layers can be made of the following combinations.

| 213E-1 | 213E-2 | 213E-3 | 213E-4 | 213E-5 |
|--------|--------|--------|--------|--------|
| Au     | Pd     | Ni     | Pd     | Au     |
| solder | Ni     | Au     | Pd     | Au     |
| Pd     | Ni     | Au     | Pd     | Au     |
| Pd     | Ni     | Cu     | Ni     | Pd     |
| Au     | Ni     | Cu     | Ni     | Au     |
| Au     | Pd     | Ni     | Au     | Pd     |

FIG. 87 shows a metallic film 213F having a six-layer structure consisting of an outer layer 213F-1, a first intermediate layer 213F-2, a second intermediate layer 213F-3, a third intermediate layer 213F-4, a fourth intermediately layer 213F-5, and an inner layer 213F-6. These layers can be made of the following combinations.

| 213F-1 | 213F-2 | 213F-3 | 213F-4 | 213F-5 | 213F-6 |
|--------|--------|--------|--------|--------|--------|
| Au     | Pd     | Ni     | Au     | Pd     | Au     |
| Au     | Pd     | Ni     | Cu     | Ni     | Pd     |
| Pd     | Ni     | Cu     | Ni     | Pd     | Au     |

FIG. 88 shows a metallic film 213G having a seven-layer structure consisting of an outer layer 213G-1, a first intermediate layer 213G-2, a second intermediate layer 213G-3, a third intermediate layer 213G-4, a fourth intermediate layer 213G-5, a fifth intermediately layer 213G-6, and an inner layer 213G-7. These layers can be made of the following combinations.

| 213G-1 | 213G-2 | 213G-3 | 213G-4 | 213G-5 | 213G-6 | 213-7 |
|--------|--------|--------|--------|--------|--------|-------|
| Au     | Pd     | Ni     | Cu     | Ni     | Pd     | Au    |

In FIGS. 86, 87 and 88, the aforementioned bonding balls 101 are depicted. The bonding balls 101 can be employed or can be omitted as shown in FIG. 83.

The semiconductor device 210 can be produced in the same manner as has been described with reference to FIG. 39 through 59.

Instead of the bonding balls 101, it is also possible to use stud balls or stud bumps as will be described below.

Figure 89A:
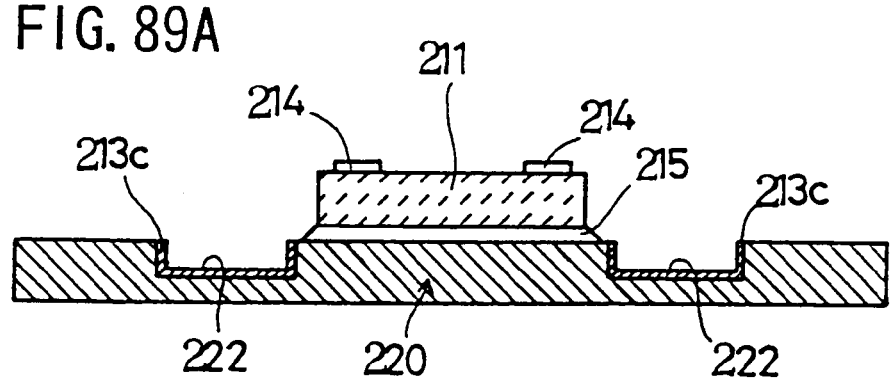
FIGS. 89A, 89B, 89C, 89D and 89E are respectively cross-sectional views showing a variation of the connecting step.

FIG. 89A shows a state observed when the chip mounting step, which has been described with reference to FIG. 46, is completed. A lead frame 220, produced in the aforementioned manner, includes recess portions 222, in which metallic films 213C having a three-layer structure shown in FIG. 37 are provided. The chip 211 having the electrode pads 214 is mounted on the chip fixing resin 215.

Figure 89B:
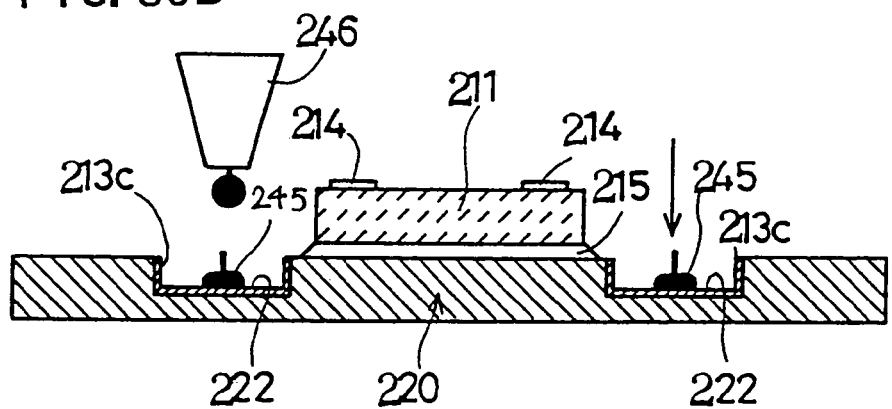
Figure 89C:
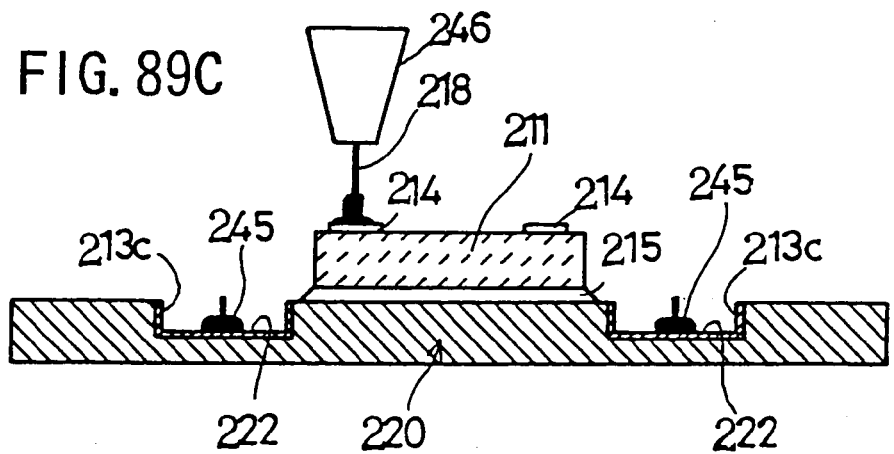

FIG. 89B shows a state in which stud bumps 245 are provided on the inner walls of the metallic films 213C. After forming the stud bumps 245, a capillary 246 is moved so as to be positioned just above the target electrode pad 214, as shown in FIG. 89C. In this state, the bonding wire 218 is bonded to the electrode pad 214 (first bonding). Then, the capillary 246 is moved so as to be positioned just above the target stud bump 245. By this movement, the bonding wire 218 is extended up to the position just above the stud bump 245.

Figure 89D:
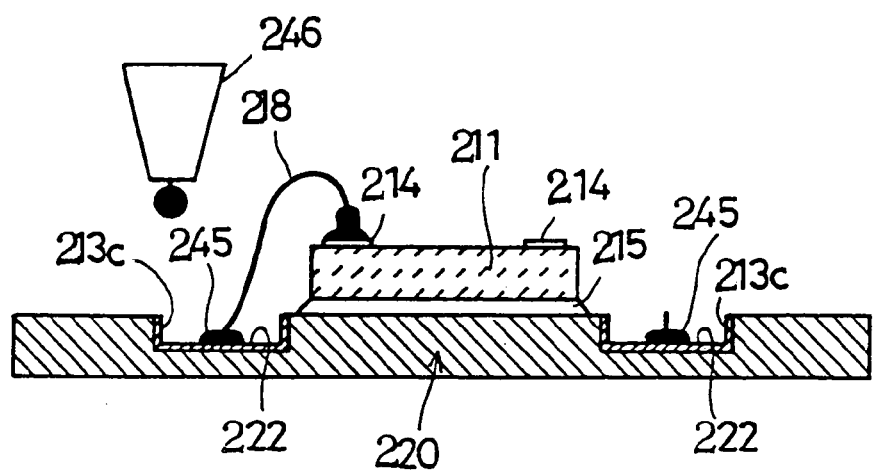
Figure 89E:
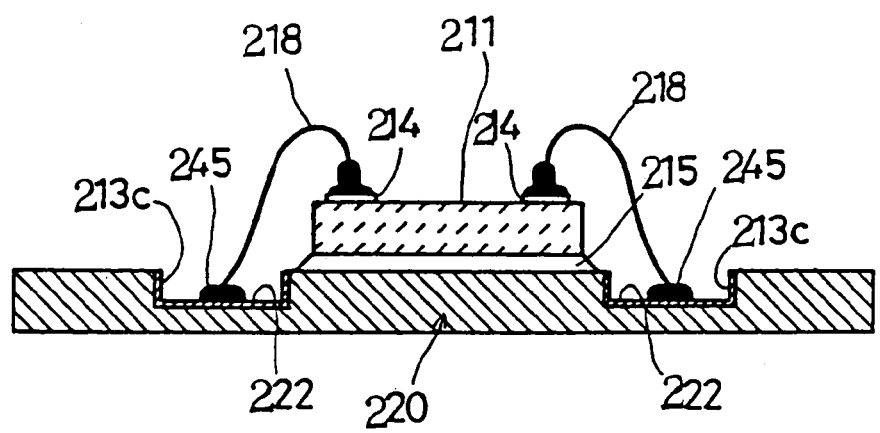

Then, as shown in FIG. 89D, the capillary 246 is pressed by the stud bump 245, so that the bonding wire 218 is bonded to the stud bump 245 (second bonding). The above process is repeatedly carried out in order to electrically connect the electrode pads 214 and the stud bumps 245 (the metallic films 213C) by the bonding wires 218, as shown in FIG. 89E.

The use of the stud bumps 245 improves the reliability of bonding as in the case of the use of the bonding balls 101. That is, the bonding wires 218 can be certainly bonded to the stud bumps 245, so that the electrical connections between the bonding wires 218 and the metallic films 213C can be highly reliable.

The stud bumps 245 can be formed as shown in FIGS. 90A through 90I. In the following description, a gold wire is used as the bonding wire 218. For the sake of simplicity, FIGS. 90A through 90I show the metallic film 213C and its vicinity.

First, as shown in FIG. 90A, the capillary 245 is moved and positioned above the metallic film 213C. Next, a spark is generated by using a spark rod (not show) provided in the wire bonding apparatus, so that a ball (having a diameter of, for example, 90 μm) is formed on the end of the wire 218.

Then, as shown in FIG. 90B, the capillary 245 is lowered so that the ball 247 is pressed. In this state, the ball 247 is bonded to the metallic film 213C by, for example, ultrasonic welding. The ball 247 is pressed and much deformed by the capillary 245, so that the ball 247 has a diameter of 10–120 μm and a height of 30–40 μm.

Subsequent to the above bonding step, as shown in FIG. 90C, the capillary 246 is raised by about 300 μm from the ball 247. Then, as shown in FIG. 90D, the capillary 246 is moved laterally by approximately 40–50 μm. Hence, the capillary 246 is positioned in an offset position laterally deviating from the center of the ball 247.

Thereafter, as shown in FIG. 90E, the capillary 246 is lowered while the offset position is maintained, and crushes the ball 247. Then, in the state in which the wire 218 is clamped (no feeding of the wire 218 is carried out), as shown in FIG. 90F, the capillary 246 is raised. Hence, the wire 218 is cut and the stud bump 245 is formed.

In the above-mentioned manner of forming the stud bump 245, the capillary 245 crushes the ball 247, so that a tight contact between the stud bump 245 and the metallic film 213C can be made. Further, the ball 247 is made to have a wider area. Hence, as shown in FIGS. 90G through 90I, the wider area of the ball 247 makes it possible to certainly perform the bonding process. The wire 218 and the stud bump 245 are of an identical substance (gold), and an excellent bondability can be obtained. Hence, the reliability of the joint between the wire 218 and the stud bump 245 can be highly improved.

As has been described with reference to FIG. 90F, the wire 218 is cut by the capillary 246 as it ascends after crushing the ball 247. At this time, the capillary 246 is in the offset position. Hence, the bonding is not affected due to the presence of a projection 248 (the remaining wire) extending upwards from the ball 247.

The wire 218 is not limited to gold, and can be formed of a coated gold wire with a gold core wire coated by an insulating member. The use of such a coated wire prevents shortcircuiting between the wire 218 and another portion. Hence, it is preferable to use the coated bonding wire if it is required to arrange the wires 218 at a high density.

As has been described previously, the semiconductor device 210 can be produced in the same manner as the semiconductor device 110. However, a die used in the molding step has a shape slightly different of that of the die used in the method of producing the semiconductor device 210. This is because each of the resin projections 217 laterally extends from the package 212 as shown in FIG. 85.

Figure 91:
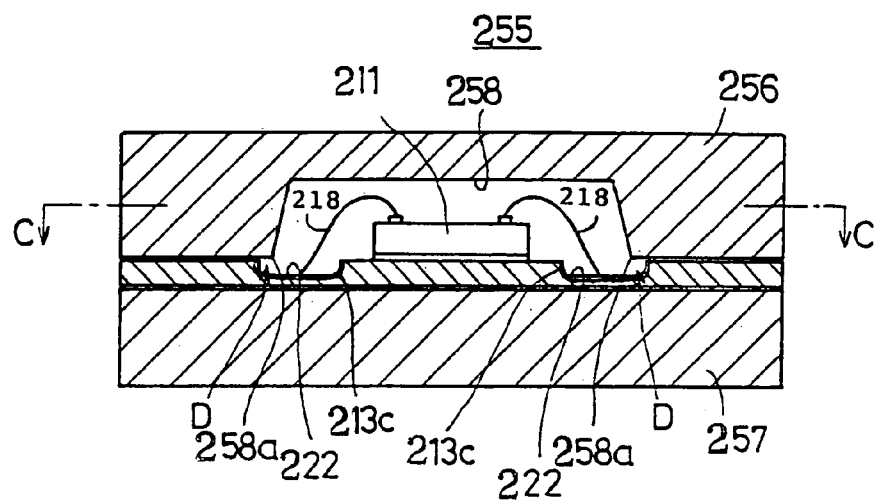
FIG. 91 is a cross-sectional view of a die used in the molding step.

FIG. 91 shows an upper die 256 and a lower die 257, which are used to form the resin package 212 by molding. The upper die 256 has a cavity 258, which has corner portions 258a. The corner portions 258 are located above the recess portions 222, so that the recess portions 222 are partially covered by the upper die 256. Hence, the resin projections 217 respectively having laterally extending portions which should be located at D in FIG. 91 can be formed.

Figure 92:
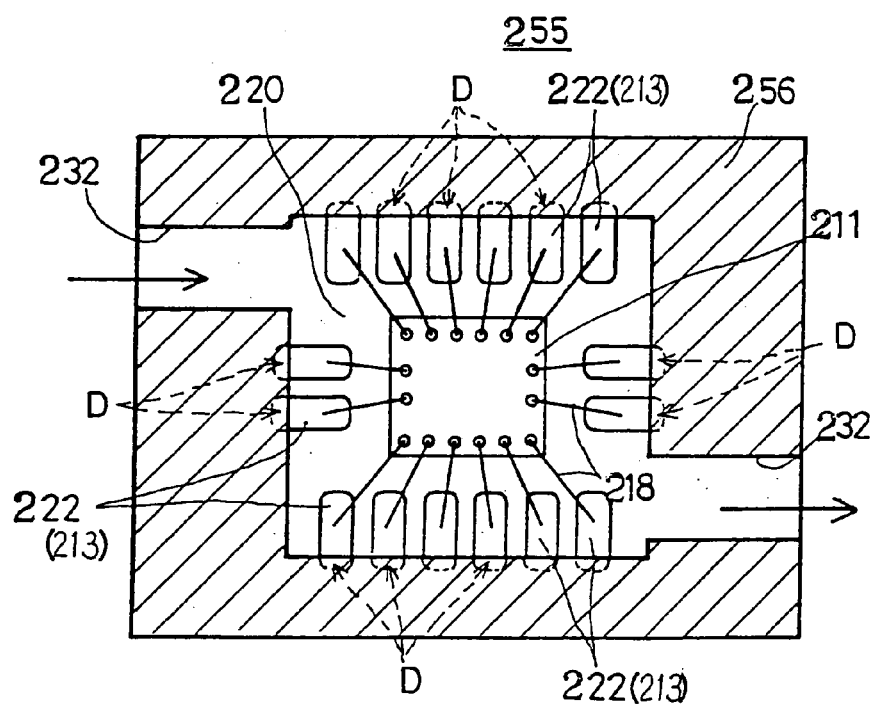
FIG. 92 is a transverse-sectional view of an upper die of the die shown in FIG. 91.
Figure 93:
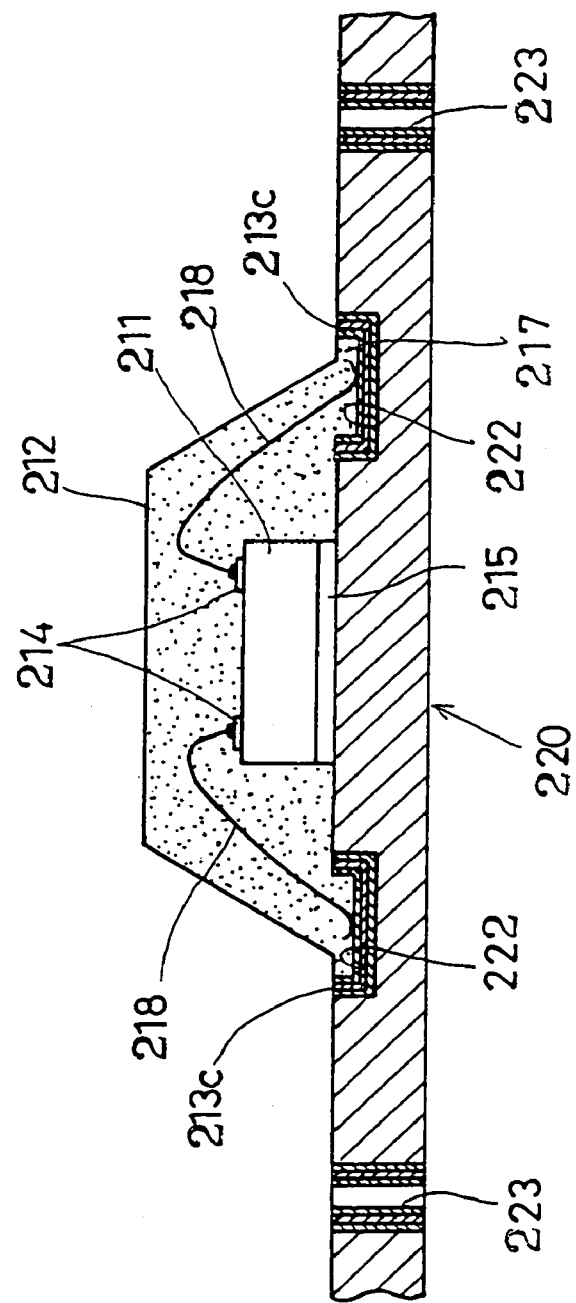
FIG. 93 is a cross-sectional view of the lead frame observed when the sealing step is completed.

As shown in FIG. 92, the upper die 256 has gates 232, and resin is supplied to pass through the gates 232, as indicated by the arrows. Hence, the resin package 212 is formed, as shown in FIG. 93, which corresponds to FIG. 50. It will be noted that a plurality of resin packages 212 are formed on the lead frame 220. A reference number 223 indicates tool engagement portions, which correspond to the tool engagement portions shown in FIG. 50.

Figure 94:
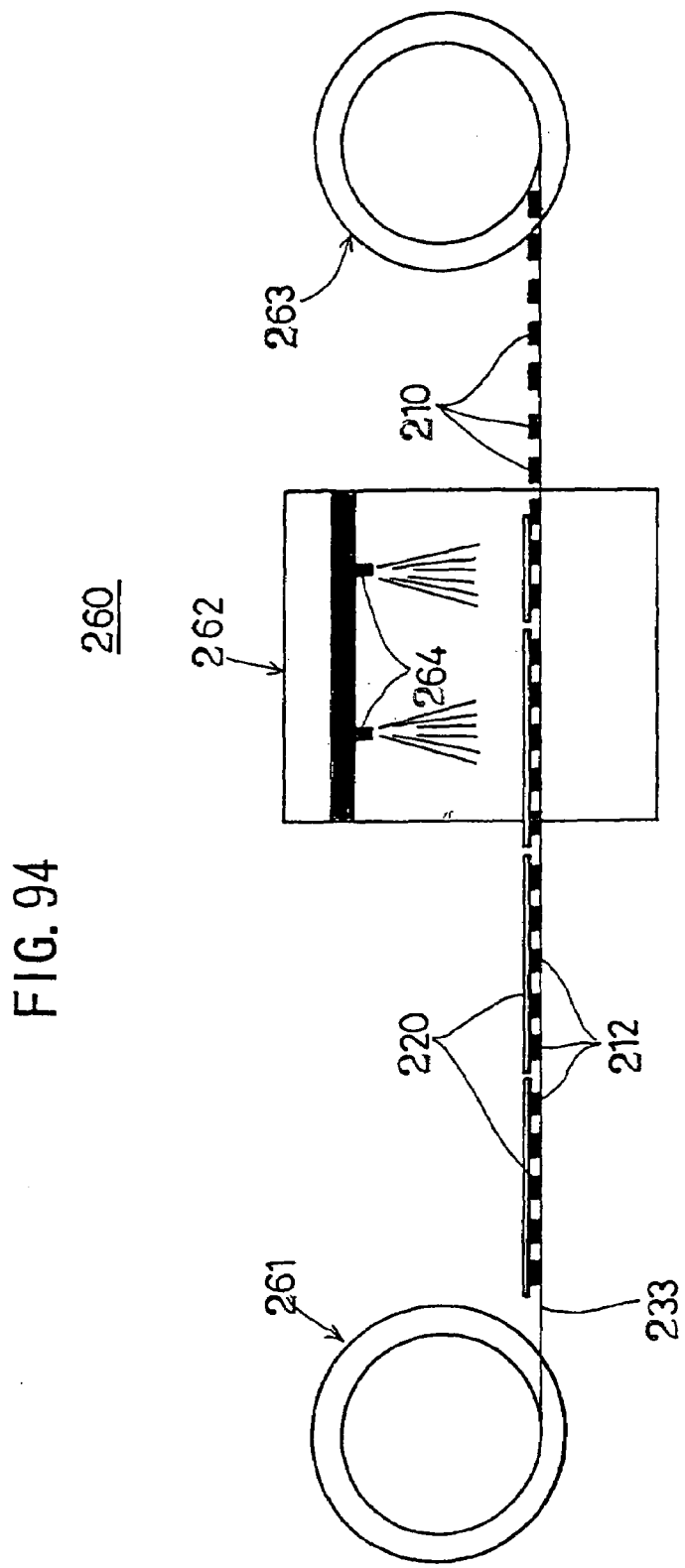
FIG. 94 is a side view showing a variation of the separating step.

An alternative separating step shown in FIG. 94 can be employed instead of the separating step shown in FIG. 53. An etching apparatus 260 shown in FIG. 94 includes a feed reel 261, an etching chamber 262, and a take-up reel 263. A plurality of lead frames 220 to which the resin packages 212 are provided are attached to a tape member 233, which is wound on the feed reel 261. Nozzles 264 for injecting etchant are provided in the etching chamber 262. The tape member 233 is fed from the feed reel 261 and is supplied to the etching chamber 262, in which the lead frame 262 facing the nozzles 264 is etched. By the etching process, the lead frame 220 is dissolved except for the metallic films 231C. Hence, the resin packages 212 are separated from the lead frame 220.

The tape member 233 is formed of a material not affected by the etchant, so that the resin packages 212 are supported by the tape member 233 after the lead frame 220 is dissolved. The tape member 233 by which the packages 212 are supported goes out of the etching chamber 262, and is wound by the take-up reel 263. By using the above etching apparatus, it is possible to automatically separate the packages 212 from the lead frame 220.

The etching apparatus shown in FIG. 94 can be used to produce the semiconductor devices according to the other embodiments of the present invention.

Figure 95:
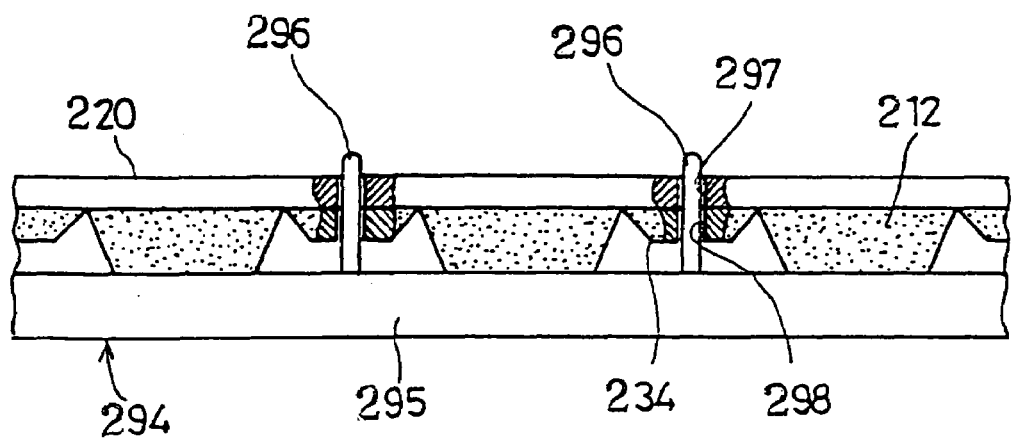
FIG. 95 is a cross-sectional view showing another variation of the separating step.
Figure 96:
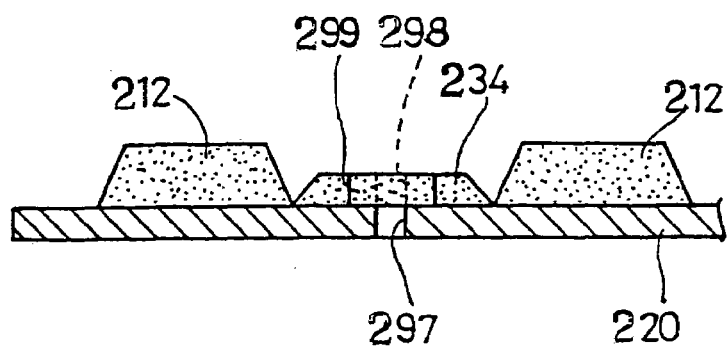
FIG. 96 is a cross-sectional view showing a through hole formed in the lead frame.

It is possible to employ a separating step shown in FIG. 95 instead of the separating step shown in FIG. 53 or 59. The separating step shown in FIG. 95 employs the step of etching the lead frame 220 in such a way that the resin packages 212 are supported by a fixing tool 294. As shown in FIG. 95, the fixing tool 294 is made up of a plate-shaped base 295, and fixing pins 296 which stand upright. The lead frame 220 and the runner frames 234 have through holes 297 and 298 as shown in FIG. 96. More particularly, the through holes 297 are formed in the lead frame 220, and the through holes 298 are formed in the runner frames 234. As shown in FIG. 96, the through holes 297 and 298 are connected so that single holes can be respectively formed. The fixing pins 296 provided to the fixing tool 294 can be inserted into the through holes 297 and 298.

Figure 97:
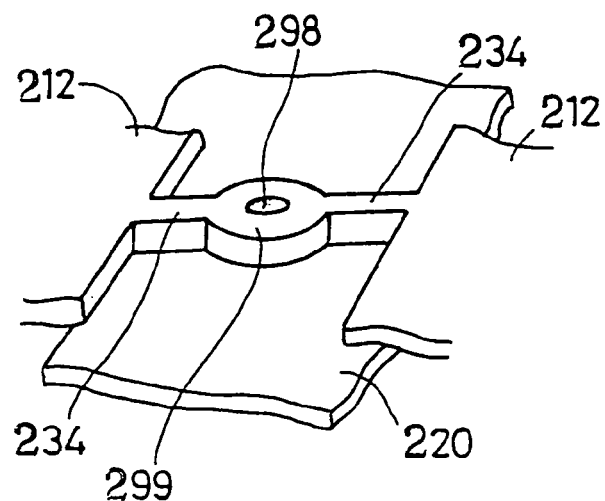
FIG. 97 is an enlarged perspective view of a through hole formed in a runner frame.
Figure 98A:
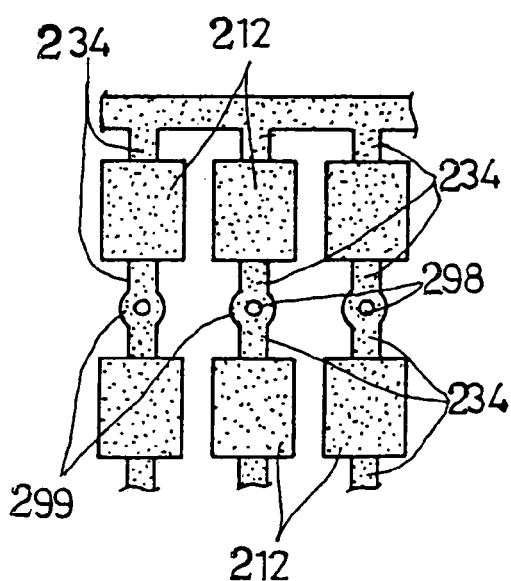
FIG. 98A and 98B are respectively enlarged plan views of through holes formed in runner frames.
Figure 98B:
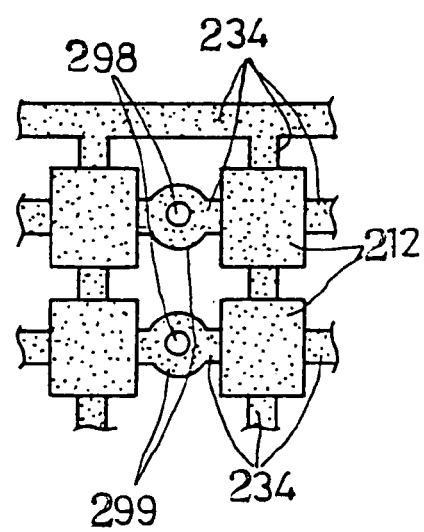

FIG. 97 shows one through hole 298 formed in the runner frame 234. FIGS. 98A and 98B also show through holes 298 formed in the runner frames 234. A ring portion 299 is formed in the runner frame 234, and the through hole 298 is formed in the ring portion 299. Hence, the runner frames 234 having the through holes 298 in the ring portions 299 can have a given mechanical strength. Hence, there is no possibility that the runner frames 234 may be broken in the through holes 298 and the resin packages 212 may be separated during the separating step.

Turning to FIG. 95 again, the fixing pins 296 are inserted into the through holes 297 and 298 so that the resin packages 212 face the base 295. Hence, the relative movement of the lead frame 220 and the fixing tool 294 is prevented. In this state, the resin packages 212, the runner frames 234 and the lead frame 220 are inserted, along with the fixing tool 294, into the etching chamber 262 shown in FIG. 94. The etchant is injected at a high pressure and the lead frame 220 is dissolved. During this process, the highly pressured etchant is applied to the resin packages 212 and the runner frames 234. However, the fixing tool 294 certainly supports the resin packages 212 and the runner frames 234, so that any displacement of these components cannot be caused due to the injection of the etchant. If these components are displaced, it will be necessary to place them back in the original positions. The fixing tool 294 is made of a material not affected by the etchant, and thus can be repeatedly used.

Figure 99A:
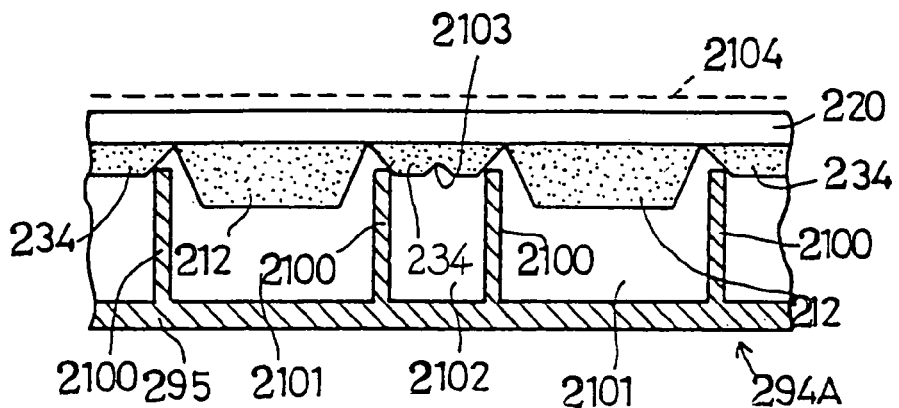
FIGS. 99A, 99B and 99C are respectively cross-sectional views showing still another variation of the separating step.
Figure 99B:
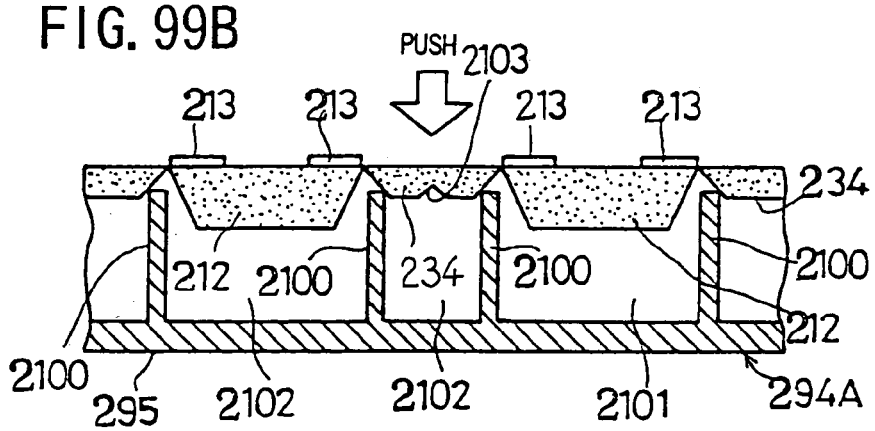
Figure 99C:
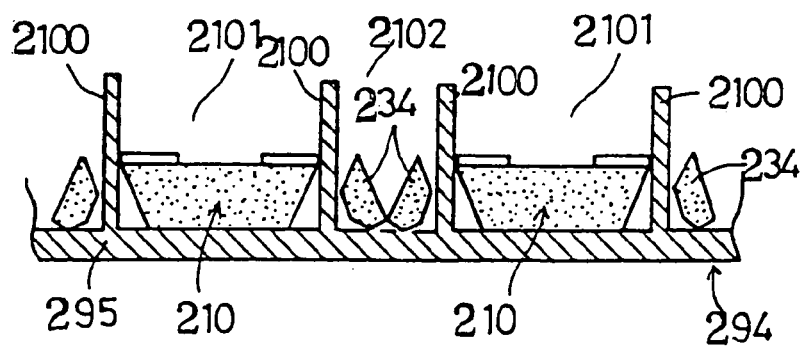

FIGS. 99A, 99B and 99C show another separating step. As has been described previously, the runner frames 234 should be removed before shipping. The separating step shown in FIGS. 99A, 99B and 99C has a particular step of removing the runner frames 234. A fixing tool 294A is used to maintain the resin packages 212 and the runner frames 234 in the stationary step. The fixing tool 294A has wall portions 2100, which stand upright on the base 295. The wall portions 2100 define a plurality of accommodating portions 2101 and 2102. As shown in FIG. 99A, the resin packages 212 face the resin package accommodating portions 2101, and the runner frames 234 face the runner frame accommodating portions 2102.

In the state in which the resin packages 212 (runner frames 234) and the lead frame 220 are supported by the fixing tool 294A, the wall projections 2100 face the portions in which the resin packages 212 and the runner frames 234 are joined together. The above portions are thinner than the other portions, and do not have a mechanical strength as strong as the other thick portions. However, the relatively thin portions have a mechanical strength which is not broken by the injection of the highly pressured etchant.

Figure 100A:
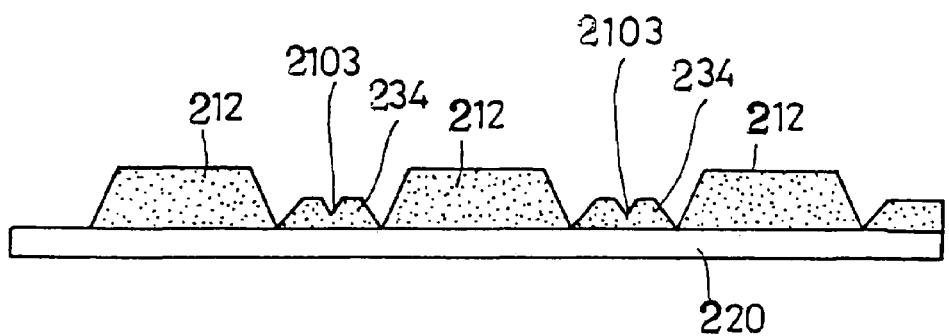
FIG. 100A is a side view showing separation grooves formed in the runner frames.
Figure 100B:
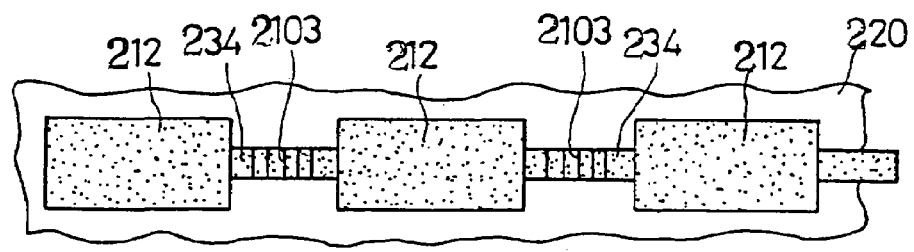
FIG. 100B is a plan view of the separation grooves shown in FIG. 100A.
Figure 101:
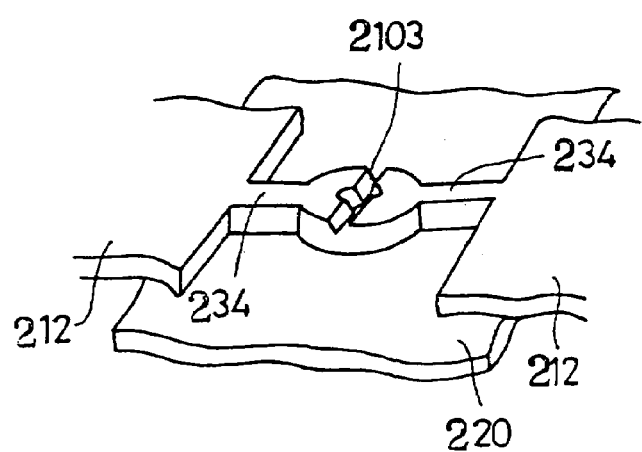
FIG. 101 is an enlarged perspective view of a separation groove formed in the runner frame.

Grooves 2103 are formed on the runner frames 234. As shown in FIGS. 100A, 100B and 101, the groove 2103 extends in the center of the runner frame 234. The portions having the grooves 2103 are mechanically weaker than the other portions, but have a mechanical strength which prevents the runner frames 234 from being broken.

In the above separating step, the fixing tool 294A is positioned as shown in FIG. 99A. Since the resin packages. 212 have a height different from that of the runner frames 234, the arrangement of the resin packages 212 and the runner frames 234 form step portions. The wall portions 2100 engage the recess portions of the step portions, so that the resin packages 212 can be prevented from deviating from the original positions.

As shown in FIG. 99A, a mesh member 2104 is provided on the surface of the lead frame 220 opposite to the surface thereof on which the runner frames 234 are formed. The mesh member 2104 allows the etchant to pass therethrough. Hence, the mesh member 2104 does not affect the step of etching the lead frame 220. Further, the mesh member 2104 is urged so as to press the lead frame 220 against the fixing tool 294A. Hence, the resin packages 212, the runner frames 234 and the lead frame 220 can be certainly supported by the fixing tool 294A. Hence, it is possible to prevent occurrence of any positional error of the lead frame 220 in the etching process.

FIG. 99B shows that the lead frame 220 and the mesh member 2104 have been removed by the etching process. In FIG. 99B, the resin packages 212 and the runner frames 234 are joined together. Further, the resin packages 212 face the accommodating portions 2101, and the runner frames 234 face the accommodating portion 2102.

Then the resin packages 212 and the runner frames 234 are pressed so that the wall portions 2100 come into contact with the joint portions between the resin packages 212 and the runner frames 234. The joint portions are thinner than the other portions, and therefore are easily broken as shown in FIG. 99C without any excessive stress to the resin packages 212.

It should be noted that the resin packages 212 (semiconductor devices 210) can be accommodated in the accommodating portions 2101, and the broken runner frames 234 can be accommodated in the accommodating portions 2102. In this manner, the semiconductor devices 210 and the runner frames 234 can be automatically and separately accommodated, and thus the production process can be simplified.

Figure 102A:
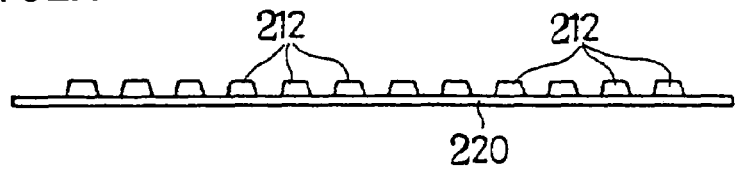
FIGS. 102A, 102B, 102C, 102D and 102E are respectively cross-sectional views showing another separating step.
Figure 102B:
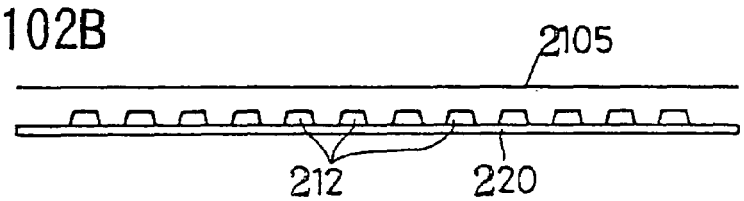

FIGS. 102A through 102E show yet another separating step. FIG. 102A shows that the resin packages 212 are supported by the lead frame 220. The runner frames 234 are not formed. As shown in FIG. 102B, a sheet member 2105 is provided so as to cover the resin packages 212 after the sealing step is carried out and before the lead frame 220 is removed. The sheet member 2105 is not supplied with any adhesive, while the aforementioned tape member 233 is supplied with an adhesive.

Figure 102C:
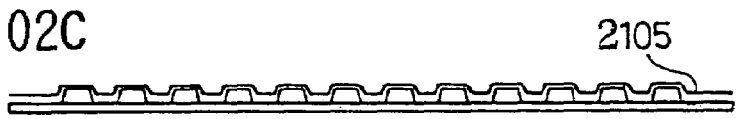

Then, as shown in FIG. 102C, the sheet member 2105 is attached to the resin packages 212 by a vacuum absorbing process (sheet member absorbing step). Hence, the sheet member 2105 is deformed so as to match the shape of the resin packages 212 and is adhered thereto. Thus, the resin packages 212 are supported by the sheet member 2105. It should be noted that an adhesive is not used to support the resin packages 212 by the sheet member 2105.

Figure 102D:
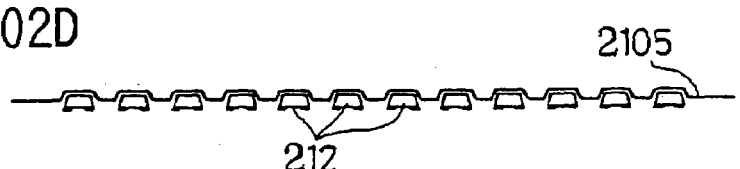

Then, the packages 212 supported by the lead frame 220 and the sheet member 2105 are placed in the etching chamber 262, and the lead frame 220 is etched. FIG. 102D shows a state observed when the etching process is completed. The resin packages 2105 are supported by the sheet member 2105.

Figure 102E:
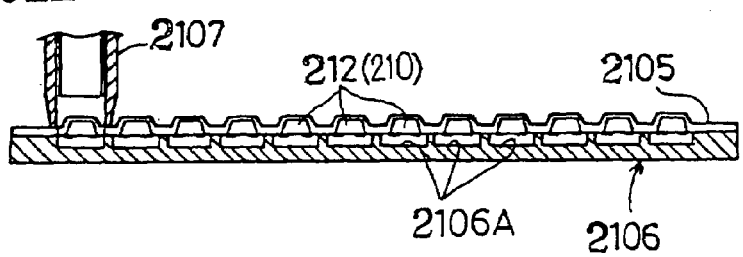

Finally, as shown in FIG. 102E, the resin packages 212 supported by the sheet member 2105 are accommodated in a package accommodating member container 2106, and an accommodating tool 2107 is driven so that the resin packages 212 are depressed one by one. Each of the resin packages 212 is separated from the sheet member 2105, and is then accommodated in the container 2106 (resin package accommodating step).

It should be noted that no adhesive is used to support the resin packages 212 by the resin sheet 2015, and thus the above package accommodating process can easily be carried out.

Figure 103A:
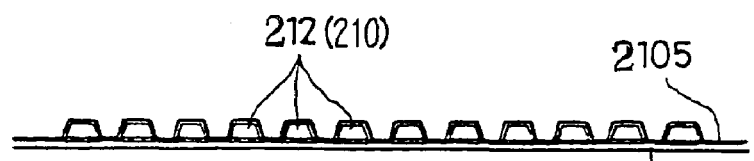
FIGS. 103A and 103B are cross-sectional views showing a packaging step.
Figure 103B:
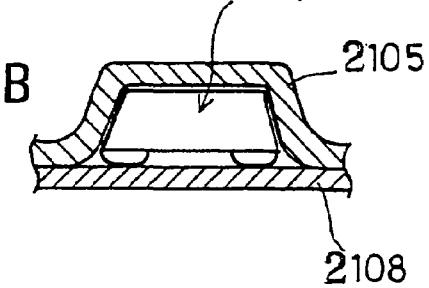

Instead of use of the container 2106, it is possible to perform a packing process as shown in FIGS. 103A and 103B. After the assembly shown in FIG. 102D is obtained, a second sheet member 2108 is provided to the packages 212 so that the packages 212 are packed by the first and second sheet members 2105 and 2108 (packing step). The assembly shown in FIGS. 103A and 103B can be handled by a packed product.

[Fifteenth Embodiment]

Figure 104:
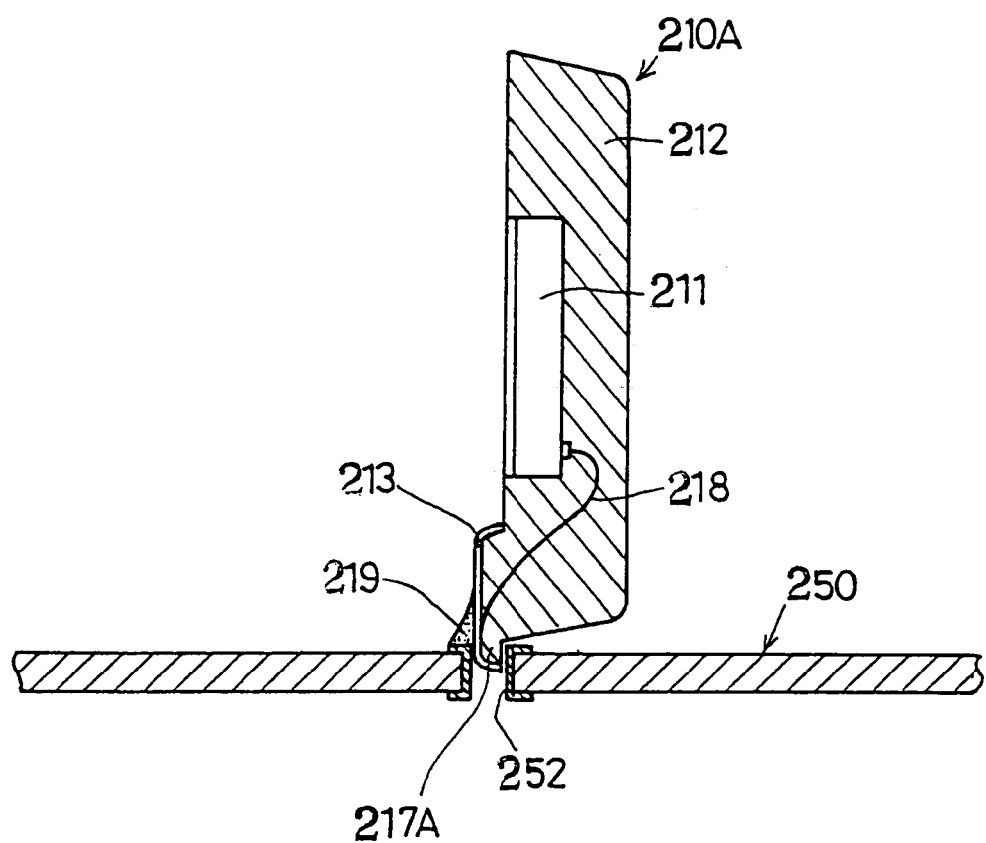
FIG. 104 is a cross-sectional view of a semiconductor device according to a fifteenth embodiment of the present invention.

A description will now be given, with reference to FIG. 104, of a semiconductor device according to a fifteenth embodiment of the present invention. In FIG. 104, parts that are the same as those of the fourteenth embodiment of the present invention are given the same reference numbers.

A semiconductor device 210A shown in FIG. 104 has a feature in which resin projections 217A are provided on one side of the resin package 212. Such an arrangement of the resin projections 217A can be easily defined by appropriately selecting the positions of the recess portions 222 in the lead frame 220.

The semiconductor device 210A can be mounted on the circuit board 250 as follows. As shown in FIG. 104, through holes 252, to which electrical conductors are provided, are formed in the circuit board 250 so that the through holes 252 correspond to the resin projections 217A. The resin projections 217A are inserted into the through holes 252 so that the semiconductor device 210A stands upright. Then, the metallic films 213 respectively formed on the resin projections 217A are soldered to the conductors formed in the through holes 252. The above mounting manner increases the mounting density, since the semiconductor device 210A is vertically mounted. Further, it is easy to check, from the outside of the semiconductor device 210A, the states of soldering in the connections between the metallic films 213 and the conductors in the through holes 252.

[Sixteenth Embodiment]

Figure 105:
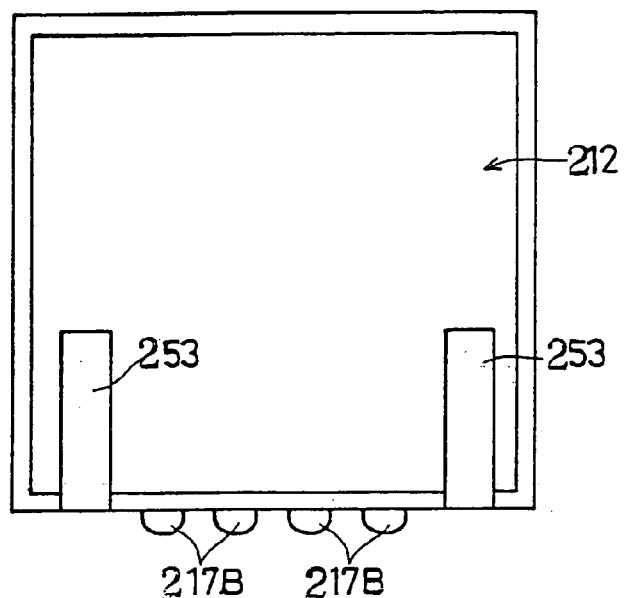
FIG. 105 is a bottom view of a semiconductor device according to a sixteenth embodiment of the present invention.
Figure 106:
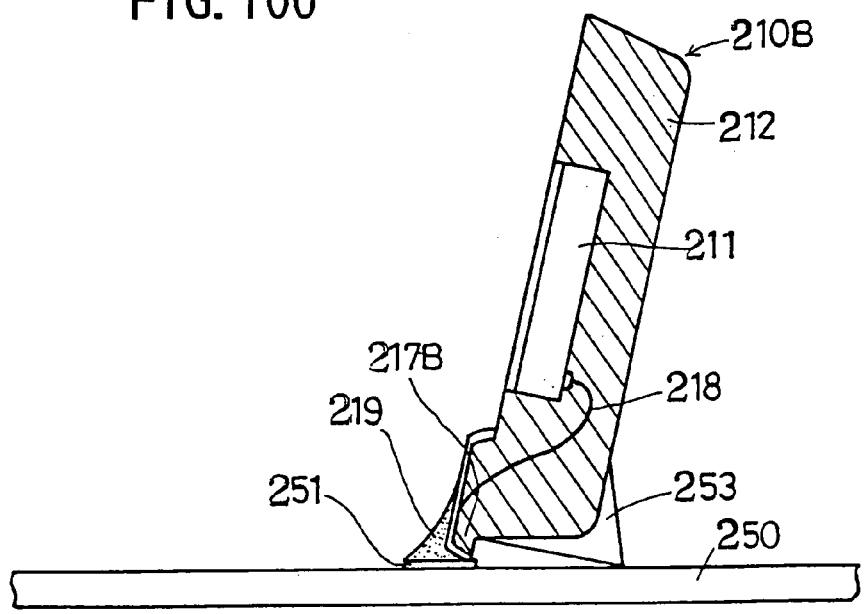
FIG. 106 is a cross-sectional view of the semiconductor device shown in FIG. 105, in which the device is mounted on a circuit board.

FIG. 105 is a plan view of a semiconductor device 210B according to a sixteenth embodiment of the present invention, and FIG. 106 shows the semiconductor device 210B mounted on the circuit board 250. In these figures, parts that are the same as those shown in the previously described figures are given the same reference numbers.

The semiconductor device 210B has a feature in which supporting members 253 are provided on one side of the resin package 212. The supporting member 253 supports the resin package 212 so that the semiconductor device 210 stands upright on the circuit board 250. The semiconductor device 210B has an alignment of resin projections 217B provided on one side of the resin package 212, as in the case of the semiconductor device 210A.

The semiconductor device 210B is mounted so that the resin projections 217B are positioned to the connection electrodes 251 formed on the circuit board 250, and are soldered thereto via the soldering portions 219. The above soldering can be carried out by a solder reflow process, so that the soldering process can be facilitated. The sixteenth embodiment of the present invention has the same advantages as those of the fifteenth embodiment thereof.

[Seventeenth Embodiment]

Figure 107:
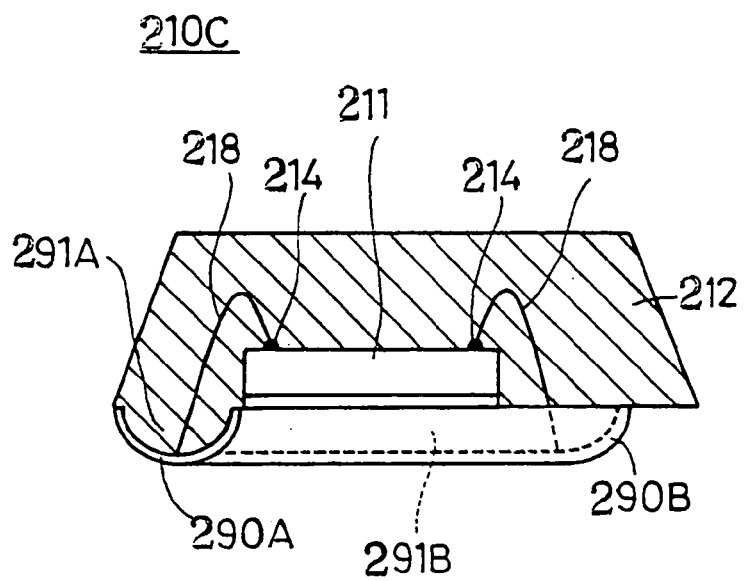
FIG. 107 is a cross-sectional view of a semiconductor device according to a seventeenth embodiment of the present invention.
Figure 108:
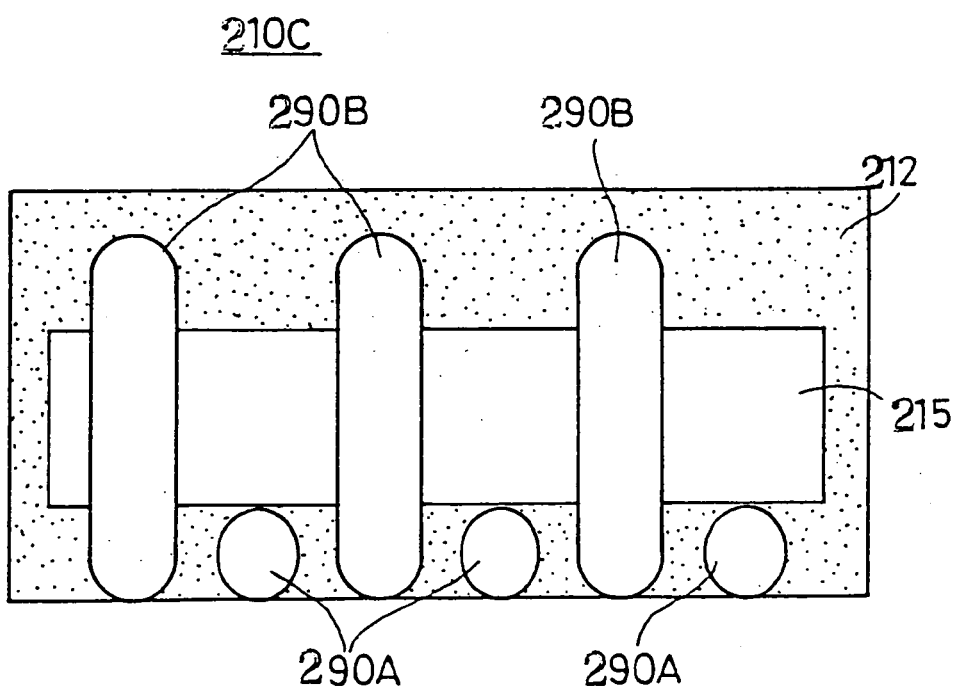
Figure 109:
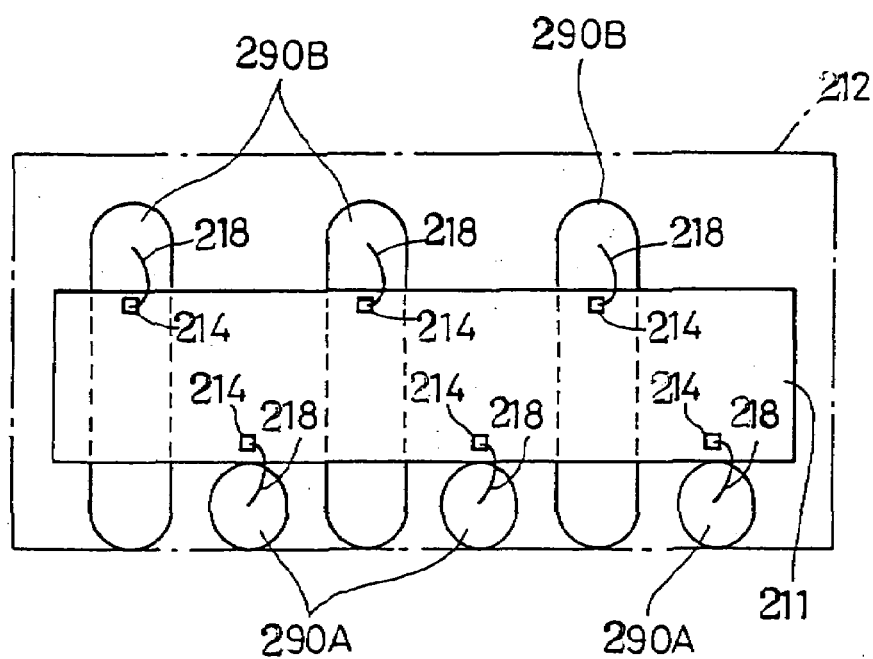

A description will now be given, with reference to FIGS. 107 through 109, of a semiconductor device 210C according to a seventeenth embodiment of the present invention. In these figures, parts that are the same as those shown in the previously described figures are given the same reference numbers.

The semiconductor device 210C has a feature in which there are provided resin projections 291A and 291B having different lengths laterally. More particularly, the first resin projections 291A have a relatively short length, and the second resin projections 291B have a relatively long length. Metallic films 290A are respectively provided to the first resin projections 291A, and metallic films 290B are respectively provided to the second resin projections 291B. The metallic films 290A are relatively short in the lateral direction, and the metallic films 290B are relatively long in the lateral direction. The second projections 291B and the second metallic films 290B extend below the chip 211.

The above arrangement of the resin projections 291A and 291B facilitates the routing of the bonding wires 218 toward the metallic films 290A and 290B. As shown in FIG. 107, the bonding wires 218 extend from the two sides of the chip 211 to the metallic films 290A and 290B. On the other hand, as shown in FIG. 104, the bonding wires 218 can be routed via only one side of the chip 211. Hence, it may be required that the electrode pads 214 formed on the chip 211 shown in FIG. 104 be aligned on one side of the chip 211. In the structure shown in FIGS. 107 through 109, the electrode pads 214 can be arranged on four sides of the chip 211. Even in this case, the routing of the bonding wires 218 to the metallic films 290A and 290B provided on one side of the resin package 212 can be easily selected.

If the device 210C has the same number of electrode pads 214 as that of electrode pads 214 of the device 210A, the electrode pads 214 of the device 210C can be arranged at a pitch greater than that of the electrode pads of the device 210A. In other words, the device 210C can a larger number of electrode pads 214 than the device 210A at an identical pitch. Further, the electrode pads 214 and the metallic films 290A and 290B can be connected by relatively short bonding wires 218. Hence, short-circuiting between the wires 218 and an increase in the impedance of the wires 218 can be prevented.

[Eighteenth Embodiment]

Figure 110:
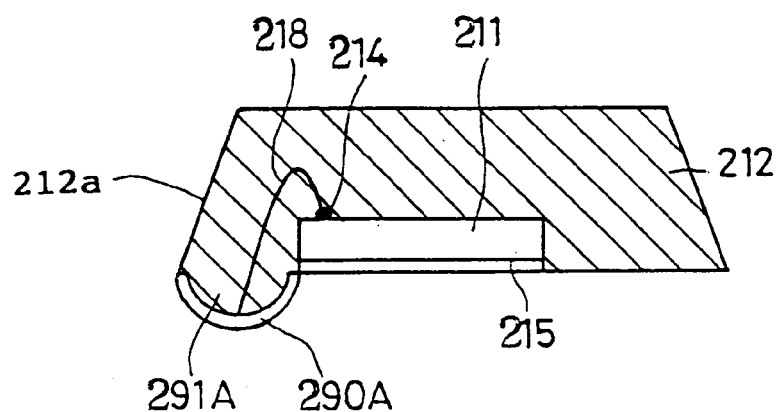
Figure 111:
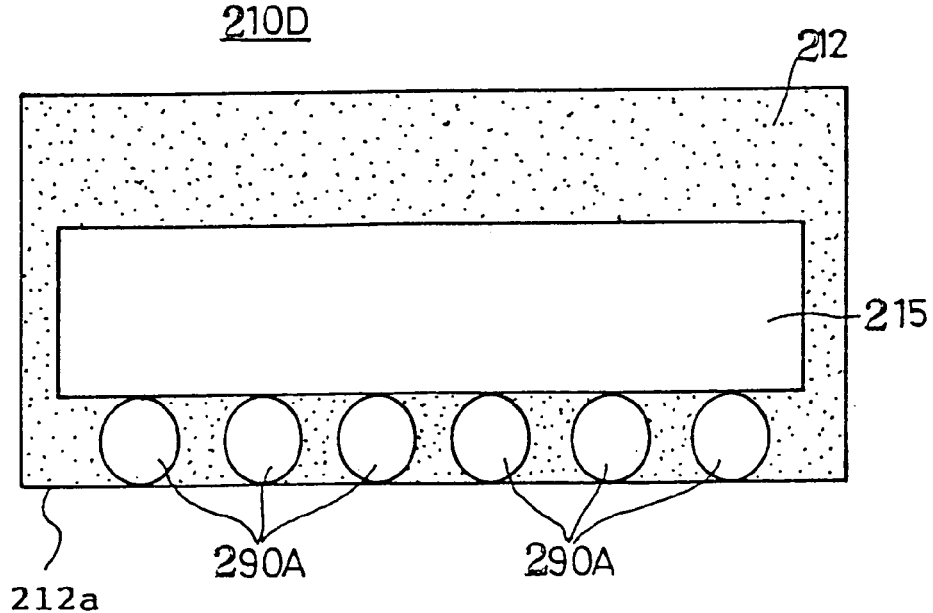

FIG. 110 is a cross-sectional view of a semiconductor device 210D according to an eighteenth embodiment of the present invention, and FIG. 111 is a bottom view of the semiconductor device 210D. In these figures, parts that are the same as those shown in the previously described figures are given the same reference numbers.

The semiconductor device 210D has a feature in which the resin projections 291A are substantially flush with the side surface 212a of the resin package 212. The resin projections 291A are aligned on one side of the resin package 212 and have an identical lateral length. Hence, the metallic films 290A are aligned on one side of the resin package 212.

Even when the resin projections 291A are substantially flush with the side surface 212a, it is possible to visually check, from the side of the resin package 212, the states of soldering between the metallic films 290A and the circuit board.

Figure 112:
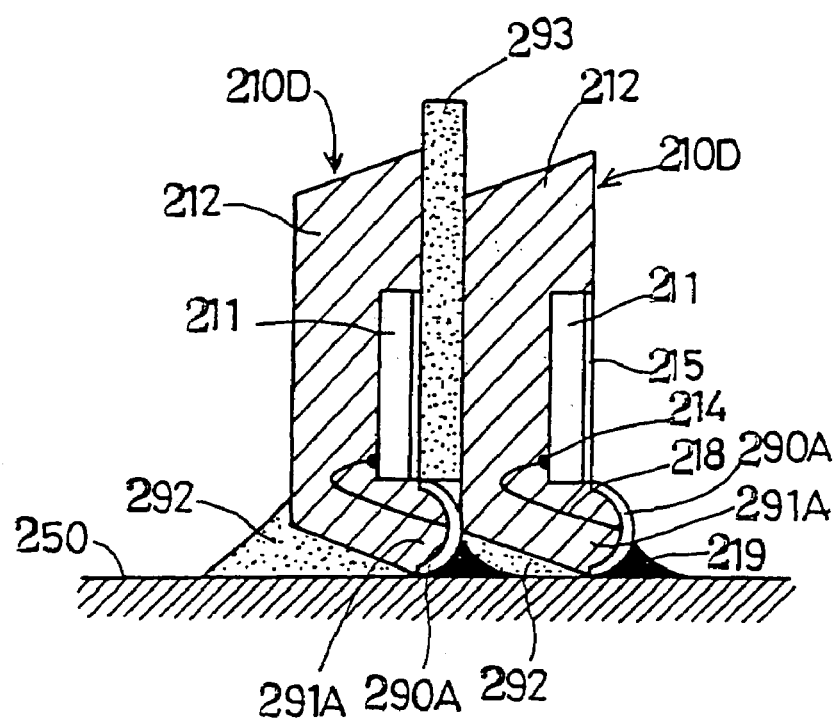

The semiconductor device 210D can be mounted as shown in FIG. 112. A plurality of semiconductor devices 210D are arranged side by side so that the devices 210D stand upright. In this state, the semiconductor devices 210D are soldered to the circuit board 250. Supporting members 292 are respectively provided to the semiconductor devices 210D in order to support the semiconductor devices 210D. The supporting members 292 can be, for example, resin (adhesive), and are different from the supporting member 253 shown in FIGS. 105 and 106. That is, the supporting members 292 are members separated from the resin packages 212, and are not integrally formed therewith. Hence, the positions of the supporting members 292 can be arbitrarily selected at an arbitrary time.

When the semiconductor devices 210D stand upright and are arranged side by side, a space is defined between them. A spacer 293 can be provided between the above space before the semiconductor devices 210D are mounted on and fixed to the circuit board 250. The spacer 293 functions to more certainly make the semiconductor devices 210D stand upright on the circuit board 250 and to improve the reliability of mounting.

Figure 113:
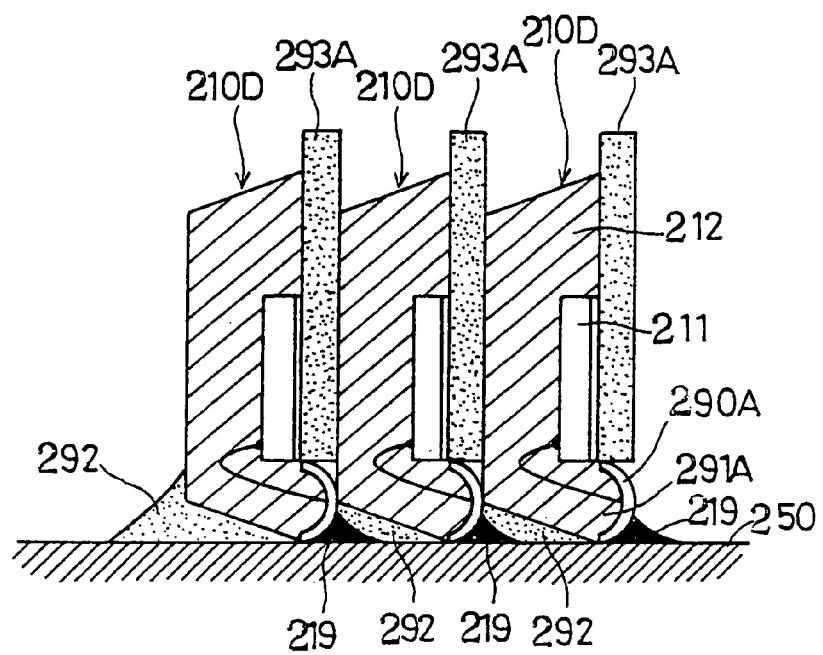

A mounting manner shown in FIG. 113 is characterized in that heat radiating members 293A are used instead of the spacer 293 shown in FIG. 112. The heat radiating members 293A radiate heat generated by the semiconductor devices 210D in addition to the function as spacers. It is preferable that the heat radiating members 293A are made of a material having a good thermal conductivity in order to realize good heat radiating performance. It is possible to efficiently and effectively radiate heat generated by the semiconductor devices 210D which are closely arranged side by side. Hence, the reliability of the operation of the semiconductor devices 210D can be improved.

Figure 114:
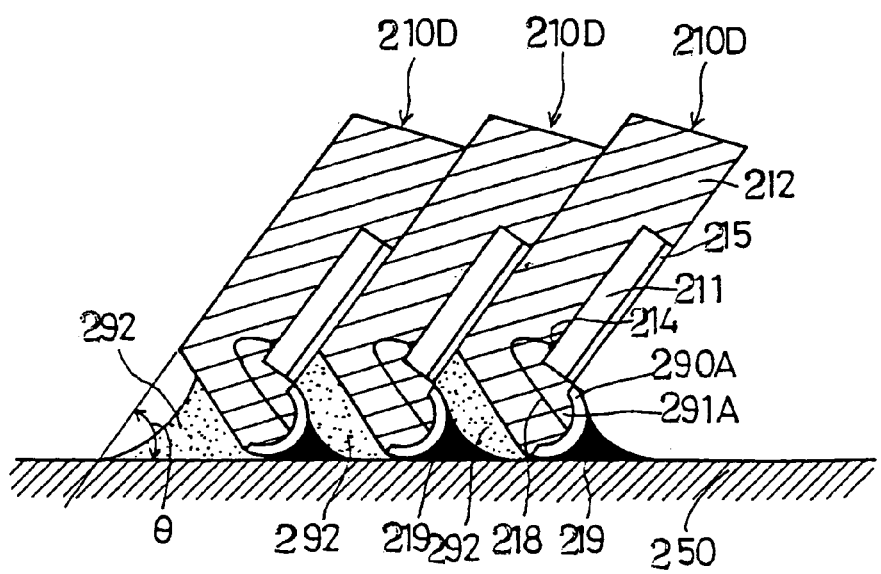

FIG. 114 shows yet another mounting manner. The semiconductor devices 210D contact each other. This is achieved by making the semiconductor devices 210D stand on the circuit board 250 in an inclined state. The semiconductor devices 210D are inclined at an angle θ with respect to the circuit board 250. The semiconductor devices 210D are supported by the supporting members 292. The mounting manner shown in FIG. 114 needs no spacers and a smaller number of components necessary for mounting the semiconductor devices 210D. However, the heat radiation performance of the mounting method shown in FIG. 114 may not be as good as that of the mounting method shown in FIG. 113.

Figure 115:
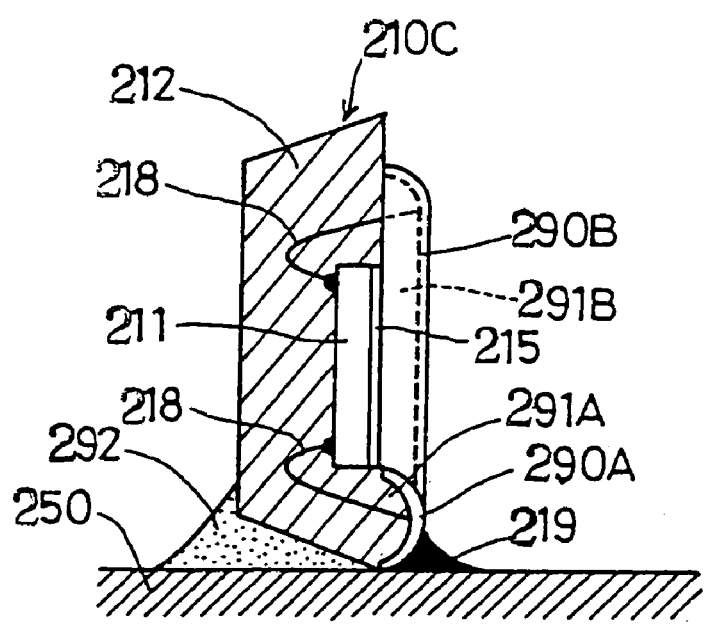

A plurality of semiconductor devices 210C can be arranged side by side so that they stand upright on the circuit board 250, as shown in FIG. 115. In this case, the second resin projections 291B function spacers and heat radiating members. Hence, there is no need to use any spacers and heat radiating members.

[Nineteenth Embodiment]

Figure 116:
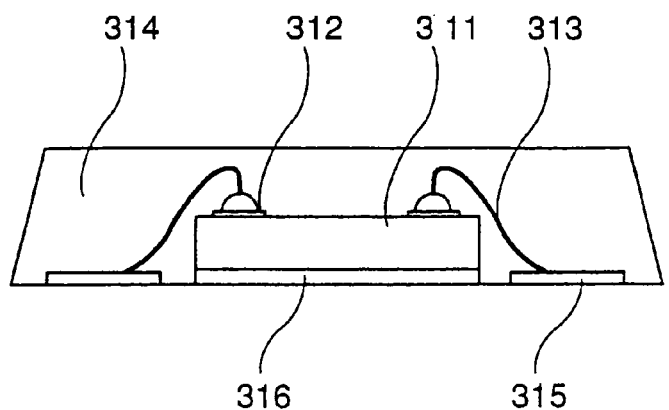
Figure 117:
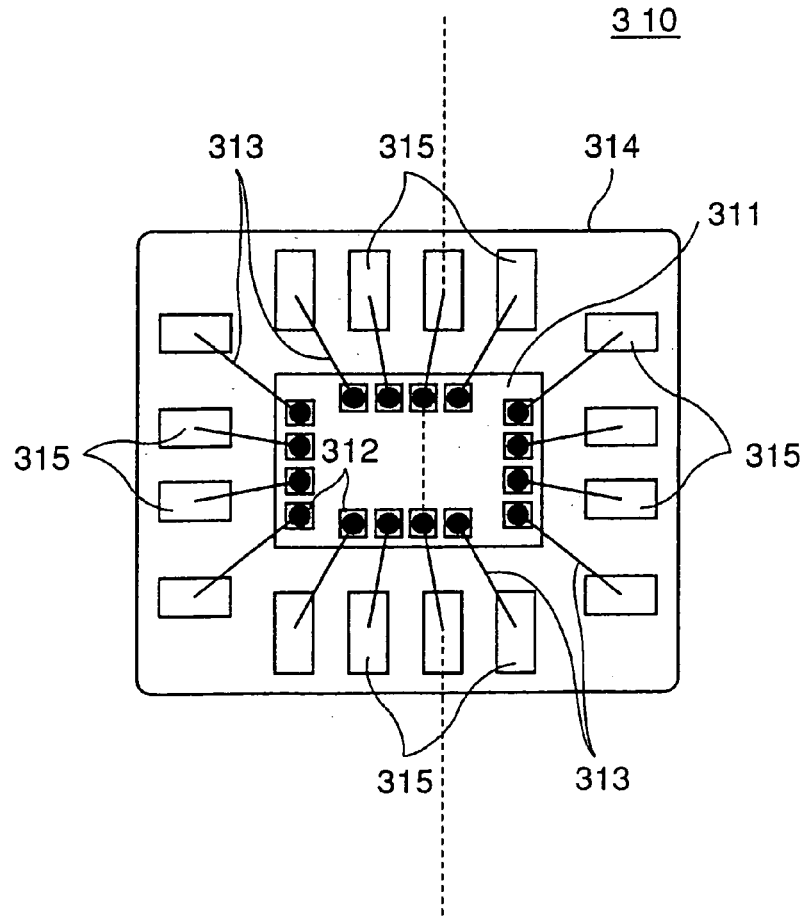

A description will now be given, with reference to FIGS. 116 and 117, of a semiconductor device according to a nineteenth embodiment of the present invention. FIG. 116 is a cross-sectional view of such a semiconductor device taken along a broken line shown in FIG. 117, which is a top view thereof in which the inner parts are seen through a resin package.

A semiconductor device 310 shown in FIG. 116 includes a chip 311, electrode pads 312, bonding wires 313, a resin package 314, and metallic films 315. The chip 311 may be a semiconductor chip, a SAW chip, a multichip module or the like. Ends of the bonding wires 313 are bonded to the electrode pads 312 on the chip 311, and the other ends thereof are bonded to the metallic films 315, which are exposed from the bottom surface of the resin package 314 formed by resin molding. The metallic films 315 substantially flush with the bottom surface of the resin package 315. Each of the metallic films 315 is, for example, 0.4 mm wide, 0.75 mm long, and 10 μm high, and are arranged at a pitch equal to, for example, 0.65 mm.

The above structure does not require the inner leads and outer leads necessary for the SSOP, so that there is no need to provide a leading area in which the inner leads are arranged as well as an area occupied by the outer leads. Further, the structure shown in FIG. 3 does not require a mount base necessary for providing solder balls in the BGA type. Hence, the semiconductor device according to the first embodiment of the present invention requires a smaller mounting area and is less expensive.

The metallic films 315 are electrically connected to the chip 311 through the bonding wires 313. The metallic films 315 function as external connection terminals of the semiconductor device 310. When the semiconductor device 310 is mounted on a circuit board (not shown), the metallic films 315 are soldered to electrode portions provided on the circuit board.

The metallic films 315 can have a single-layer structure or a multilayer structure, as in the case of the aforementioned metallic films 113 and 213. It is required that the metallic films 315 satisfy the aforementioned film requirement.

Figure 118:
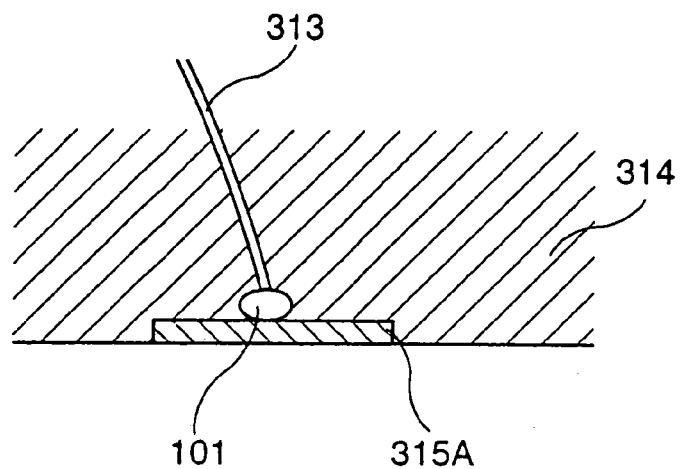

FIG. 118 is an enlarged cross-sectional view of a metallic film 315A having a single-layer structure. The metallic film 315A can be made of, for example, silver (Ag) or palladium (Pd).

Figure 119:
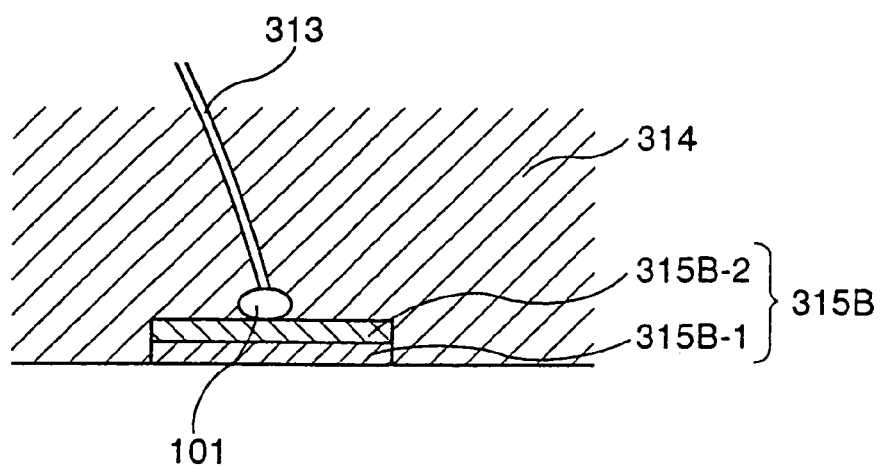

FIG. 119 is an enlarged cross-sectional view of a metallic film 315B having a two-layer structure consisting of an outer layer 315B-1 and an inner layer 315B-2. For example, the outer layer 315B-1 is a palladium layer having a thickness of 0.05–2 μm, and the inner layer 315B-2 is a gold layer having a thickness of 10 Å–0.5 μm. The outer layer 315B-1 may be gold, and the inner layer 315B-2 may be palladium.

FIG. 120 is an enlarged cross-sectional view of a metallic film 315C having a three-layer structure consisting of an outer layer 315C-1, an intermediate layer 315C-2, and an inner layer 315C-3. By way of example, these layers can be configured as follows. The outer layer 315C-1 is a gold layer having a thickness of 10 Å–0.5 μm, and the intermediate layer 315C-2 is a nickel layer having a thickness of 0.5–20 μm. The inner layer 315C-3 is a gold layer having a thickness of 0.1–0.5 μm.

The following other combinations can be employed.

| 315C-1 | 315C-2 | 315C-3 |
|--------|--------|--------|
| Au | Ni | Au |
| Pd | Ni | Pd |
| Au | Pd | Au |
| solder | Ni | Au |
| solder | Ni | Pd |

FIG. 121 is an enlarged cross-sectional view of a metallic film 315D having a four-layer structure consisting of an outer layer 315D-1, a first intermediate layer 315D-2, a second intermediate layer 315D-2, and an inner layer 315D-4. For example, the four-layer structure is as follows. The outer layer 315D-1 is a solder layer having a thickness of 5–20 μm, and the first intermediate layer 315D-2 is a nickel layer having a thickness of 1–20 μm. The second intermediate layer 315D-3 is a palladium layer having a thickness of 0.05–2 μm, and the inner layer 315D-4 is a gold layer having a thickness of 10 Å–0.5 μm.

By way of another example, the outer layer 315D-1 is a palladium layer having a thickness of 0.05–2 μm, and the first intermediate layer 315D-2 is a nickel layer having a thickness of 1–20 μm. The second intermediate layer 315D-3 is a palladium layer having a thickness of 10 Å–0.5 μm, and the inner layer 315D-4 is a gold layer having a thickness of 10 Å–0.5 μm.

The following other combinations can be employed.

| 315D-1 | 315D-2 | 315D-3 | 315D-4 |
|--------|--------|--------|--------|
| Au | Pd | Ni | Pd |
| Pd | Ni | Au | Pd |
| solder | Ni | Au | Pd |

Alternatively, it is possible to form the metallic films 315 having a five-layer structure respectively made of substances described with reference to FIG. 86 or having a six-layer structure respectively made of substances described with reference to FIG. 87.

It is possible to employ the aforementioned bonding balls 101 to which the ends of the bonding wires 313 are bonded.

The above-mentioned semiconductor device 310 can be formed by using a lead frame 320 as shown in FIG. 125. In order to simultaneously produce a plurality of semiconductor devices 310, the lead frame 320 is configured as shown in aforementioned FIG. 42A, or a lead frame unit as shown in FIG. 43 having a plurality of lead frames as shown in FIG. 42 is used.

The lead frame 320 can be configured as follows. As shown in FIG. 122, a resist coating step is carried out so that etching resist films 324 are provided to two opposite surfaces of a metallic member 321 having tool engagement holes 323 (which correspond to the holes 123 shown in FIG. 42A).

Next, exposing and developing steps are carried out in order to obtain a structure having resist patterns 324a shown in FIG. 123. In the exposing step, a mask having windows corresponding to the positions of the metallic films 315 is provided on one of the etching resist films 324. In the developing step, the exposed portions of the etching resist film 324 are removed. The portions of the etching resist film 324 corresponding to the power supply portions 125 shown in FIG. 42A are also removed by the exposing and developing steps.

Thereafter, a metallic film forming step is carried out so that a structure shown in FIG. 124 is formed The above step is, for example, a plating process in which plating electrodes are provided to the power supply portions 125 shown in FIG. 42A, and the metallic member 321 is placed in a plating chamber. The structure shown in FIG. 124 is the three-layer structure 315C having the outer layer 315C-1, the intermediate-layer 315C-2 and the inner layer 315C-3. In this case, the metallic member 321 is plated with gold to form the inner layer 351C-3. Next, the inner layer 351C-3 is plated with palladium to form the intermediate layer 351C-2. Then, the intermediate layer 351C-2 is plated with gold to form the outer layer 351C-1. The thickness of each of the above three layers can be regulated by controlling the plating time.

In the separating step to be carried out later, it is necessary to separate the metallic films 351C from the lead frame 320 together with the resin package 312. Hence, it is required that the metallic films 351C have a nature which enables the metallic films 351C to be smoothly separated from the metallic member 321. With the above in mind, a material which facilitates the separating process, such as an electrically conductive paste, is provided in the exposed portions of the metallic member 321 before the metallic films 351C are formed therein. Hence, the metallic films 351C are formed on the material.

It should be noted that the metallic films 351C can be formed by thin-film forming-processes other than the plating process, such as an evaporating process and a sputtering process.

Then, the resist patterns 324a (the etching resist films 324) are removed by a resist removing step, so that the lead frame 320 shown in FIG. 125 can be formed.

The semiconductor device 310 can be produced by using the lead frame shown in FIG. 125.

As shown in FIG. 126, a chip mounting step is carried out in which a chip fixing resin 316 is provided in a given position on the lead frame 320, and the chip 311 is placed on the chip fixing resin 316. The chip fixing resin 316 functions as an insulation member and an adhesive. Hence, the chip 311 is mounted on the lead frame 320 due to the adhesiveness of the chip fixing resin 316.

Next, the lead frame 320 is loaded to the wire bonding apparatus, and the bonding wires 313 are provided as shown in FIG. 127. More particularly, the bonding wires 313 are bonded to the electrode pads 312 and the metallic films 315. The previously given description of the order of bonding the wires (the first and second bondings) holds true for bondings of the bonding wires 313. For example, if the ends of the bonding wires 313 are bonded to the metallic films 315C first, and the other ends thereof are bonded to the electrode pads 312 second, the height of the bonded wires 313 shown in FIG. 128 can be lower than that of the bonding wires 313 bonded in the reverse order shown in FIG. 127.

Then, the molding step is carried out in the same manner as that described with reference to FIG. 49. By the molding step, the resin package 314 is provided to each of the chips 311, as shown in FIG. 129. The lead frame 320 observed after the molding step is as shown in aforementioned FIGS. 51A and 51B.

Thereafter, a tape arrangement step is carried out in the same manner as that already described with reference to FIGS. 52A and 52B.

Then, a separating (etching) step which corresponds to the separating step shown in aforementioned FIG. 53 is carried out, as shown in FIG. 130 in which a reference number 333 indicates a tape member which corresponds to the tape member 133 shown in aforementioned FIG. 53.

The semiconductor devices 310 observed after the lead frame 320 are supported by the tape member 333, as shown in aforementioned FIGS. 54A and 54B.

An alternative separating step shown in FIG. 131 can be carried out in the same manner as shown in aforementioned FIG. 59.

In the above-mentioned production process, the semiconductor devices 310 can be produced.

[Twentieth Embodiment]

FIGS. 132A and, 132B show a semiconductor device 310B according to a twentieth embodiment of the present invention. In these figures, parts that are the same as those of the semiconductor device 310 are given the same reference numbers. The semiconductor device 310B differs from the semiconductor device 310 as follows. The metallic films 315 are formed on resin projections 318 which are portions of the resin package 314. An insulating film 317 is provided on the bottom surface of the resin package 314. Further, the metallic films 315 have lead portions 3151 extending toward the chip 311. The resin projections 318 can absorb a curvature of the resin package 314 when the semiconductor device 310B is mounted on a circuit board and can prevent occurrence of a solder bridge over adjacent metallic films. The leading portions 3151 extending toward the chip 311 enable a greater pitch at which the metallic films 315 are arranged.

This advantage is effective particularly to an area bump type in which the resin projections 318 are arranged on the entire bottom surface of the package 314. In this case, the area bumps can be arranged at a reduced pitch without bonding wires to recess portions arranged at a small pitch. The insulating film 317 defines an area to be soldered when the semiconductor device 310B is mounted on a circuit board. Further, the insulating film 317 prevents a degradation of the semiconductor device 310B due to oxidation of the leading portions 3151. Furthermore, the insulating film 317 prevents occurrence of the solder bridge.

The semiconductor device 310B can be produced by almost the same process as that of producing the semiconductor device 310. The resin projections 318 can be defined by half-etching the metallic member 321 to which the resist patterns 324a are provided (FIG. 123). By the half-etching, recess portions like the recess portions 122 shown in FIG. 41 can be formed. The metallic films 315 can be provided to the above recess portions as shown in FIG. 44, so that the metallic films 315 can be formed on the resin projections 318. The wire bonding can be carried out, as shown in FIG. 47. The insulating film 317 can be formed by remaining the patterned resist film used to define the leading portions 3151.

[Twenty-first Embodiment]

FIG. 133 shows a semiconductor device 310C according to a twenty-first embodiment of the present invention. In FIG. 133, parts that are the same as those of the semiconductor device 310B shown in FIGS. 132A and 132B are given the same reference numbers. A heat radiating member 340 is provided to the semiconductor device 310B. The heat radiating member 340 is made of a member having a good thermal conductivity. It is preferable that the insulating film 317 shown in FIG. 132A be omitted because the insulating film 317 may prevent heat radiating.

The heat radiating member 340 is adhered to the given portion of the lead frame, and then the chip 311 is fixed to the heat radiating member 340. The use of the heat radiating member 340 makes it possible to mount a chip which consumes a large amount of power.

[Twenty-second Embodiment]

FIG. 134 shows a semiconductor device 310D according to a twenty-second embodiment of the present invention. In FIG. 134, parts that are the same as those of the semiconductor devices 310B and 310C are given the same reference numbers. The semiconductor device 310D employs bumps or bonding balls 341, which are replaced by the leading portions 3151 of the metallic films 315. The bumps 341 are provided in the projections and are connected to the metallic films 315. The structure shown in FIG. 134 will be effective to a case where the resin projections 318 are not arranged at a narrow pitch. The bumps 341 can more certainly connect the bonding wires 313 to the metallic films 315. The heat radiating member 340 can be used in the semiconductor device 310D in the same manner as shown in FIG. 133.

[Twenty-third Embodiment]

FIG. 135 shows a semiconductor device 310E according to a twenty-third embodiment of the present invention. In FIG. 135, parts that are the same as those shown in the previously described figures are given the same reference numbers. The semiconductor device 310E does not use bonding wires which connect the electrode pads 312 and the metallic films 315. Instead of such bonding wires, bumps 342 are used to electrically connect the electrode pads 312 and the metallic films 315. The use of the bumps 342 makes it possible to reduce the height of the semiconductor device 310E and to provide a thinner package. The bumps 342 can be provided by flip-chip bonding, which is faster than wire bonding. Hence, it is possible to reduce the time necessary to connect the electrode pads 312 and the metallic films 315 together.

The semiconductor device 310E can be produced in almost the same manner as that of producing the semiconductor device 310 except for the following. When the chip 311 is mounted on the lead frame 320, the flip-chip bonding is carried out so that the electrode pads 312 are connected to the metallic films 315 via the bumps 342, which can be preformed to either the electrode pads 312 or the metallic films 315.

As shown in FIG. 136A showing a semiconductor device 310F, the bonding wires 313 of the semiconductor device 310B shown in FIG. 132 can be replaced by bumps 342. The flip-chip bonding is carried out for the leading portions 3151 of the metallic films 315. It is possible to increase the pitch at which the metallic films 315 provided on the resin projections 318 are arranged.

FIG. 136B shows a semiconductor device 310G, which is a variation of the structure shown in FIG. 136A. Referring to FIG. 136B, recess portions 343 are formed in the leading portions 3151 of the metallic films 315, and the bumps 342 are provided so as to engage the recess portions 343 by the flip-chip bonding. The use of the recess portions 343 facilitates the positioning of the bumps 342.

In the structures shown in FIGS. 136A and 136B, the insulating films 317 can be omitted.

FIG. 137 shows a semiconductor device 310H, in which the bumps 342 are provided in the resin projections 318. The height of the resin projections 318 is less than that of the bumps 342 in order to directly connect the electrode pads 312 to the bumps 342. The bumps 342 are engaged with the recess portions formed in the lead frame, so that the positioning of the bumps 342 can be facilitated.

FIG. 138 shows a semiconductor device 310I in which the back surface of the chip 311 is exposed from the resin package 314. It is easily possible to radiate heat generated in the chip 311 to the outside of the semiconductor device 310I. The structure shown in FIG. 138 can be applied to the semiconductor devices shown in FIGS. 135, 136A and 136B.

FIG. 139A shows a semiconductor device 310J, in which a heat radiating member 345 is attached to the back surface of the chip 311 by means of an adhesive 344. The heat radiating performance can be facilitated by the heat radiating member 345.

FIG. 139B shows a semiconductor device 310K having the heat radiating member 345, which has a plurality of fins 346. The heat radiating performance can further be facilitated.

FIG. 140 shows a semiconductor device 310L, which has an insulating member 347 which is flush with the bottom surface of the resin package 314. The insulating member 347 can be formed of a tape, an adhesive or the like. The insulating member 347 is provided taking into account a possibility that it may be difficult for the mold resin to enter the gap between the chip 311 and the lead frame 320 in the resin molding step because the above gap is very small. In this case, the sealing may be defective. The insulating member 347 provided beforehand to the element forming surface of the chip 311 prevents occurrence of defective sealing even if the gap is completely full of the mold resin. The insulating member 347 can be provided to either the chip 311 or the lead frame 320 before the flip-chip bonding is carried out.

Figure 141C:
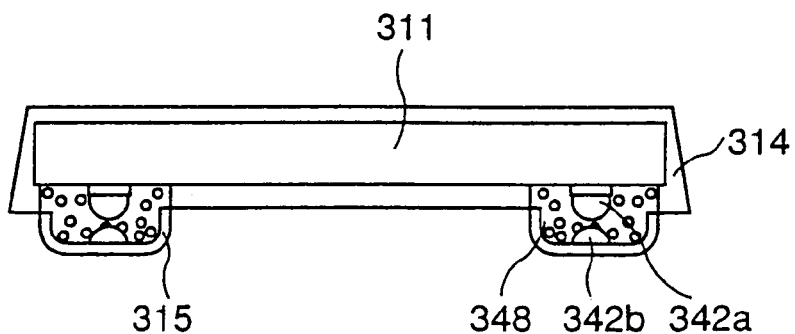

FIG. 141A shows a semiconductor device 310M in which the bumps 342 and the metallic films 315 are electrically and mechanically joined together by anisotropically electrically conductive resins 348. The bumps 342 are provided to the electrode pads on the chip 311. As shown in FIG. 141C, the bumps 342 can be provided on the metallic films 315. Alternatively, it is possible to provide bumps 342a on the electrode pads, and bumps 342b on the metallic films 315. The resin 348 is provided to cover the bumps 342, 342a and 342b.

When a pressure is applied to the resins 342, fine conductors (conductive particles) contained in the resins 348 are made to be jointed together between the bumps 342 and the metallic films 315, so that the electrical connections can be made.

As shown in FIG. 141B, the bumps 342 are provided on the sides of the metallic frames 315 of the lead frame 320. As shown in FIG. 141C, bumps 342*a* are provided to the electrode pads on the chip 311, and bumps 342*b* are provided on the metallic films 315.

The use of the anisotropically electrically conductive resins 342 prevents a short-circuit between adjacent bumps, which may occur when the semiconductor device is mounted on a circuit board.

The present invention is not limited to the specifically disclosed embodiments, and variations and modifications may be made without departing from the scope of the present invention.

What is claimed is:

1. A method of producing devices respectively having chips sealed by resin packages, said method comprising:
    (a) forming a lead frame having a base having recess portions respectively having metallic films;
    (b) mounting chips on the lead frame;
    (c) providing connecting parts which electrically connect electrode pads of said chips and the metallic films at said recess portions;
    (d) molding resin so that molded resin packages respectively cover the chips and metallic films supported by the lead frame; and
    (e) separating from the lead frame the molded resin packages together with the metallic films provided to resin projections which are counterparts of said recess portions.

2. The method as claimed in claim 1, wherein said step (e) comprises a step of etching the lead frame and thereby dissolving the lead frame.

3. The method as claimed in claim 1, wherein said step (e) comprises a step of mechanically separating the lead frame from the molded resin packages and the metallic films.

4. The method as claimed in claim 1, further comprising a step of providing a tape member to the molded resin packages before said step (e) is executed.

5. The method as claimed in claim 1, wherein said step (c) comprises a first step of providing bonding balls to the metallic films, and a second step of bonding wires to electrode pads of the chip and said bonding balls, said bonding balls and said bonding wires corresponding to said connecting parts.

6. The method as claimed in claim 1, wherein said step (d) molds the resin so that the molded resin packages are joined together.

7. The method as claimed in claim 1, wherein said step (d) molds the resin so that the molded resin packages are separated from each other.

* * * * *